(12) United States Patent
Yamazaki et al.

(10) Patent No.: US 11,522,142 B2
(45) Date of Patent: Dec. 6, 2022

(54) LIGHT-EMITTING ELEMENT MATERIAL, LIGHT-EMITTING ELEMENT, LIGHT-EMITTING DEVICE, ELECTRONIC DEVICE, LIGHTING DEVICE, AND ORGANOMETALLIC COMPLEX

(71) Applicant: SEMICONDUCTOR ENERGY LABORATORY CO., LTD., Atsugi (JP)

(72) Inventors: Shunpei Yamazaki, Tokyo (JP); Satoshi Seo, Kanagawa (JP); Hideko Yoshizumi, Kanagawa (JP); Tomoya Yamaguchi, Kanagawa (JP); Hiromitsu Kido, Kanagawa (JP); Takeyoshi Watabe, Kanagawa (JP); Airi Tomida, Kanagawa (JP); Keito Fukuda, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 231 days.

(21) Appl. No.: 16/488,280

(22) PCT Filed: Feb. 22, 2018

(86) PCT No.: PCT/IB2018/051083
§ 371 (c)(1),
(2) Date: Aug. 23, 2019

(87) PCT Pub. No.: WO2018/154467
PCT Pub. Date: Aug. 30, 2018

(65) Prior Publication Data
US 2020/0013968 A1    Jan. 9, 2020

(30) Foreign Application Priority Data

Feb. 24, 2017 (JP) .............................. JP2017-033767

(51) Int. Cl.
*H01L 51/00* (2006.01)
*C07F 15/00* (2006.01)
(Continued)

(52) U.S. Cl.
CPC ...... *H01L 51/0085* (2013.01); *C07F 15/0033* (2013.01); *C09K 11/06* (2013.01);
(Continued)

(58) Field of Classification Search
CPC .................................................. C07F 15/0033
See application file for complete search history.

(56) References Cited

U.S. PATENT DOCUMENTS 8,232,549 B2    7/2012   Chung et al.
9,356,250 B2    5/2016   Ohsawa et al.
(Continued)

FOREIGN PATENT DOCUMENTS

CN    102217419 A    10/2011
CN    102498120 A    6/2012
(Continued)

OTHER PUBLICATIONS

International Search Report (Application No. PCT/IB2018/051083) dated May 29, 2018.
(Continued)

*Primary Examiner* — Peter F Godenschwager
(74) *Attorney, Agent, or Firm* — Fish & Richardson P.C.

(57) ABSTRACT

A novel light-emitting element material is provided. Alternatively, a light-emitting element material capable of simplifying a process for manufacturing a light-emitting element is provided. Alternatively, a light-emitting element material capable of reducing the cost for manufacturing a light-emitting element is provided. Alternatively, one embodiment of the present invention provides a light-emitting element material capable of achieving a light-emitting (Continued)

element having favorable emission efficiency. A light-emitting element material including an organic compound which includes a first skeleton having a carrier-transport property and a second skeleton having a light-emitting property in one molecule and in which the molecular weight is less than or equal to 3000, is provided.

32 Claims, 49 Drawing Sheets

(51) Int. Cl.
*C09K 11/06* (2006.01)
*H01L 51/50* (2006.01)
*G08G 1/0968* (2006.01)

(52) U.S. Cl.
CPC . *G08G 1/096805* (2013.01); *G08G 1/096811* (2013.01); *G08G 1/096822* (2013.01); *H01L 51/5012* (2013.01); *H01L 51/5016* (2013.01); *C09K 2211/1029* (2013.01); *C09K 2211/1044* (2013.01); *C09K 2211/1059* (2013.01); *C09K 2211/1074* (2013.01); *C09K 2211/185* (2013.01); *H01L 2251/552* (2013.01)

(56) References Cited

U.S. PATENT DOCUMENTS

| | | | |
|---|---|---|---|
| 9,882,138 | B2 | 1/2018 | Osaka et al. |
| 10,205,106 | B2 | 2/2019 | Stoessel et al. |
| 2012/0175561 | A1 | 7/2012 | Franz et al. |
| 2012/0261651 | A1 | 10/2012 | Noto et al. |
| 2013/0088144 | A1 | 4/2013 | Inoue et al. |
| 2014/0209873 | A1 | 7/2014 | Kim et al. |
| 2015/0171348 | A1 | 6/2015 | Stoessel et al. |
| 2017/0141329 | A1 | 5/2017 | Koenen et al. |
| 2018/0053901 | A1 | 2/2018 | Yoshida et al. |

FOREIGN PATENT DOCUMENTS

| | | | |
|---|---|---|---|
| CN | 103378301 | A | 10/2013 |
| CN | 104520308 | A | 4/2015 |
| CN | 107431136 | A | 12/2017 |
| EP | 2477999 | A | 7/2012 |
| EP | 2882763 | A | 6/2015 |
| EP | 3160976 | A | 5/2017 |
| EP | 3276697 | A | 1/2018 |
| JP | 2003-231692 | A | 8/2003 |
| JP | 2011-506312 | | 3/2011 |
| JP | 2013-504608 | | 2/2013 |
| JP | 2013-093570 | A | 5/2013 |
| JP | 5325402 | | 10/2013 |
| JP | 2015-530982 | | 10/2015 |
| JP | 2017-522291 | | 8/2017 |
| KR | 2012-0081155 | A | 7/2012 |
| KR | 2013-0037646 | A | 4/2013 |
| KR | 2014-0097937 | A | 8/2014 |
| KR | 2015-0039846 | A | 4/2015 |
| KR | 2017-0131398 | A | 11/2017 |
| WO | WO-2009/072821 | | 6/2009 |
| WO | WO-2010/026859 | | 3/2010 |
| WO | WO-2011/021385 | | 2/2011 |
| WO | WO-2011/032686 | | 3/2011 |
| WO | WO-2016/000803 | | 1/2016 |
| WO | WO-2016/158540 | | 10/2016 |

OTHER PUBLICATIONS

Written Opinion (Application No. PCT/IB2018/051083) dated May 29, 2018.
Chinese Office Action (Application No. 201880013498.1) dated Oct. 21, 2021.

FIG. 1A
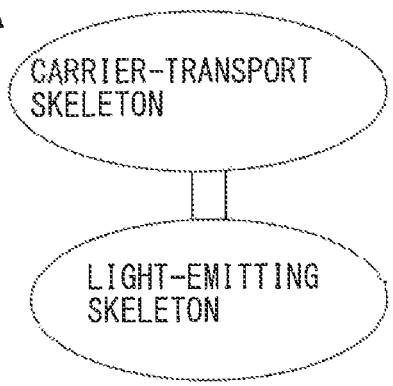
FIG. 1B
FIG. 1C
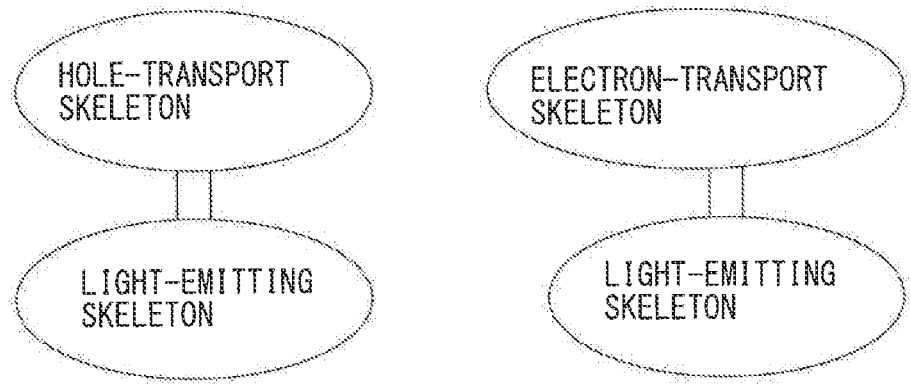
FIG. 1D
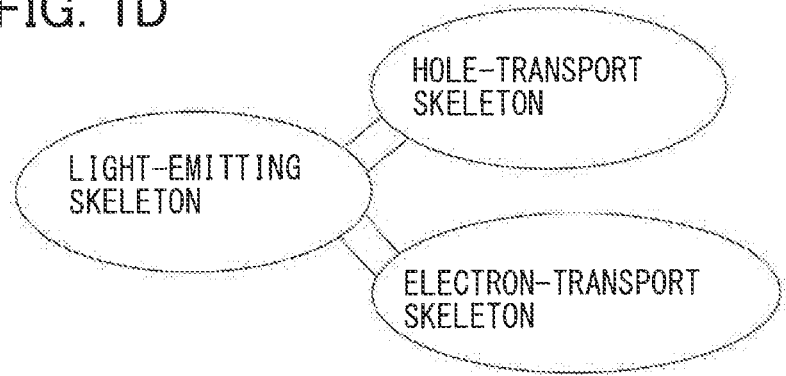

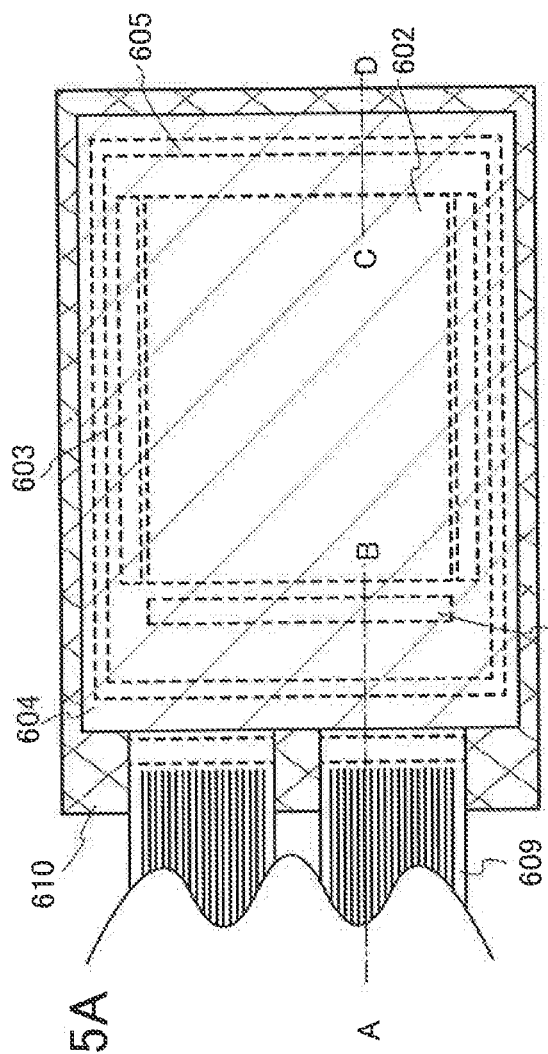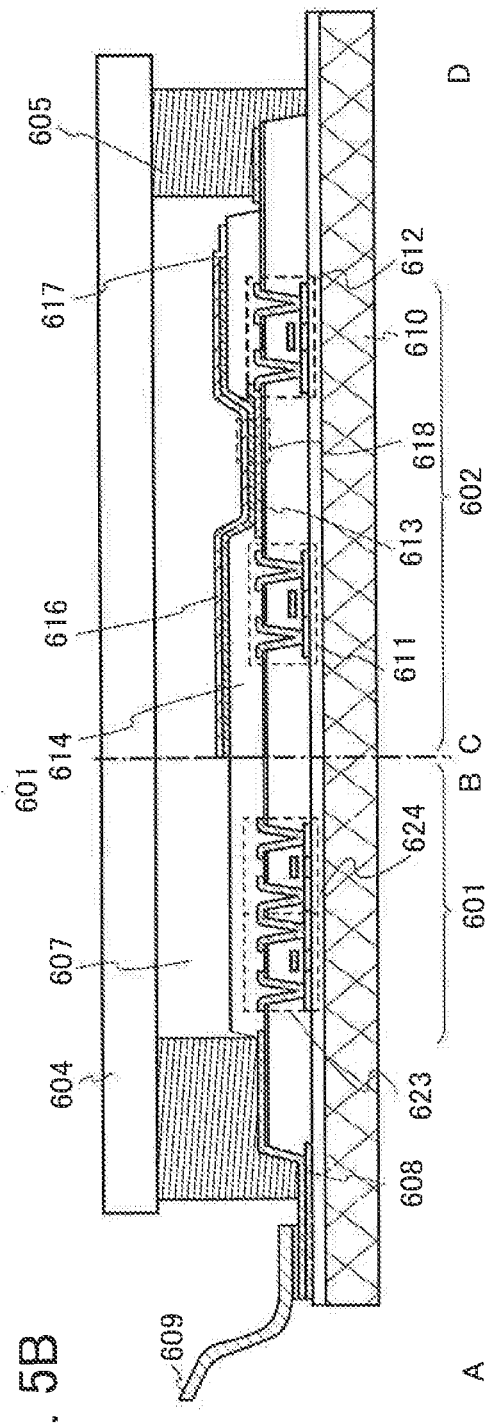

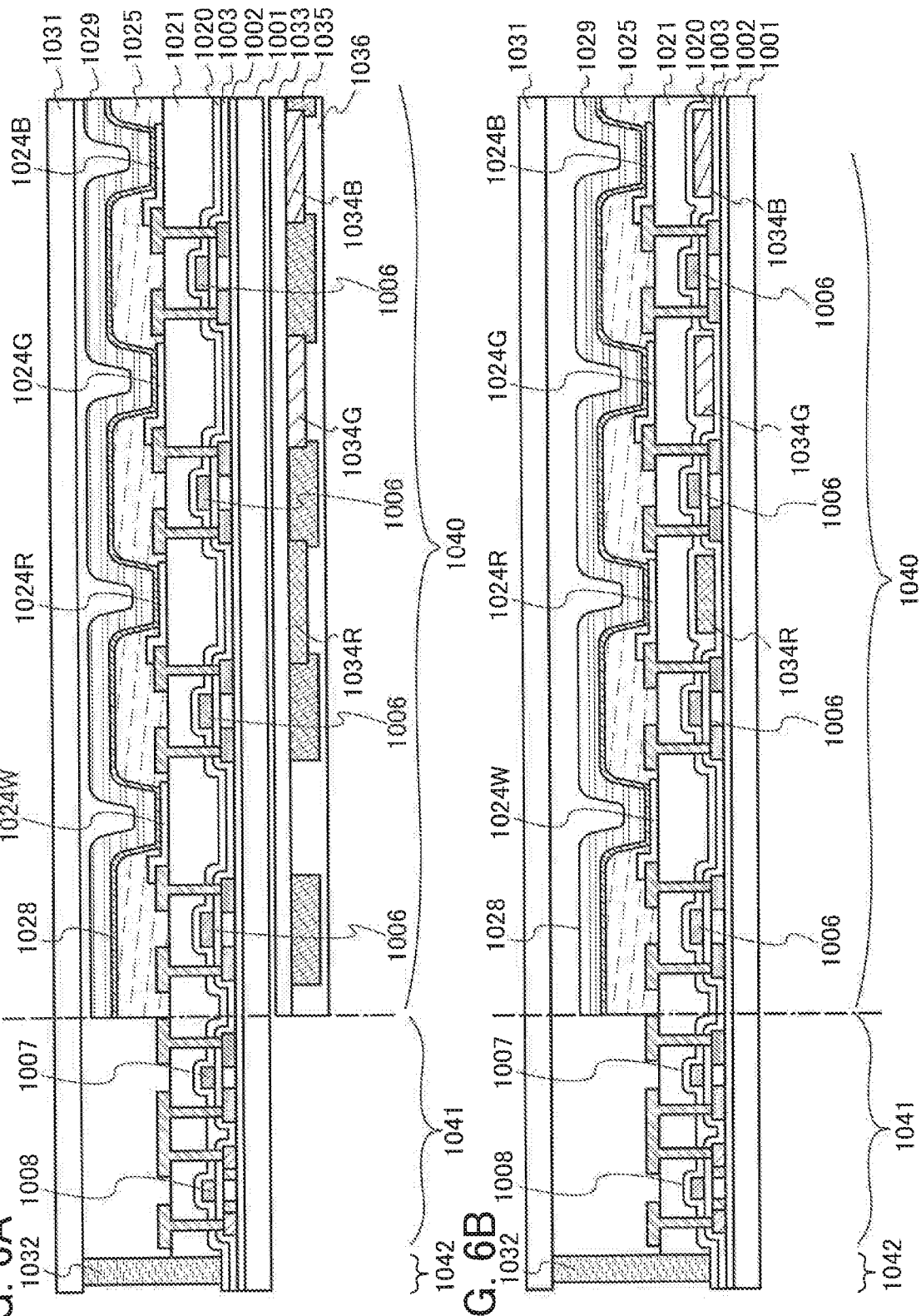

FIG. 10A
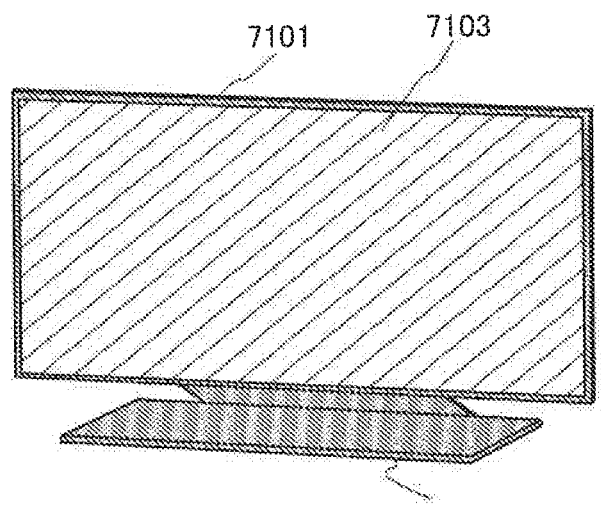
FIG. 10B1
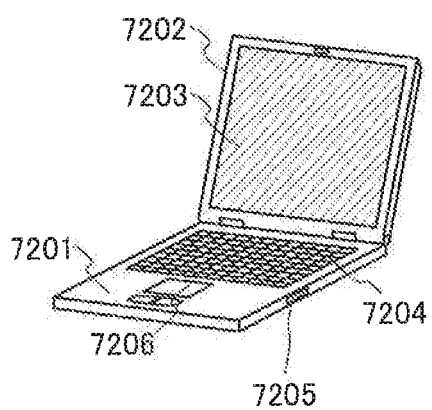
FIG. 10B2
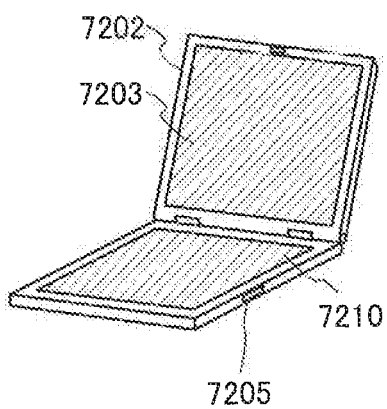
FIG. 10C
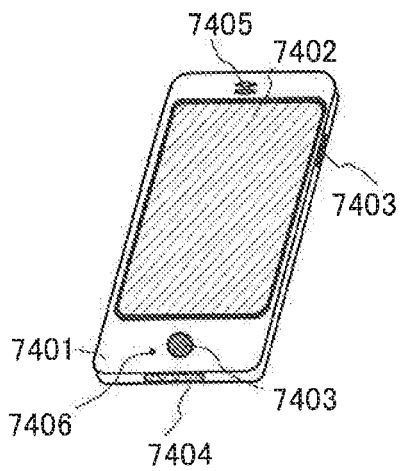
FIG. 10D
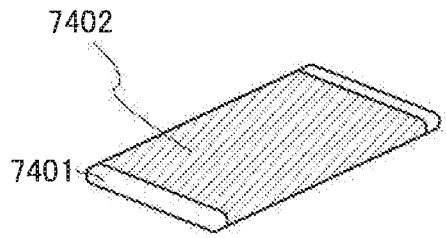

LIGHT-EMITTING ELEMENT MATERIAL, LIGHT-EMITTING ELEMENT, LIGHT-EMITTING DEVICE, ELECTRONIC DEVICE, LIGHTING DEVICE, AND ORGANOMETALLIC COMPLEX

CROSS REFERENCE TO RELATED APPLICATIONS

This application is a U.S. National Phase Application under 35 U.S.C. § 371 of International Application PCT/IB2018/051083, filed on Feb. 22, 2018, which is incorporated by reference and claims the benefit of a foreign priority application filed in Japan as Application No. 2017-033767 on Feb. 24, 2017.

TECHNICAL FIELD

One embodiment of the present invention relates to a light-emitting element, a display module, a lighting module, a display device, a light-emitting device, an electronic device, and a lighting device. Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

BACKGROUND ART

Light-emitting elements (organic EL elements) that include organic compounds and utilize electroluminescence (EL) have been put to more practical use. The basic structure of such a light-emitting element is a structure in which an organic compound layer containing a light-emitting material (an EL layer) is interposed between a pair of electrodes. Carriers are injected by application of voltage to this element, and recombination energy of the carriers is used, whereby light emission can be obtained from the light-emitting material.

Since such light-emitting elements are of self-light-emitting type, light-emitting elements have advantages over liquid crystal displays, such as high visibility and no need for backlight when used as pixels of a display, and are suitable as flat panel display elements. Displays including such light-emitting elements are also highly advantageous in that they can be thin and lightweight. Moreover, such a light-emitting element also has a feature that response speed is extremely fast.

Since light-emitting layers of such light-emitting elements can be successively formed two-dimensionally, planar light emission can be obtained. This feature is difficult to realize with point light sources typified by incandescent lamps and LEDs or linear light sources typified by fluorescent lamps. Thus, light-emitting elements also have great potential as planar light sources, which can be applied to lighting devices and the like.

Displays or lighting devices including light-emitting elements can be suitably used for a variety of electronic devices as described above, and research and development of light-emitting elements has progressed for higher efficiency or longer lifetimes.

A significant development of organic EL elements has been advanced by so-called function separation such that various functions are assigned to different layers or materials. However, although element characteristics have been dramatically improved, the number of stacked layers has increased and control of co-evaporation rates or the like has become necessary, which render the element manufacturing process very complicated. This results in an extension of a manufacturing apparatus, an increase in manufacturing takt time, and thus a significant increase in manufacturing cost.

Patent Document 1 discloses a dendrimer having a carrier-transport skeleton, in which iridium is a central metal.

PRIOR ART DOCUMENT

Patent Document

[Patent Document 1] Japanese Published Patent Application No. 2003-231692

SUMMARY OF THE INVENTION

Problems to be Solved by the Invention

An object of one embodiment of the present invention is to provide a novel light-emitting element material. Alternatively, an object of one embodiment of the present invention is to provide a light-emitting element material capable of simplifying a process for manufacturing a light-emitting element. Alternatively, an object of one embodiment of the present invention is to provide a light-emitting element material capable of reducing the cost for manufacturing a light-emitting element. Alternatively, an object of one embodiment of the present invention is to provide a light-emitting element material capable of achieving a light-emitting element having favorable emission efficiency. Alternatively, an object of one embodiment of the present invention is to provide a light-emitting element material capable of providing a light-emitting element having a favorable lifetime.

Alternatively, an object of one embodiment of the present invention is to provide a light-emitting element that can be simply manufactured. Alternatively, an object of one embodiment of the present invention is to provide a light-emitting element that can be manufactured at low cost. Alternatively, an object of one embodiment of the present invention is to provide a light-emitting element having favorable emission efficiency. Alternatively, an object of one embodiment of the present invention is to provide a light-emitting element having a long lifetime.

Alternatively, an object of another embodiment of the present invention is to provide a light-emitting device, an electronic device, and a display device that are each inexpensive. Alternatively, an object is to provide a light-emitting device, an electronic device, and a display device each having high reliability. Alternatively, an object of another embodiment of the present invention is to provide a light-emitting device, an electronic device, and a display device each having low power consumption. Alternatively, an object of another embodiment of the present invention is to provide a light-emitting device, an electronic device, and a display device each having favorable display quality.

It is only necessary that at least one of the above-described objects be achieved in the present invention.

Means for Solving the Problems

One embodiment of the present invention is a light-emitting element material including an organic compound which includes a first skeleton having a carrier-transport property and a second skeleton having a light-emitting property in one molecule and in which the molecular weight is less than or equal to 3000.

Another embodiment of the present invention is a light-emitting element material in which the first skeleton has a hole-transport property and which has the above structure.

Another embodiment of the present invention is a described light-emitting element material in which the first skeleton has a HOMO and which has the above structure.

Another embodiment of the present invention is a light-emitting element material in which the first skeleton has an electron-transport property and which has the above structure.

Another embodiment of the present invention is a light-emitting element material in which the first skeleton has a LUMO and which has the above structure.

Another embodiment of the present invention is the light-emitting element material in which the first skeleton is directly bonded to the second skeleton in the above structure.

Another embodiment of the present invention is the light-emitting element material in which the first skeleton and the second skeleton are bonded through a metaphenylene group or a biphenyl-3,3'-diyl group in the above structure.

Another embodiment of the present invention is a light-emitting element material including an organic compound which includes a first skeleton having a hole-transport property, a second skeleton having an electron-transport property, and a third skeleton having a light-emitting property in one molecule and in which the molecular weight is less than or equal to 3000.

Another embodiment of the present invention is a light-emitting element material in which the first skeleton has a HOMO and which has the above structure.

Another embodiment of the present invention is a light-emitting element material in which the second skeleton has a LUMO and which has the above structure.

Another embodiment of the present invention is a light-emitting element material in which the first skeleton and/or the second skeleton is directly bonded to the third skeleton in the above structure.

Another embodiment of the present invention is a light-emitting element material in which the first skeleton and/or the second skeleton is bonded to the third skeleton through a metaphenylene group or a biphenyl-3,3'-diyl group in the above structure.

Another embodiment of the present invention is a light-emitting element material in which the organic compound emits fluorescence in the above structure.

Another embodiment of the present invention is a light-emitting element material in which the organic compound emits delayed fluorescence in the above structure.

Another embodiment of the present invention is a light-emitting element material in which the organic compound emits phosphorescence in the above structure.

Another embodiment of the present invention is a light-emitting element material in which the organic compound is an organometallic complex further including a central metal in the above structure.

Another embodiment of the present invention is a light-emitting element material in which the central metal is iridium in the above structure.

Another embodiment of the present invention is a light-emitting element material in which the first skeleton having a carrier-transport property in the organometallic complex is a diphenyltriazine skeleton in the above structure.

Another embodiment of the present invention is a light-emitting element material in which the organometallic complex includes at least two different ligands, one of the ligands includes a skeleton having a light-emitting property, and the other ligand includes a skeleton having a hole-transport property in the above structure.

Another embodiment of the present invention is a light-emitting element material in which the organometallic complex includes at least two different ligands, one of the ligands includes a skeleton having a light-emitting property, and the other ligand includes a skeleton having an electron-transport property in the above structure.

Another embodiment of the present invention is a light-emitting element material in which the organometallic complex includes at least two different ligands, one of the ligands includes a skeleton having a hole-transport property, the other ligand includes a skeleton having an electron-transport property, and at least one of the two different ligands further includes a skeleton having a light-emitting property in the above structure.

Another embodiment of the present invention is a light-emitting element material in which a molecular weight of the organic compound or the organometallic complex is less than or equal to 1300 in the above structure.

Another embodiment of the present invention is a light-emitting element in which a film of the light-emitting element material in the above structure is formed by an evaporation method and used.

Another embodiment of the present invention is a light-emitting element in which a film of the light-emitting element material in any one of the above structures is formed by a wet method and used.

Another embodiment of the present invention is a light-emitting element which includes a light-emitting layer including a first organic compound and the light-emitting element material in the above, in which the organic compound included in the light-emitting element material is an iridium complex, and at least part of a skeleton included in the first organic compound includes a structure that is the same as the first skeleton having a carrier-transport property in the iridium complex.

Another embodiment of the present invention is a light-emitting element in which the light-emitting layer further includes a second organic compound in the above structure.

Another embodiment of the present invention is a light-emitting element in which the first skeleton is an amine skeleton in the above structure.

Another embodiment of the present invention is a light-emitting element in which the first skeleton is a diphenylamine skeleton in the above structure.

Another embodiment of the present invention is an organometallic complex represented by the following structural formula.

[Chemical 1]

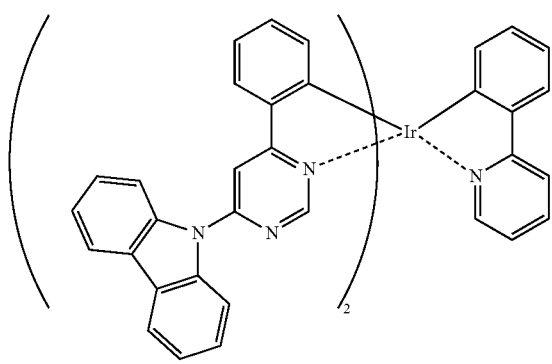

Another embodiment of the present invention is an organometallic complex represented by the following structural formula.

[Chemical 2]

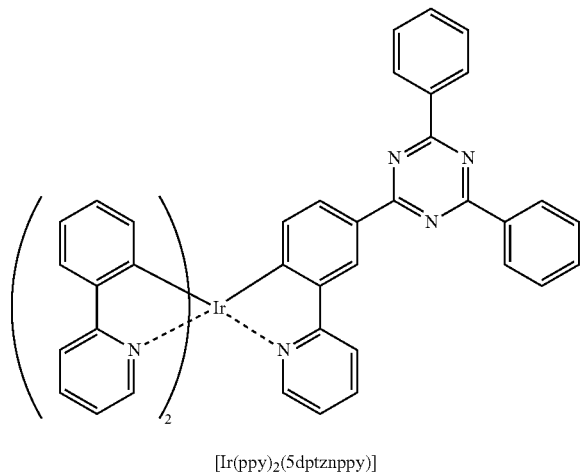

[Ir(ppy)₂(5dptznppy)]

Another embodiment of the present invention is an organometallic complex represented by the following structural formula.

[Chemical 3]

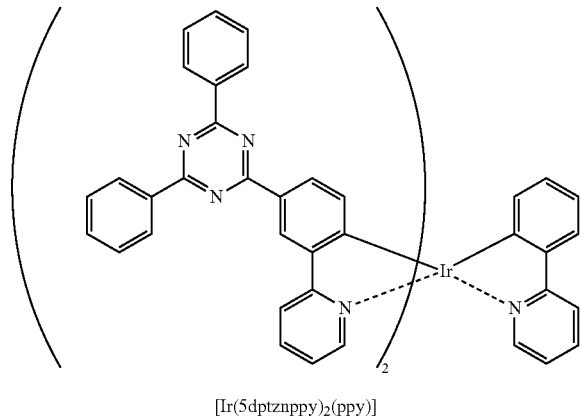

[Ir(5dptznppy)₂(ppy)]

Another embodiment of the present invention is an organometallic complex represented by the following structural formula.

[Chemical 4]

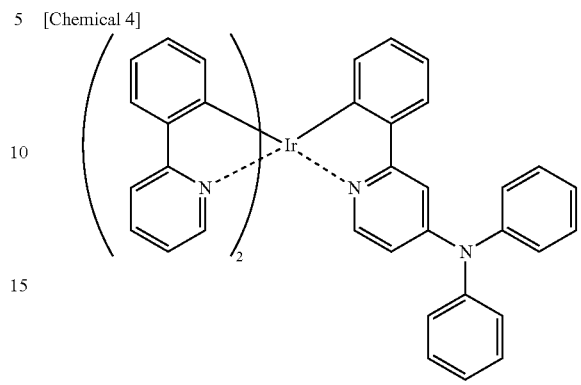

[Ir(ppy)₂(dpappy)]

Another embodiment of the present invention is an organometallic complex represented by the following structural formula.

[Chemical 5]

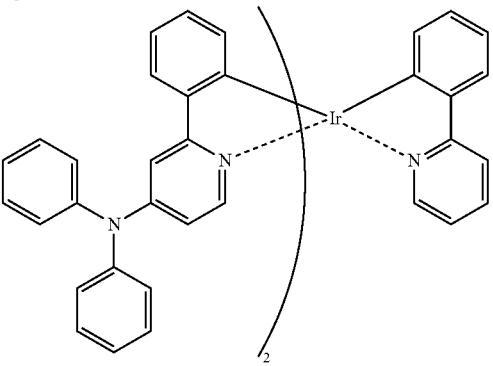

[Ir(dpappy)₂(ppy)]

Another embodiment of the present invention is an organometallic complex represented by the following structural formula.

[Chemical 6]

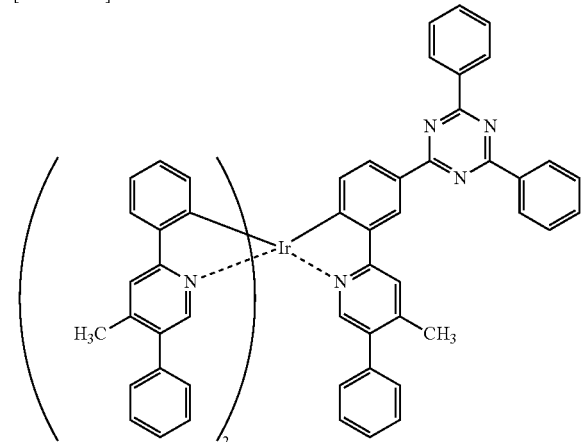

[Ir(mdppy)₂(5dptznmdppy)]

Another embodiment of the present invention is an organometallic complex represented by the following structural formula.

[Chemical 7]

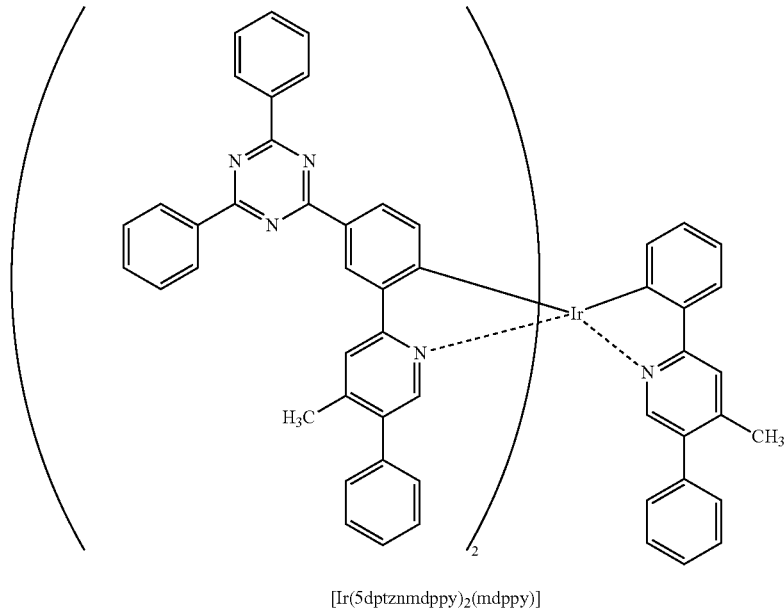

[Ir(5dptznmdppy)$_2$(mdppy)]

Another embodiment of the present invention is a light-emitting device including the light-emitting element including the above structure and a transistor or a substrate.

Another embodiment of the present invention is an electronic device including the above-described light-emitting device, and a sensor, an operation button, a speaker, or a microphone.

Another embodiment of the present invention is a lighting device including the light-emitting device including the above structure and a housing.

Note that the light-emitting device in this specification includes an image display device that uses a light-emitting element. The light-emitting device includes, in some cases, a module in which a connector such as an anisotropic conductive film or a TCP (Tape Carrier Package) is attached to a light-emitting element, a module in which a printed wiring board is provided on the tip of a TCP, or a module in which an IC (integrated circuit) is directly mounted on a light-emitting element by a COG (Chip On Glass) method. The light-emitting device is included in a lighting device or the like in some cases.

Effect of the Invention

According to one embodiment of the present invention, a novel light-emitting element material can be provided. Alternatively, according to one embodiment of the present invention, a light-emitting element material capable of simplifying a process for manufacturing a light-emitting element can be provided. Alternatively, according to one embodiment of the present invention, a light-emitting element material capable of reducing the cost for manufacturing a light-emitting element can be provided. Alternatively, according to one embodiment of the present invention, a light-emitting element material capable of achieving a light-emitting element having favorable emission efficiency can be provided. Alternatively, according to one embodiment of the present invention, a light-emitting element material capable of providing a light-emitting element having a favorable lifetime can be provided.

Alternatively, according to one embodiment of the present invention, a light-emitting element that can be simply manufactured can be provided. Alternatively, according to one embodiment of the present invention, a light-emitting element that can be manufactured at low cost can be provided. Alternatively, according to one embodiment of the present invention, a light-emitting element having favorable emission efficiency can be provided. Alternatively, according to one embodiment of the present invention, a light-emitting element having a long lifetime can be provided.

Alternatively, according to one embodiment of the present invention, a light-emitting device, an electronic device, and a display device that are each inexpensive can be provided. Alternatively, a light-emitting device, an electronic device, and a display device each having high reliability can be provided. Alternatively, according to one embodiment of the present invention, a light-emitting device, an electronic device, and a display device each having low power consumption can be provided. Alternatively, according to one embodiment of the present invention, a light-emitting device, an electronic device, and a display device each having favorable display quality can be provided.

The description of these effects does not preclude the existence of other effects. One embodiment of the present invention does not need to have all the effects. Effects other than the above will be apparent from the description of the specification, the drawings, the claims, and the like and effects other than the above can be derived from the description of the specification, the drawings, the claims, and the like.

BRIEF DESCRIPTION OF THE DRAWINGS

FIGS. 1A-1D Conceptual diagrams of light-emitting element materials of the present invention.

FIGS. 5A-5B Conceptual diagrams of an active matrix light-emitting device.

FIGS. 6A-6B Conceptual diagrams of an active matrix light-emitting device.

FIGS. 10A-10D Views showing electronic devices.

MODE FOR CARRYING OUT THE INVENTION

Figure 2A:
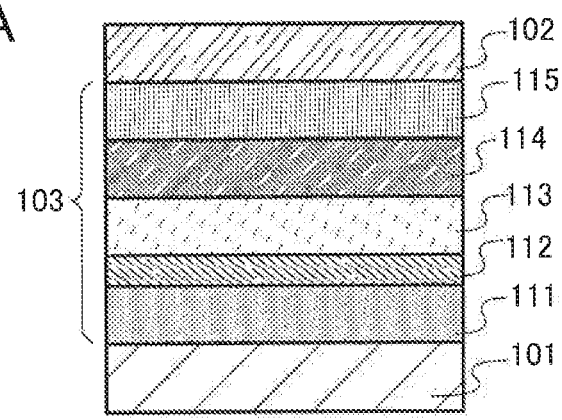
FIGS. 2A-2C Schematic views of light-emitting elements.

Embodiments of the present invention are described in detail below with reference to the drawings. Note that the present invention is not limited to the following description, and it is easily understood by those skilled in the art that modes and details can be modified in various ways without departing from the spirit and scope of the present invention. Accordingly, the present invention should not be interpreted as being limited to the description of the embodiments shown below.

Embodiment 1

For a light-emitting layer of an organic EL element, a method in which a carrier-transport material that is a host material and a light-emitting material that is a guest material are deposited while being mixed by co-evaporation has become the mainstream. For the co-evaporation, a plurality of evaporation sources need to be included in an evaporation chamber. Such a method requires a huge manufacturing apparatus in terms of contamination prevention and a heavy initial investment, which has erected a barrier to entry of novel companies. The complicated and lengthy manufacturing process has led to an increase in manufacturing cost.

In view of this, the present inventors have found that element manufacturing is simplified by the use of a light-emitting element material having the function of the carrier-transport material that is the host material and the function of the light-emitting material that is a guest material, which have separately been evaporated in a conventional method, in one molecule at the same time to achieve a significant cost reduction following simplification of a manufacturing apparatus.

Specifically, as illustrated in FIG. 1(A), a light-emitting material which includes a first skeleton having a carrier-transport property and a second skeleton having a light-emitting property in one molecule at the same time is provided. The light-emitting material has a molecular weight of 3000 or less and is not a polymer. However, when solubility is imparted, film formation by a wet method involving dissolution into a solvent is possible.

In the light-emitting material, a skeleton having a role in carrier transport and a skeleton having a role in light emission are present in one molecule at the same time. Thus, only the light-emitting material can form a light-emitting layer. In other words, a light-emitting layer exhibiting favorable characteristics can be obtained without co-evaporation. Accordingly, a light-emitting element having favorable characteristics can be manufactured with a manufacturing apparatus having a relatively simple structure, which enables an inexpensive, high-performance light-emitting element to be provided.

The first skeleton having a carrier-transport property may be either a skeleton having a hole-transport property as illustrated in FIG. 1(B) or a skeleton having a hole-transport property as illustrated in FIG. 1(C). Although not illustrated, the skeleton may have a bipolar property. As illustrated in FIG. 1(D), both a skeleton having an electron-transport property and a skeleton having a hole-transport property may be included in one molecule.

For a light-emitting element material in which the first skeleton having a carrier-transport property is the skeleton having a hole-transport property, the skeleton having a hole-transport property is preferably a skeleton having a HOMO in the material. For a light-emitting element material in which the first skeleton having a carrier-transport property is the skeleton having an electron-transport property, the skeleton having an electron-transport property is preferably a skeleton having a LUMO in the material. For a light-emitting element material in which the first skeleton having a carrier-transport property is both the skeleton having a hole-transport property and the skeleton having an electron-transport property, preferably, a HOMO is present in the skeleton having a hole-transport property and a LUMO is present in the skeleton having an electron-transport property in the light-emitting element material.

The first skeleton and the second skeleton may be directly bonded to each other or may be bonded through a certain group. The intervening group is preferably a metaphenylene group or a biphenyl-3,3'-diyl group, in which case a reduction in light emission energy level or the like is less likely to occur.

A light-emitting element material including three skeletons, the skeleton having a hole-transport property, the skeleton having an electron-transport property, and the skeleton having a light-emitting property, is a preferred structure because the use of the light-emitting element material enables a light-emitting element with good emission efficiency using an exciplex as an energy donor to be manufactured without co-evaporation. In this case, an excited state may be formed by the action of the skeleton having a hole-transport property and the skeleton having an electron-transport property in one molecule, or an exciplex may be formed by the skeleton having a hole-transport property in one molecule and the skeleton having an electron-transport property in another molecule. The excitation energy is transferred to the skeleton having a light-emitting property in the molecule forming the excited state or the exciplex or to the skeleton having a light-emitting property in another molecule in a ground state. Thus, light emission with good efficiency can be obtained. Since the S1 level and the T1 level of an exciplex are at substantially the same position, unless a certain skeleton having lower triplet energy is included, intersystem crossing to the S1 level from the T1 level can be facilitated and the probability of generation of the S1 level can be increased. This can expect an improvement of the emission efficiency of a fluorescent light-emitting element. Delayed fluorescence observed from a light-emitting element from which light emission is obtained by the above mechanism is characteristic.

It is needless to say that the present invention can be applied even to a phosphorescent light-emitting element. An organometallic complex including a central metal of iridium, platinum, or the like is a typical of a substance exhibiting phosphorescence. A skeleton having a role in carrier transport and a skeleton having a role in light emission can be introduced as ligands. When an organometallic complex includes a plurality of ligands, each ligand may include a skeleton having a role in a different function (such as an electron-transport property, a hole-transport property, or a light-emitting property), or a ligand including a skeleton having a role in light emission and a skeleton having a carrier-transport property at the same time may be used. Arrangement can be made for desired properties by adjustment of the combination.

For example, when an organometallic complex includes a plurality of, i.e., two or more ligands, at least two different ligands are included, and the structure in which one of the ligands includes a skeleton having a light-emitting property and the other ligand includes a skeleton having a hole-transport property, the structure in which one of the ligands includes a skeleton having a light-emitting property and the other ligand includes a skeleton having an electron-transport property, the structure in which one of the ligands includes a skeleton having a hole-transport property, the other ligand includes a skeleton having an electron-transport property, and at least either of the two different ligands further includes a skeleton having a light-emitting property, and the like are possible.

When a skeleton having a carrier-transport property and a light-emitting skeleton are included in the one molecule, the positional relation can be controlled. In evaporation or a wet method using a plurality of materials, the concentrations of a light-emitting material which is a guest and a carrier-transport material which is a host can be adjusted; however, the positional relation and arrangement cannot be controlled. It is found that the efficiency of energy transfer is dependent significantly on the shape, distance, and arrangement of the molecules of the host which is an energy donor and the guest which is an energy acceptor. When the skeleton having a carrier-transport property and the light-emitting skeleton are included in one molecule, the positional relation related to energy transfer, such as distance and arrangement, can be kept in a better state. This enables a light-emitting element having very high emission efficiency.

The molecular weight of such a light-emitting element material of one embodiment of the present invention is preferably less than or equal to 1300. When the molecular weight is less than or equal to 1300, decomposition of the light-emitting element material during evaporation can be inhibited and a light-emitting element having a long lifetime and high reliability can be obtained.

Even film formation of the material that cannot be evaporated can be performed by a wet method typified by a spin coating method or an inkjet method when the material is dissolved in an appropriate solvent.

To form a light-emitting layer, such a light-emitting element material of one embodiment of the present invention and the host material or guest material that is generally used, or the like may be mixed. Since the light-emitting element material of one embodiment of the present invention is in a state where a light-emitting substance itself has a high carrier-transport property, high recombination efficiency can be maintained while driving voltage of the element is reduced, and accordingly both high efficiency and low driving voltage can be achieved. Note that in this case, different organic compounds such as the host material or the guest material in the light-emitting layer are preferably organic compounds including the skeletons that are the same as the skeleton having a carrier-transport property in the light-emitting element material.

FIG. 2 illustrates examples of a light-emitting element using the light-emitting element material of one embodiment of the present invention. The light-emitting element using the light-emitting element material of one embodiment of the present invention is also one embodiment of the present invention. The light-emitting element includes an anode 101, a cathode 102, and an EL layer 103, and the above-described light-emitting element material is used in the EL layer.

The EL layer 103 includes at least a light-emitting layer 113, and the light-emitting layer 113 is formed using the above-described light-emitting element material. Both the skeleton having a role in carrier transport and the skeleton having a role in light emission are included in a molecule in the light-emitting element material as described above, and the light-emitting layer having favorable characteristics can be formed without co-evaporation. This simplifies an apparatus manufacturing light-emitting elements and can reduce an initial investment, which enables inexpensive manufacture of light-emitting elements.

FIG. 2 illustrates, in addition to the light-emitting layer 113, a hole-injection layer 111, a hole-transport layer 112, an electron-transport layer 114, and an electron-injection layer 115 as the EL layer 103, but the structure of the light-emitting element is not limited thereto; a variety of layer structures such as a hole-injection layer, a hole-transport layer, an electron-transport layer, an electron-injection layer, a carrier-block layer, an exciton-block layer, and a charge-generation layer can be employed.

Next, examples of specific structures and materials of the above-described light-emitting element are described.

Figure 2B:
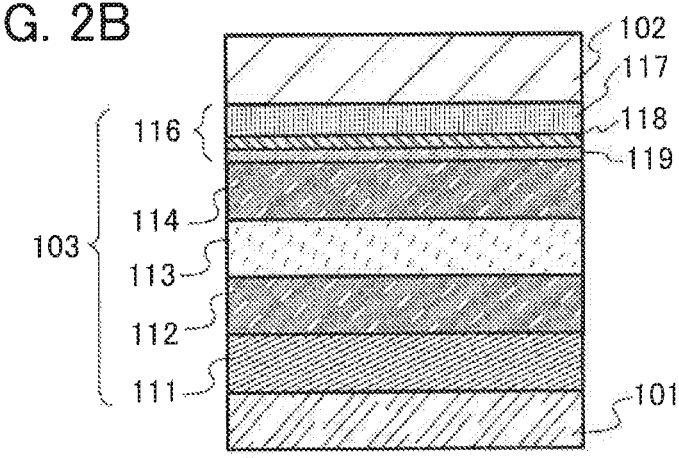

In this embodiment, two kinds of stacked layer structures of the EL layer 103 are described: the structure including the hole-injection layer 111, the hole-transport layer 112, the electron-transport layer 114, and the electron-injection layer 115 in addition to the light-emitting layer 113 as illustrated in FIG. 2(A); and the structure including the electron-transport layer 114 and a charge-generation layer 116 in addition to the hole-injection layer 111, the hole-transport layer 112, and the light-emitting layer 113 as illustrated in FIG. 2(B). Materials forming the electrodes and the EL layer are specifically described below.

The anode 101 is preferably formed using a metal, an alloy, a conductive compound each having a high work function (specifically, a work function of 4.0 eV or more), any of mixtures thereof, or the like. Specific examples are indium oxide-tin oxide (ITO: Indium Tin Oxide), indium oxide-tin oxide containing silicon or silicon oxide, indium oxide-zinc oxide, indium oxide containing tungsten oxide and zinc oxide (IWZO), and the like. Films of these conductive metal oxides are usually formed by a sputtering method but may be formed by application of a sol-gel method or the like. An example of the fabrication method is a method in which an indium oxide-zinc oxide film is formed by a sputtering method using a target in which 1 to 20 wt % zinc oxide is added to indium oxide. A film of indium oxide containing tungsten oxide and zinc oxide (IWZO) can also be formed by a sputtering method using a target containing 0.5 to 5 wt % tungsten oxide and 0.1 to 1 wt % zinc oxide with respect to indium oxide. Other examples are gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), and the like. Graphene can also be used. When a composite material described later is used for a layer in contact with the anode 101 in the EL layer 103, an electrode material can be selected regardless of its work function.

The hole-injection layer 111 is a layer containing a substance having an acceptor property. A compound including an electron-withdrawing group (a halogen group or a cyano group) can be used as a substance having an acceptor property. An organic acceptor such as 7,7,8,8-tetracyano-2,3,5,6-tetrafluoroquinodimethane (abbreviation: F4-TCNQ), 1,3,4,5,7,8-hexafluorotetracyano-naphthoquinodimethane (abbreviation: F6-TCNNQ), 3,6-difluoro-2,5,7,7,8,8-hexacyanoquinodimethane, chloranil, or 2,3,6,7,10,11-hexacyano-1,4,5,8,9,12-hexaazatriphenylene (HAT-CN); an inorganic oxide such as molybdenum oxide, vanadium oxide, ruthenium oxide, tungsten oxide, or manganese oxide; a phthalocyanine based metal complex such as phthalocyanine (abbreviation: $H_2Pc$) or copper phthalocyanine (CuPC); an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD); a high molecule such as poly(3,4-ethylenedioxythiophene)/poly(styrenesulfonic acid) (PEDOT/PSS); or the like can be used.

A compound in which electron-withdrawing groups are bonded to a condensed aromatic ring having a plurality of hetero atoms, like HAT-CN, is preferred as the organic acceptor because it is thermally stable. The organic compound having an acceptor property can extract electrons from an adjacent hole-transport layer (or hole-transport material) when an electric field is applied.

A composite material in which a substance having a hole-transport property contains an acceptor substance can also be used for the hole-injection layer 111. When the composite material in which a hole-transport substance contains an acceptor substance is used, a material used to form the electrode can be selected regardless of its work function. In other words, besides a material having a high work function, a material having a low work function can also be used for the anode 101. As the acceptor substance, the above-described organic acceptor, a transition metal oxide, and an oxide of a metal belonging to Group 4 to Group 8 of the periodic table can be used. As the oxide of a metal belonging to Group 4 to Group 8 in the periodic table, vanadium oxide, niobium oxide, tantalum oxide, chromium oxide, molybdenum oxide, tungsten oxide, manganese oxide, rhenium oxide, or the like is preferred because their electron-accepting property is high. Among them, molybdenum oxide is particularly preferred because it is stable in the air, has a low hygroscopic property, and is easily handled. As the organic acceptor, 7,7,8,8-tetracyano-2,3,5,6-tetrafluoroquinodimethane (abbreviation: F4-TCNQ), chloranil, or the like is preferred.

The substance having a hole-transport property which is used for the composite material preferably has a hole mobility of $10^{-6}$ cm$^2$/Vs or higher. As the substance having a hole-transport property, aromatic amines such as N,N'-di(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B); carbazole derivatives such as 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), and 1,4-bis[4-(N-carbazolyl)phenyl]-2,3,5,6-tetraphenylbenzene; and aromatic hydrocarbons such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, pentacene, coronene, rubrene, perylene, and 2,5,8,11-tetra (tert-butyl) perylene can be given. The aromatic hydrocarbon may have a vinyl skeleton. As the aromatic hydrocarbon having a vinyl group, for example, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like can be given. A compound including an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]-fluoren-2-amine (abbreviation: PCBAF), or N-phenyl-N4-[4-(9-phenyl-9H-carbazol-3-yl)phenyl]-spiro-9,9'-bifluoren-2-amine (abbreviation: PCBASF); a compound including a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP); a compound including a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBT-FLP-III), or 4-[4-(9-phenyl-9H-fluoren-9-yl)phenyl]-6-phenyldibenzothiophene (abbreviation: DBTFLP-IV); or a compound including a furan skeleton, such as 4,4',4"-(benzene-1,3,5-triyl)tri(dibenzofuran) (abbreviation: DBF3P-II) or 4-3-[3-(9-phenyl-9H-fluoren-9-yl)phenyl]phenyl}dibenzofuran (abbreviation: mmDBFFLBi-II) can be used. Among the above, the compound including an aromatic amine skeleton and the compound including a carbazole skeleton are preferred because these compounds are highly reliable and have high hole-transport properties to contribute to a reduction in driving voltage.

The hole-injection layer 111 can also be formed by a wet method. In this case, a conductive high molecular compound to which an acid is added, such as a poly(ethylenedioxythiophene)/poly(styrenesulfonic acid) aqueous solution (PEDOT/PSS), a polyaniline/camphor sulfonic acid aqueous solution (PANI/CSA), PTPDES, Et-PTPDEK, PPBA, or polyaniline/poly(styrenesulfonic acid) (PANI/PSS), or the like can be used.

The formation of the hole-injection layer 111 can improve the hole-injection property, whereby a light-emitting element having a low driving voltage can be obtained. The organic acceptor is an easy-to-use material because evaporation is easy and its film can be easily formed.

For the hole-transport layer 112, a material selected from the aforementioned materials having hole-transport properties or other various materials having hole-transport properties is used as appropriate.

The light-emitting layer 113 is formed of the aforementioned light-emitting element material of one embodiment of the present invention. Since the light-emitting element of one embodiment of the present invention includes a carrier-transport skeleton having a host function and the light-emitting skeleton having a light-emitting function in one molecule, a light-emitting layer having favorable characteristics can be formed of only the light-emitting element material.

A condensed aromatic ring skeleton or a heterocyclic skeleton having higher excited energy than the light-emitting skeleton having a light-emitting function, or the like can be used as the carrier-transport skeleton having a host function.

Specifically, the host function is roughly classified into hole transport, electron transport, and bipolar, which are achieved by their respective skeletons. A π-electron rich heteroaromatic ring skeleton or an arylamine skeleton can be given as the skeleton having a hole-transport function. Specific examples are a skeleton having a diphenylamine structure, a skeleton having a pyrrole ring, a furan ring, or a thiophene ring, and the like, and a skeleton in which such a ring is condensed with another aromatic ring can also be used. Specific examples are a carbazole ring, a dibenzofuran ring, a dibenzothiophene ring, or a heteroaromatic ring having such a ring structure. A π-electron deficient heteroaromatic ring skeleton can be given as the skeleton having an electron-transport function. Specific examples are a pyridine ring, a diazine ring, a triazine ring, and the like, and a skeleton in which such a ring is condensed with another aromatic ring can also be used. Specific examples are a pyridine ring, a phthalazine ring, a pyrimidine ring, a pyrazine ring, a triazine ring, a quinoline ring, a quinazoline ring, a quinoxaline ring, or a heteroaromatic ring having such a ring structure. A condensed aromatic hydrocarbon ring such as anthracene or pyrene can be favorably used as the skeleton having a bipolar property.

Examples of the light-emitting skeleton having a light-emitting function are luminophores such as an anthracene skeleton, a pyrene skeleton, and a perylene skeleton and skeletons consisting of a partial structure in which an aromatic ligand is ortho-metallated to iridium or platinum.

The light-emitting element material of one embodiment of the present invention does not need co-evaporation. Thus, in the case where vacuum evaporation is employed, a light-emitting element can be manufactured without being subjected to a manufacturing process and accordingly a significant cost reduction effect can be obtained.

In the case where the light-emitting element material is used to form a light-emitting layer by a wet method, the light-emitting element material is dissolved or dispersed in an appropriate liquid medium, a layer is formed by a wet process (e.g., a spin coating method, a casting method, a die coating method, a blade coating method, a roll coating method, an inkjet method, a printing method, a spray coating method, a curtain coating method, and a Langmuir-Blodgett method), and then the solvent is removed or baking is performed.

As the liquid medium used for the wet process, for example, an organic solvent of ketones such as methyl ethyl ketone and cyclohexanone; fatty acid esters such as ethyl acetate; halogenated hydrocarbons such as dichlorobenzene; aromatic hydrocarbons such as toluene, xylene, mesitylene, and cyclohexylbenzene; aliphatic hydrocarbons such as cyclohexane, decalin, and dodecane; dimethylformamide (DMF); dimethyl sulfoxide (DMSO); or the like can be used.

In order that the carrier balance may be adjusted in the light-emitting layer, the light-emitting element material of one embodiment of the present invention and the carrier-transport material having a hole-transport property and/or electron-transport property may be mixed and used. The light-emitting element material of one embodiment of the present invention and another light-emitting material may be mixed and used. Note that the carrier-transport material may be a material in which a plurality of kinds of substances are mixed. In the case where the mixed host material is used, a material having an electron-transport property and a material having a hole-transport property are preferably mixed. When a material having an electron-transport property and a material having a hole-transport property are mixed, the transport property of the light-emitting layer 113 can be easily adjusted and a recombination region can be easily controlled. The ratio between the content of the material having a hole-transport property and the content of the material having an electron-transport property is as follows: the material having a hole-transport property:the material having an electron-transport property=1:9 to 9:1.

These mixed host materials may form an exciplex. When a combination is selected so as to form an exciplex that exhibits light emission whose wavelength overlaps with the wavelength of a lowest-energy-side absorption band of the fluorescent light-emitting substance or the phosphorescent light-emitting substance, energy is transferred smoothly and light emission can be obtained efficiently. Because the driving voltage is also reduced, this structure is a preferred structure.

As the material having a hole-transport property in the carrier-transport material, the following can be given: compounds including aromatic amine skeletons, such as 2-[N-(9-phenylcarbazol-3-yl)-N-phenylamino]spiro-9,9'-bifluorene (abbreviation: PCASF), 4,4',4''-tris[N-(1-naphthyl)-N-phenylamino]triphenylamine (abbreviation: 1'-TNATA), 2,7-bis[N-(4-diphenylaminophenyl)-N-phenylamino]-spiro-9,9'-bifluorene (abbreviation: DPA2SF), N,N'-bis(9-phenylcarbazol-3-yl)-N,N'-diphenylbenzene-1,3-diamine (abbreviation: PCA2B), N-(9,9-dimethyl-2-diphenylamino-9H-fluoren-7-yl)diphenylamine (abbreviation: DPNF), N,N',N''-triphenyl-N,N',N''-tris(9-phenylcarbazol-3-yl)benzene-1,3,5-triamine (abbreviation: PCA3B), 2-[N-(4-diphenylaminophenyl)-N-phenylamino]spiro-9,9'-bifluorene (abbreviation: DPASF), N,N'-bis[4-(carbazol-9-yl)phenyl]-N,N'-diphenyl-9,9-dimethylfluorene-2,7-diamine (abbreviation: YGA2F), NPB, N,N'-bis(3-methylphenyl)-N,N'-diphenyl-[1,1'-biphenyl]-4,4'-diamine (abbreviation: TPD), 4,4'-bis[N-(4-diphenylaminophenyl)-N-phenylamino]biphenyl (abbreviation: DPAB), BSPB, 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), PCzPCA1, 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), DNTPD, 3,6-bis[N-(4-diphenylaminophenyl)-N-(1-naphthyl)amino]-9-phenylcarbazole (abbreviation: PCzTPN2), PCzPCA2, 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), 3-[N-(1-naphthyl)-N-(9-phenylcarbazol-3-yl)amino]-9-phenylcarbazole (abbreviation: PCzPCN1), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), N-(4-biphenyl)-N-(9,9-dimethyl-9H-fluoren-2-yl)-9-phenyl-9H-carbazol-3-amine (abbreviation: PCBiF), and N-(1,1'-biphenyl-4-yl)-N-[4-(9-phenyl-9H-carbazol-3-yl)phenyl]-9,9-dimethyl-9H-fluoren-2-amine (abbreviation: PCBBiF); compounds including carbazole skeletons, such as 1,3-bis(N-carbazolyl)benzene (abbreviation: mCP), CBP, 3,6-bis(3,5-diphenylphenyl)-9-phenylcarbazole (abbreviation: CzTP), and 9-phenyl-9H-3-(9-phenyl-9H-carbazol-3-yl)carbazole (abbreviation: PCCP); compounds including thiophene skeletons, such as 4,4',4''-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds including furan skeletons, such as 4,4',4''-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

As the material having a hole-transport property in the carrier-transport material, the following can be given: metal complexes, such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds including polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds including diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds including triazine skeletons, such as 2-{4-[3-(N-phenyl-9H-carbazol-3-yl)-9H-carbazol-9-yl]phenyl}-4,6-diphenyl-1,3,5-triazine (abbreviation: PCCzPTzn); and heterocyclic compounds including pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB).

As the light-emitting material, the following can be given: phosphorescent compounds, such as tris{2-[5-(2-methylphenyl)-4-(2,6-dimethylphenyl)-4H-1,2,4-triazol-3-yl-κN2]phenyl-κC}iridium(III) (abbreviation: Ir(mpptz-dmp)$_3$), tris(5-methyl-3,4-diphenyl-4H-1,2,4-triazolato)iridium(III) (abbreviation: Ir(Mptz)$_3$), tris[4-(3-biphenyl)-5-isopropyl-3-phenyl-4H-1,2,4-triazolato]iridium(III) (abbreviation: Ir(iPrptz-3b)$_3$), tris[3-(5-biphenyl)-5-isopropyl-4-phenyl-4H-1,2,4-triazolato]iridium(III) (abbreviation: Ir(iPr5btz)$_3$), tris[3-methyl-1-(2-methylphenyl)-5-phenyl-1H-1,2,4-triazolato]iridium(III) (abbreviation: Ir(Mptz1-mp)$_3$), tris(1-methyl-5-phenyl-3-propyl-1H-1,2,4-triazolato)iridium(III) (abbreviation: Ir(Prptzl-Me)$_3$), fac-tris[1-(2,6-diisopropylphenyl)-2-phenyl-1H-imidazole]iridium(III) (abbreviation: Ir(iPrpmi)$_3$), tris[3-(2,6-dimethylphenyl)-7-methylimidazo[1,2-f]phenanthridinato]iridium(III) (abbreviation: Ir(dmpimpt-Me)$_3$), bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: Flrpic), bis{2-[3',5'-bis(trifluoromethyl)phenyl]pyridinato-N,C$^{2'}$]iridium(III) picolinate (abbreviation: Ir(CF$_3$ppy)$_2$(pic)), bis[2-(4',6'-difluorophenyl)pyridinato-N,C$^{2'}$]iridium(III) acetylacetonate (abbreviation: FIr(acac), tris(4-methyl-6-phenylpyrimidinato)iridium(III) (abbreviation: Ir(mppm)$_3$), tris(4-t-butyl-6-phenylpyrimidinato)iridium(III) (abbreviation: Ir(tBuppm)$_3$), (acetylacetonato)bis(6-methyl-4-phenylpyrimidinato)iridium(III) (abbreviation: Ir(mppm)$_2$(acac)), (acetylacetonato)bis(6-tert-butyl-4-phenylpyrimidinato)iridium(III) (abbreviation: Ir(tBuppm)$_2$(acac)), (acetylacetonato)bis[4-(2-norbornyl)-6-phenylpyrimidinato]iridium(III) (abbreviation: Ir(nbppm)$_2$(acac)), (acetylacetonato)bis[5-methyl-6-(2-methylphenyl)-4-phenylpyrimidinato]iridium(III) (abbreviation: Ir(mpmppm)$_2$(acac)), (acetylacetonato)bis{4,6-dimethyl-2-[6-(2,6-dimethylphenyl)-4-pyrimidinyl-κN3]phenyl-κC}iridium(III) (abbreviation: Ir(dmppm-dmp)$_2$(acac)), (acetylacetonato)bis(4,6-diphenylpyrimidinato)iridium(III) (abbreviation: Ir(dppm)$_2$(acac)), (acetylacetonato)bis(3,5-dimethyl-2-phenylpyrazinato)iridium(III) (abbreviation: Ir(mppr-Me)$_2$(acac)), (acetylacetonato)bis(5-isopropyl-3-methyl-2-phenylpyrazinato)iridium(III) (abbreviation: Ir(mppr-iPr)$_2$(acac)), tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$acac), bis(benzo[h]quinolinato)iridium(III) acetylacetonate (abbreviation: Ir(bzq)$_2$(acac)), tris(benzo[h]quinolinato)iridium(III) (abbreviation: Ir(bzq)$_3$), tris(2-phenylquinolinato-N,C$^{2'}$)iridium(III) (abbreviation: Ir(pq)$_3$), bis(2-phenylquinolinato-N,C$^{2'}$)iridium(III) acetylacetonate (abbreviation: Ir(pq)$_2$(acac)), bis(2,4-diphenyl-1,3-oxazolato-N,C$^{2'}$)iridium(III) acetylacetonate (abbreviation: Ir(dpo)$_2$(acac)), bis{2-[4'-(perfluorophenyl)phenyl]pyridinato-N,C$^{2'}$}iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), diisobutyrylmethanato)bis[4,6-bis(3-methylphenyl)pyrimidinato]iridium(III) (abbreviation: Ir(5mdppm)$_2$(dibm)), bis[4,6-bis(3-methylphenyl)pyrimidinato](dipivaloylmethanato)iridium(III) (abbreviation: Ir(5mdppm)$_2$(dpm)), bis[4,6-di(naphthalen-1-yl)pyrimidinato](dipivaloylmethanato)iridium(III) (abbreviation: Ir(d1npm)$_2$(dpm)), (acetylacetonato)bis(2,3,5-triphenylpyrazinato)iridium(III) (abbreviation: Ir(tppr)$_2$(acac)), bis(2,3,5-triphenylpyrazinato)(dipivaloylmethanato)iridium(III) (abbreviation: Ir(tppr)$_2$(dpm)), (acetylacetonato)bis[2,3-bis(4-fluorophenyl)quinoxalinato]iridium(III) (abbreviation: Ir(Fdpq)$_2$(acac)), tris(1-phenylisoquinolinato-N,C$^{2'}$)iridium(III) (abbreviation: Ir(piq)$_3$), bis(1-phenylisoquinolinato-NC$^{2'}$)iridium(III) acetylacetonate (abbreviation: Ir(piq)$_2$(acac)), and 2,3,7,8,12,13,17,18-octaethyl-21H,23H-porphyrin platinum(II) (abbreviation: PtOEP); and thermally activated delayed fluorescence (TADF) materials, such as 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), and 10-phenyl-10H,10'H-spiro[acridin-9,9'-anthracen]-10'-one (abbreviation: ACRSA); and fluorescent compounds such as N,N'-diphenyl-N,N'-bis[4-(9-phenyl-9H-fluoren-9-yl)phenyl]pyrene-1,6-diamine (abbreviation: 1,6FLPAPrn), N,N'-bis(3-methylphenyl)-N,N'-bis[3-(9-phenyl-9H-fluoren-9-yl)phenyl]pyrene-1,6-diamine (abbreviation: 1,6mMemFLPAPrn), N,N'-bis[4-(9-phenyl-9H-fluoren-9-yl)phenyl]-N,N'-bis(4-tert-butylphenyl)-pyrene-1,6-diamine (abbreviation: 1,6tBu-FLPAPrn), N,N'-bis[4-(9-phenyl-9H-fluoren-9-yl)phenyl]-N,N-diphenyl-3,8-dicyclohexylpyrene-1,6-diamine (abbreviation: ch-1,6FLPAPrn), N,N'-bis[4-(9H-carbazol-9-yl)phenyl]-N,N'-diphenylstilbene-4,4'-diamine (abbreviation: YGA2S), 4-(9H-carbazol-9-yl)-4'-

(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N'''-(2-tert-butylanthracene-9,10-diyldi-4,1-phenylene)bis[N,N',N'-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N',N'-triphenyl-1,4-phenylenediamine (abbreviation: 2DPAPPA), N,N,N',N',N'',N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 6, coumarin 545T, N,N'-diphenylquinacridone (abbreviation: DPQd), rubrene, 2,8-di-tert-butyl-5,11-bis(4-tert-butylphenyl)-6,12-diphenyltetracene (abbreviation: TBRb), Nile red, 5,12-bis(1,1'-biphenyl-4-yl)-6,11-diphenyltetracene (abbreviation: BPT), 2-(2-{2-[4-(dimethylamino)phenyl] ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl]ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a] fluoranthene-3,10-diamine (abbreviation: p-mPhAFD), 2-{2-isopropyl-6-[2-(1,1,7,7-tetramethyl-2,3,6,7-tetrahydro-1H,5H-benzo quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-trahydro-1H,5H-benzo[ij]quinolizin-9-yl]ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl]ethenyl]-4H-pyran-4-ylidene}propanedinitrile (abbreviation: BisDCJTM), and 5,10,15,20-tetraphenylbisbenzo[5,6]indeno[1,2,3-cd:1',2',3'-lm]perylene.

The light-emitting layer 113 having the above-described structure can be fabricated by co-evaporation in a vacuum evaporation method, or a gravure printing method, an offset printing method, an inkjet method, a spin coating method, a dip coating method, or the like using a mixed solution.

The electron-transport layer 114 is a layer containing a substance having an electron-transport property. Examples of the substance having an electron-transport property are metal complexes, such as bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds including polyazole skeletons, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), and 2-[3-(dibenzothiophen-4-yl)phenyl]-1-phenyl-1H-benzimidazole (abbreviation: mDBTBIm-II); heterocyclic compounds including diazine skeletons, such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), and 4,6-bis[3-(4-dibenzothienyl)phenyl]pyrimidine (abbreviation: 4,6mDBTP2Pm-II); and heterocyclic compound including pyridine skeletons, such as 3,5-bis[3-(9H-carbazol-9-yl)phenyl]pyridine (abbreviation: 35DCzPPy) and 1,3,5-tri[3-(3-pyridyl)phenyl]benzene (abbreviation: TmPyPB). Among the above materials, the heterocyclic compound including a diazine skeleton and the heterocyclic compound including a pyridine skeleton have high reliability and thus are preferred. In particular, the heterocyclic compound including a diazine (pyrimidine or pyrazine) skeleton has a high electron-transport property and contributes to a reduction in drive voltage.

A layer that controls transfer of electron carriers may be provided between the electron-transport layer and the light-emitting layer. This is a layer in which a small amount of a substance having a high electron-trapping property is added to a material having a high electron-transport property described above, and the inhibition of transfer of electron carriers enables adjustment of carrier balance. Such a structure is very effective in inhibiting a problem caused when electrons pass through the light-emitting layer (for example, a reduction in element lifetime).

The electron-injection layer 115 in contact with the cathode 102 may be provided between the electron-transport layer 114 and the cathode 102. For the electron-injection layer 115, an alkali metal, an alkaline earth metal, or a compound thereof, such as lithium fluoride (LiF), cesium fluoride (CsF), or calcium fluoride (CaF$_2$), can be used. For example, a layer that consists of a substance having an electron-transport property and contains an alkali metal, an alkaline earth metal, or a compound thereof can be used. An electride may also be used for the electron-injection layer 115. For example, a substance in which electrons are added at high concentration to a mixed oxide of calcium and aluminum, or the like can be given as the electride. The layer that consists of a substance having an electron-transport property and contains an alkali metal or an alkaline earth metal is preferably used as the electron-injection layer 115, in which case electron injection from the cathode 102 is efficiently performed.

Instead of the electron-injection layer 115, a charge-generation layer 116 may be provided (FIG. 2(B)). The charge-generation layer 116 refers to a layer capable of injecting holes into a layer in contact with the cathode side of the layer and electrons into a layer in contact with the anode side thereof when a potential is applied. The charge-generation layer 116 includes at least a p-type layer 117. The p-type layer 117 is preferably formed using the composite material given above as the material that can form the hole-injection layer 111. The p-type layer 117 may be formed by stacking a film containing the above-described acceptor substance as a material included in the composite material and a film containing a hole-transport material. When a potential is applied to the p-type layer 117, electrons are injected into the electron-transport layer 114 and holes are injected into the cathode 102, which is a cathode; thus, the light-emitting element operates. In this case, the presence of a layer containing the light-emitting element material of one embodiment of the present invention in a position of the electron-transport layer 114 which is in contact with the charge-generation layer 116 inhibits a luminance decrease with the accumulated driving time of the light-emitting element; thus, the light-emitting element having a long lifetime can be obtained.

The charge-generation layer 116 preferably includes any one or both of an electron-relay layer 118 and an electron-injection buffer layer 119 in addition to the p-type layer 117.

The electron-relay layer 118 contains at least a substance having an electron-transport property and has a function of preventing an interaction between the electron-injection buffer layer 119 and the p-type layer 117 to transfer electrons smoothly. The LUMO level of the substance having an electron-transport property contained in the electron-relay layer 118 is preferably between the LUMO level of the acceptor substance in the p-type layer 117 and the LUMO level of a substance contained in a layer of the electron-transport layer 114 in contact with the charge-generation layer 116. The specific energy level of the LUMO level of the substance having an electron-transport property used for the electron-relay layer 118 is higher than or equal to −5.0 eV, preferably higher than or equal to −5.0 eV and lower than or equal to −3.0 eV. As the substance having an electron-transport property used for the electron-relay layer 118, a phthalocyanine-based material or a metal complex having a metal-oxygen bond and an aromatic ligand is preferably used.

A substance having a high electron-injection property, such as an alkali metal, an alkaline earth metal, a rare earth metal, a compound thereof (an alkali metal compound (including an oxide such as lithium oxide, a halide, and a carbonate such as lithium carbonate and cesium carbonate), an alkaline earth metal compound (including an oxide, a halide, and a carbonate), or a rare earth metal compound (including an oxide, a halide, and a carbonate)) can be used for the electron-injection buffer layer 119.

In the case where the electron-injection buffer layer 119 is formed to contain the substance having an electron-transport property and a donor substance, an organic compound such as tetrathianaphthacene (abbreviation: TTN), nickelocene, or decamethylnickelocene can also be used as the donor substance, as well as an alkali metal, an alkaline earth metal, a rare earth metal, a compound thereof (an alkali metal compound (including an oxide such as lithium oxide, a halide, and a carbonate such as lithium carbonate or cesium carbonate), an alkaline earth metal compound (including an oxide, a halide, and a carbonate), or a rare earth metal compound (including an oxide, a halide, and a carbonate)). As the substance having an electron-transport property, a material similar to the above-described material for the electron-transport layer 114 can be used for the formation.

A metal, an alloy, a conductive compound, or a mixture thereof having a low work function (specifically, 3.8 eV or less) or the like can be used as a substance forming the cathode 102. Specific examples of such a cathode material are alkali metals such as lithium (Li) and cesium (Cs), metals belonging to Group 1 or Group 2 of the periodic table such as magnesium (Mg), calcium (Ca), and strontium (Sr), alloys containing these (MgAg and AlLi), rare earth metals such as europium (Eu) and ytterbium (Yb), alloys containing these, and the like. However, when the electron-injection layer is provided between the cathode 102 and the electron-transport layer, a variety of conductive materials such as Al, Ag, ITO, or indium oxide-tin oxide containing silicon or silicon oxide can be used for the cathode 102 regardless of the magnitude of the work function. Films of these conductive materials can be formed by a dry method such as a vacuum evaporation method or a sputtering method, an inkjet method, a spin coating method, or the like. Alternatively, a wet method using a sol-gel method or a wet method using a paste of a metal material may be used for formation.

A variety of methods can be used to form the EL layer 103 regardless of whether it is a dry method or a wet method. For example, a vacuum evaporation method or a wet process method (such as a spin coating method, a casting method, a die coating method, a blade coating method, a roll coating method, an inkjet method, a printing method (e.g., a gravure printing method, an offset printing method, or a screen printing method), a spray coating method, a curtain coating method, or a Langmuir-Blodgett method) may be used.

Different film formation methods may be used to form the electrodes or the layers described above.

Here, a method of forming an EL layer 786 by a droplet discharge method is described with reference to FIG. 3. FIG. 3(A) to FIG. 3(D) are cross-sectional views illustrating the method of manufacturing the EL layer 786.

Figure 3A:
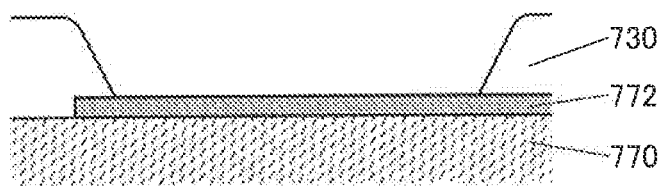
FIGS. 3A-3D Views showing an example of a method of manufacturing a light-emitting element.
Figure 3B:
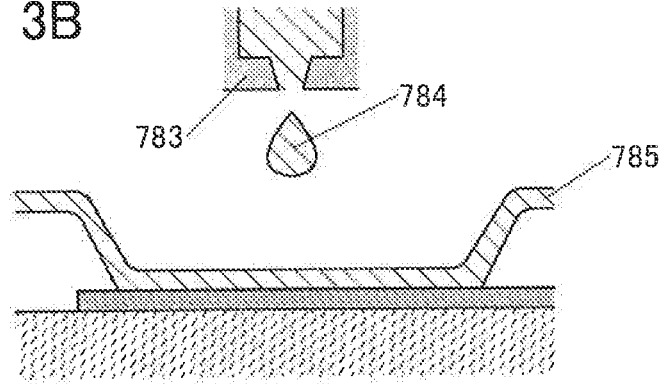

First, a conductive film 772 is formed over the planarization insulating film 770, and an insulating film 730 is formed so as to cover part of the conductive film 772 (see FIG. 3(A)).

Then, a droplet 784 is discharged from a droplet discharge apparatus 783 to an exposed portion of the conductive film 772, which is an opening of the insulating film 730, so that a layer 785 containing a composition is formed. The droplet 784 is a composition containing a solvent and is attached on the conductive film 772 (see FIG. 3(B)).

Note that the step of discharging the droplet 784 may be performed under reduced pressure.

Figure 3C:
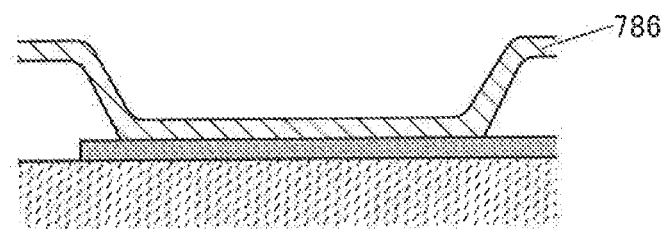

Then, the solvent is removed from the layer 785 containing the composition, and the layer is solidified to form the EL layer 786 (see FIG. 3(C)).

Note that as the method of removing the solvent, a drying process or a heating process is performed.

Figure 3D:
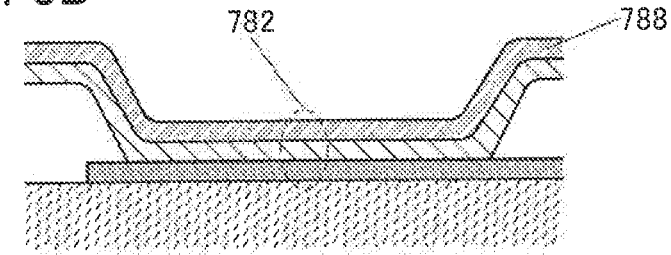

Next, a conductive film 788 is formed over the EL layer 786; thus, a light-emitting element 782 is formed (see FIG. 3(D)).

When the EL layer 786 is formed by a droplet discharge method as described above, the composition can be selectively discharged; accordingly, waste of material can be reduced. Furthermore, a lithography process or the like for shape processing is not needed, and thus, the process can be simplified and a cost reduction can be achieved.

Note that the above-described droplet discharge method is a general term for what has a droplet discharge means such as a nozzle having a composition discharge outlet or a head having one or more nozzles.

Figure 4:
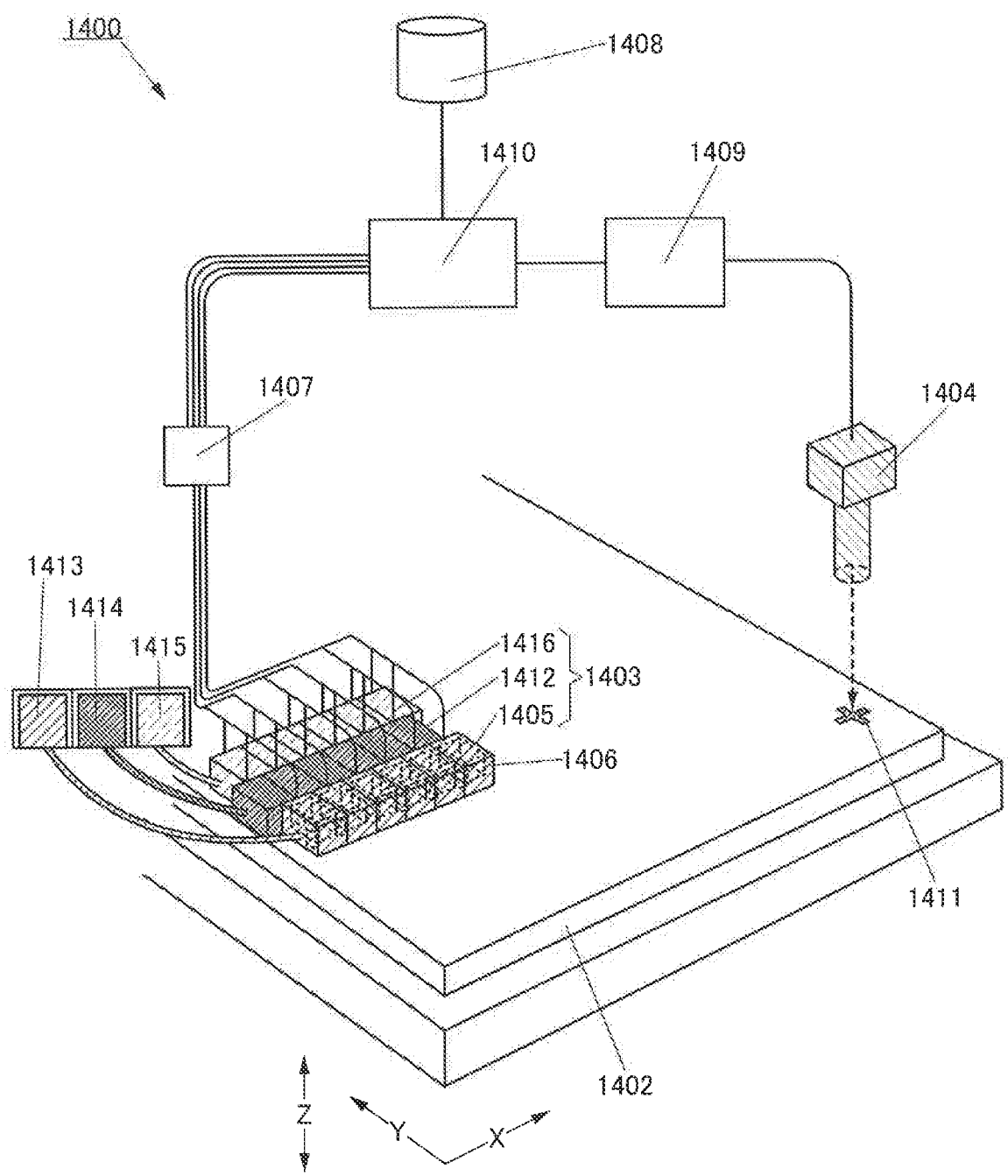
FIG. 4 A view showing an example of a method of manufacturing a light-emitting element.

Next, a droplet discharge apparatus used for the droplet discharge method is described with reference to FIG. 4. FIG. 4 is a conceptual view illustrating a droplet discharge apparatus 1400.

The droplet discharge apparatus 1400 includes a droplet discharge means 1403. In addition, the droplet discharge means 1403 includes a head 1405, a head 1412, and a head 1416.

The head 1405 and the head 1412 are connected to a control means 1407 which is controlled by a computer 1410; thus, a preprogrammed pattern can be drawn.

The drawing may be conducted at a timing, for example, based on a marker 1411 formed over a substrate 1402. Alternatively, the reference point may be determined on the basis of an outer edge of the substrate 1402. Here, the marker 1411 is detected by an imaging means 1404 and converted into a digital signal by an image processing means 1409. The computer 1410 recognizes the digital signal, generates a control signal, and transmits it to the control means 1407.

An image sensor or the like utilizing a charge coupled device (CCD) or a complementary metal-oxide-semiconductor (CMOS) can be used as the imaging means 1404. Note that information about a pattern to be formed over the substrate 1402 is stored in a storage medium 1408. On the basis of the information, a control signal is transmitted to the control means 1407, and each of the head 1405, the head 1412, and the head 1416 of the droplet discharge means 1403 can be individually controlled. The head 1405, the head 1412, and the head 1416 are supplied with a material to be discharged from a material supply source 1413, a material supply source 1414, and a material supply source 1415 through pipes, respectively.

The inside structures of the head 1405, the head 1412, and the head 1416 have a space as indicated by a dotted line 1406 to be filled with a liquid material and a nozzle which is a discharge outlet. Although not illustrated, the inside structure of the head 1412 is similar to that of the head 1405. When the nozzle sizes of the head 1405 and the head 1412 are different from each other, different materials with different widths can be drawn simultaneously. One head can discharge a plurality of light-emitting materials or the like to draw. In the case of drawing over a wide region, the same material can be simultaneously discharged from a plurality of nozzles in order that throughput be improved. When a large substrate is used, the head 1405, the head 1412, and the head 1416 can freely scan the substrate in directions indicated by arrows X, Y, and Z shown in FIG. 4, and a region in which drawing is performed can be freely set. Thus, a plurality of the same patterns can be drawn over one substrate.

The step of discharging the composition may be performed under reduced pressure. The substrate may be heated when the composition is discharged. The discharge of the composition is followed by one of or both drying and baking steps. Both the drying and baking steps are heat treatment steps but different in purpose, temperature, and time. The drying step and the baking step are performed under normal pressure or reduced pressure by laser light irradiation or rapid thermal annealing, with a heating furnace, or the like. Note that there is no particular limitation on the timing of the heat treatment and the number of times of the heat treatment. The temperature for excellently performing the drying and baking steps depends on the material of the substrate and the properties of the composition.

In the above-described manner, the EL layer 786 can be fabricated with the droplet discharge apparatus.

In the case where the EL layer 786 is fabricated with the droplet discharge apparatus, when the EL layer 786 is formed by a wet method using a composition in which any of a variety of organic materials and organic-inorganic halide perovskite materials are dissolved or dispersed in a solvent, various organic solvents can be used to serve as a composition for application. As an organic solvent that can be used for the composition, various organic solvents such as benzene, toluene, xylene, mesitylene, tetrahydrofuran, dioxane, ethanol, methanol, n-propanol, isopropanol, n-butanol, t-butanol, acetonitrile, dimethyl sulfoxide, dimethylformamide, chloroform, methylene chloride, carbon tetrachloride, ethyl acetate, hexane, and cyclohexane can be used. In particular, a less polar benzene derivative such as benzene, toluene, xylene, or mesitylene is preferably used because a solution with a suitable concentration can be made and deterioration of a material contained in ink due to oxidation or the like can be prevented. In consideration of film uniformity, thickness uniformity, and the like, the boiling point is preferably 100° C. or higher, and toluene, xylene, and mesitylene are further preferred.

The above structure can be combined as appropriate with the other structures in the other embodiments and this embodiment.

Next, a mode of a light-emitting element in which a plurality of light-emitting units are stacked (also referred to as a stacked type element) is described with reference to FIG. 2(C). This light-emitting element includes a plurality of light-emitting units between an anode and a cathode. One light-emitting unit has a structure similar to that of the EL layer 103 illustrated in FIG. 2(A). In other words, the light-emitting element illustrated in FIG. 2(A) or FIG. 2(B) includes a single light-emitting unit, and the light-emitting element illustrated in FIG. 2(C) includes a plurality of light-emitting units.

Figure 2C:
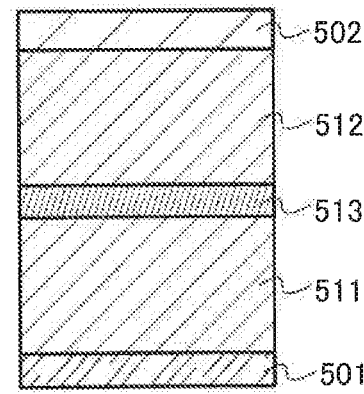

In FIG. 2(C), a first light-emitting unit 511 and a second light-emitting unit 512 are stacked between an anode 501 and a cathode 502, and a charge-generation layer 513 is provided between the first light-emitting unit 511 and the second light-emitting unit 512. The anode 501 and the cathode 502 correspond, respectively, to the anode 101 and the cathode 102 in FIG. 2(A), and what is given in the description for FIG. 2(A) can be used. The first light-emitting unit 511 and the second light-emitting unit 512 may have the same structure or different structures.

The charge-generation layer 513 has a function of injecting electrons into one of the light-emitting units and injecting holes into the other of the light-emitting units when a voltage is applied to the anode 501 and the cathode 502. In other words, in FIG. 2(C), when a voltage is applied, the charge-generation layer 513 injects electrons into the first light-emitting unit 511 and injects holes into the second light-emitting unit 512.

The charge-generation layer 513 preferably has a structure similar to that of the charge-generation layer 116 described with reference to FIG. 2(B). Since the composite material of an organic compound and a metal oxide has excellent carrier-injection and carrier-transport properties, low-voltage driving or low-current driving can be achieved. Note that in the case where a surface of the light-emitting unit on the anode side is in contact with the charge-generation layer 513, the charge-generation layer 513 can also serve as a hole-injection layer of the light-emitting unit; thus, a hole-injection layer is not necessarily provided in the light-emitting unit.

In the case where the electron-injection buffer layer 119 is provided in the charge-generation layer 513, the layer serves as the electron-injection buffer layer in the light-emitting unit on the anode side and therefore another electron-injection layer is not necessarily formed to overlap with the light-emitting unit.

The light-emitting element having two light-emitting units has been described with reference to FIG. 2(C); however, a light-emitting element in which three or more light-emitting units are stacked can be similarly employed.

With a plurality of light-emitting units partitioned by the charge-generation layer 513 between a pair of electrodes in such a manner, light emission with high luminance can be obtained while current density is kept low; thus, a long-life element can be achieved. A light-emitting device that is capable of low-voltage drive and has low power consumption can be achieved.

When emission colors of the light-emitting units are different, light emission of a desired color can be obtained from the light-emitting element as a whole. For example, two light-emitting units are formed such that blue fluorescence is obtained from a first light-emitting unit and red and green phosphorescence is obtained from a second light-emitting unit; thus, white light emission with a high color rendering property can be obtained. Alternatively, three light-emitting units are formed such that blue fluorescence is obtained from a first light-emitting unit, yellow phosphorescence is obtained from a second light-emitting unit, and blue fluorescence is obtained from a third light-emitting unit; thus, white light emission with very high efficiency can be obtained.

Embodiment 2

In this embodiment, a light-emitting device using the light-emitting element described in Embodiment 1 is described.

A light-emitting device of one embodiment of the present invention is described with reference to FIG. 5. Note that FIG. 5(A) is a top view illustrating the light-emitting device and FIG. 5(B) is a cross-sectional view taken along A-B and C-D in FIG. 5(A). This light-emitting device includes a driver circuit portion (a source line driver circuit) 601, a pixel portion 602, and a driver circuit portion (a gate line driver circuit) 603 which are indicated by dotted lines as components controlling light emission of the light-emitting element. Furthermore, 604 denotes a sealing substrate, 605 denotes a sealing material, and a portion surrounded by the sealing material 605 is a space 607.

Note that a lead wiring 608 is a wiring for transmitting signals to be input to the source line driver circuit 601 and the gate line driver circuit 603 and receives a video signal, a clock signal, a start signal, a reset signal, and the like from an FPC (flexible printed circuit) 609 serving as an external input terminal. Although only the FPC is illustrated here, a printed wiring board (PWB) may be attached to the FPC. The light-emitting device in this specification includes not only the light-emitting device itself but also the state where the FPC or the PWB is attached to the light-emitting device.

Next, a cross-sectional structure is described with reference to FIG. 5(B). The driver circuit portion and the pixel portion are formed over an element substrate 610. Here, the source line driver circuit 601, which is the driver circuit portion, and one pixel of the pixel portion 602 are illustrated.

In the source line driver circuit 601, a CMOS circuit in which an n-channel FET 623 and a p-channel FET 624 are combined is formed. The driver circuit may be formed of various CMOS circuits, PMOS circuits, or NMOS circuits. Although a driver-integrated type where the driver circuit is formed over the substrate is described in this embodiment, this is not necessary and the driver circuit can be formed not over the substrate but in an external portion.

The pixel portion 602 is formed of a plurality of pixels including a switching FET 611, a current controlling FET 612, and an anode 613 electrically connected to a drain thereof. Without being limited thereto, three or more FETs and a capacitor may be combined to form the pixel portion.

There is no particular limitation on the kind and crystallinity of a semiconductor used for the FETs; an amorphous semiconductor may be used or a crystalline semiconductor may be used. As examples of the semiconductor used for the FETs, Group 13 semiconductors, Group 14 semiconductors, semiconductors, compound semiconductors, oxide semiconductors, and organic semiconductor materials can be used. In particular, oxide semiconductors are preferably used. Examples of the oxide semiconductor include an In—Ga oxide and an In-M-Zn oxide (M is Al, Ga, Y, Zr, La, Ce, or Nd). The use of an oxide semiconductor material that has an energy gap of 2 eV or more, preferably 2.5 eV or more, further preferably 3 eV or more enables a reduction in the off-state current of the transistor and therefore such a structure is preferred.

An insulator 614 is formed to cover an end portion of the anode 613. Here, the use of a positive photosensitive acrylic resin film enables formation.

In order to improve the coverage, the insulator 614 is formed to have a curved surface with curvature at its upper end portion or lower end portion. For example, in the case where a positive photosensitive acrylic is used as a material of the insulator 614, only the upper end portion of the insulator 614 preferably has a curved surface with a curvature radius (0.2 μpm to 3 μm). Either a negative photosensitive resin or a positive photosensitive resin can be used as the insulator 614.

An EL layer 616 and a cathode 617 are each formed over the anode 613. These anode 613, EL layer 616, and cathode 617 correspond, respectively, to the anode 101, the EL layer 103, and the cathode 102 described with reference to FIG. 2(A) or the anode 501, the EL layer (the first light-emitting unit 511, the charge-generation layer 513, and the second light-emitting unit 512), and the cathode 502 described with reference to FIG. 2(C).

When the sealing substrate 604 and the element substrate 610 are attached to each other with the sealing material 605, a structure in which the light-emitting element 618 is provided in the space 607 surrounded by the element substrate 610, the sealing substrate 604, and the sealing material 605 is obtained. The space 607 is filled with a filler and there is a case where the space 607 is filled with the sealing material 605 as well as the case where the space 607 is filled with an inert gas (nitrogen, argon, or the like). It is preferable that the sealing substrate be provided with a recessed portion and a drying material be provided therein, in which case deterioration due to influence of moisture can be inhibited.

An epoxy-based resin or glass frit is preferably used for the sealing material 605. Such a material is desirably a material that does not transmit moisture or oxygen as much as possible. As materials used for the element substrate 610 and the sealing substrate 604, in addition to a glass substrate and a quartz substrate, a plastic substrate formed of FRP (Fiber Reinforced Plastics), PVF (poly(vinyl fluoride)), polyester, acrylic, or the like can be used.

In this specification and the like, a transistor and a light-emitting element can be formed using a variety of substrates, for example. The type of a substrate is not limited to a certain type. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, and the like. As examples of the glass substrate, a barium borosilicate glass, an aluminoborosilicate glass, a soda lime glass, and the like can be given. Examples of the flexible substrate, the attachment film, the base material film, or the like are as follows: plastic typified by polyethylene terephthalate (PET), polyethylene naphthalate (PEN), and polyether sulfone (PES). Another example is a synthetic resin such as acrylic. Another examples are polytetrafluoroethylene (PTFE), polypropylene, polyester, polyvinyl fluoride, polyvinyl chloride, and the like. Another examples are polyamide, polyimide, aramid, epoxy, an inorganic film formed by evaporation, paper, and the like. Specifically, the use of semiconductor substrates, single crystal substrates, SOI substrates, or the like enables the manufacture of small-sized transistors with a small variation in characteristics, size, shape, or the like and with high current capability. A circuit formed by such transistors achieves lower power consumption of the circuit or higher integration of the circuit.

Alternatively, a flexible substrate may be used as the substrate, and the transistor and the light-emitting element may be formed directly over the flexible substrate. Alternatively, a separation layer may be provided between the substrate and the transistor or between the substrate and the light-emitting element. The separation layer can be used in order to be separated from the substrate and transferred onto another substrate after part or the whole of a semiconductor device is completed thereover. In such a case, the transistor can be transferred to a substrate having poor heat resistance or a substrate having flexibility as well. For the above-described separation layer, a stacked layer structure of inorganic films, which are a tungsten film and a silicon oxide film, a structure in which an organic resin film of polyimide or the like is formed over a substrate, or the like can be employed.

In other words, after the transistor and the light-emitting element are formed using a certain substrate, the transistor and the light-emitting element may be transferred to a different substrate, so that the transistor and the light-emitting element are placed over the substrate. Examples of the substrate to which the transistor and the light-emitting element are transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (silk, cotton, or hemp), a synthetic fiber (nylon, polyurethane, or polyester), a regenerated fiber (acetate, cupra, rayon, or regenerated polyester), or the like), a leather substrate, and a rubber substrate. The use of such a substrate can form a transistor with good properties, form a transistor with low power consumption, manufacture a device that is not easily broken, give heat resistance, reduce weight, or reduce thickness.

FIG. 6 illustrates an example of a light-emitting device in which light-emitting elements that exhibit white light emission are formed and coloring layers (color filters) and the like are provided to achieve full color. In FIG. 6(A), a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, anodes 1024W, 1024R, 1024G, and 1024B of the light-emitting elements, a partition 1025, an EL layer 1028, a cathode 1029 of the light-emitting elements, a sealing substrate 1031, a sealing material 1032, and the like are illustrated.

In FIG. 6(A), coloring layers (a red coloring layer 1034R, a green coloring layer 1034G, and a blue coloring layer 1034B) are provided on a transparent base material 1033. A black layer (a black matrix) 1035 may be additionally provided. The transparent base material 1033 provided with the coloring layers and the black layer is positioned and fixed to the substrate 1001. Note that the coloring layers and the black layer are covered with an overcoat layer. In FIG. 6(A), there are a light-emitting layer from which light exits without passing through the coloring layers and a light-emitting layer from which light exits passing through the coloring layers. Since light that does not pass through the coloring layers is white and light that passes through the coloring layers is red, blue, or green, an image can be displayed by pixels of the four colors.

FIG. 6(B) illustrates an example in which the coloring layers (the red coloring layer 1034R, the green coloring layer 1034G, and the blue coloring layer 1034B) are formed between the gate insulating film 1003 and the first interlayer insulating film 1020. Thus, the coloring layers may be provided between the substrate 1001 and the sealing substrate 1031.

Figure 7:
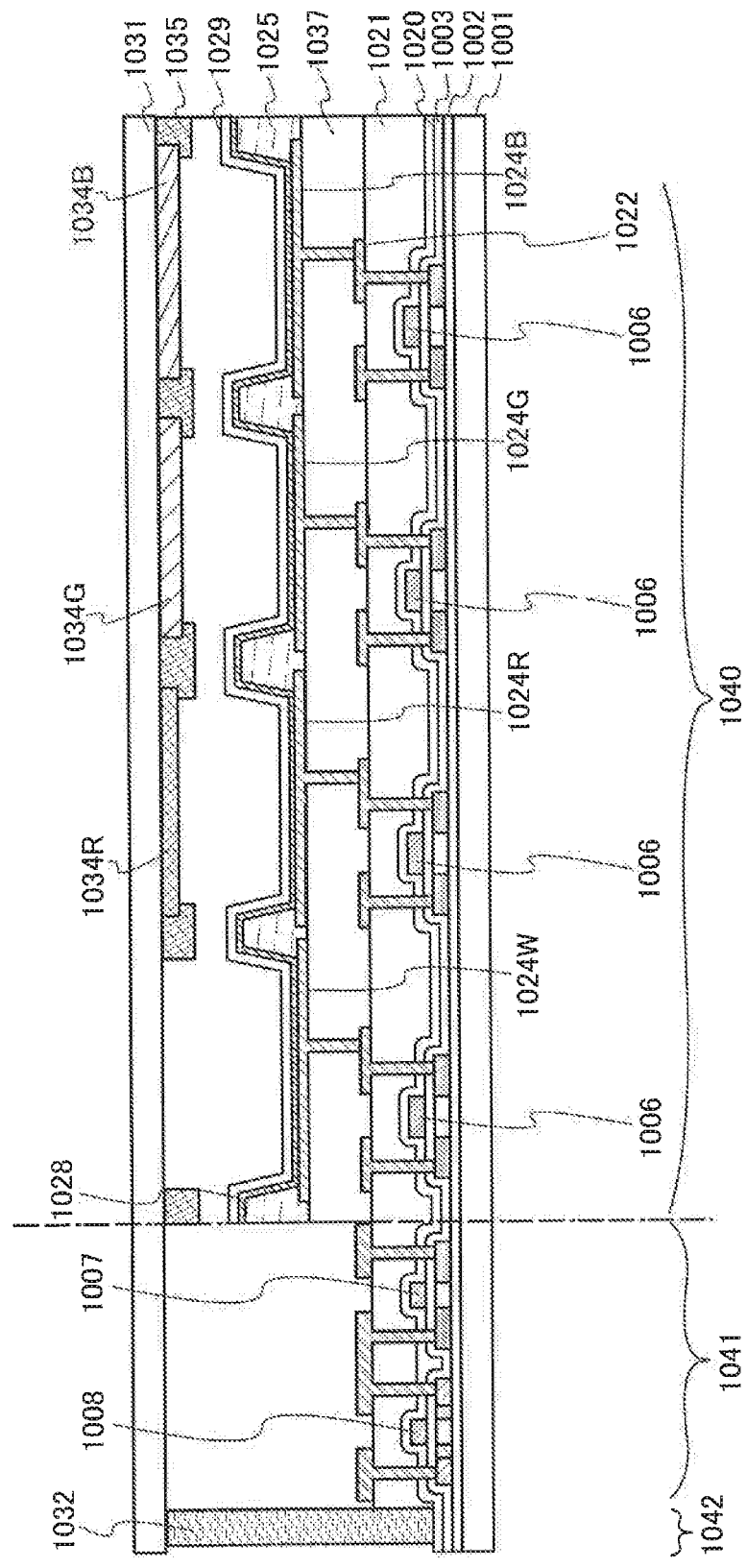
FIG. 7 A conceptual diagram of an active matrix light-emitting device.

The above-described light-emitting device is a light-emitting device having a structure in which light emission is extracted on the substrate 1001 side where the FETs are formed (a bottom emission type), but may be a light-emitting device having a structure in which light emission is extracted on the sealing substrate 1031 side (a top emission type). FIG. 7 illustrates a cross-sectional view of a light-emitting device of a top emission type. In that case, a substrate that does not transmit light can be used as the substrate 1001. The process up to the fabrication of a connection electrode which connects the FET and the anode of the light-emitting element is performed in a manner similar to that of the light-emitting device of a bottom-emission type. Then, a third interlayer insulating film 1037 is formed to cover an electrode 1022. This insulating film may have a planarization function. The third interlayer insulating film 1037 can be formed using a material similar to that of the second interlayer insulating film, or can be formed using other various materials.

The anodes 1024W, 1024R, 1024G, and 1024B of the light-emitting elements are anodes here, but may be cathodes. In the case of the light-emitting device of a top emission type as in FIG. 7, the anodes are preferably reflective electrodes. The structure of the EL layer 1028 is similar to the structure described as the EL layer 103 in FIG. 2(A) or the EL layer (the first light-emitting unit 511, the second light-emitting unit 512, and the charge-generation layer 513) in FIG. 2(C), and is an element structure with which white light emission can be obtained.

In a top emission structure as illustrated in FIG. 7, sealing can be performed with the sealing substrate 1031 on which the coloring layers (the red coloring layer 1034R, the green coloring layer 1034G, and the blue coloring layer 1034B) are provided. The sealing substrate 1031 may be provided with the black layer (black matrix) 1035 which is positioned between pixels. The coloring layers (the red coloring layer 1034R, the green coloring layer 1034G, and the blue coloring layer 1034B) and the black layer may be covered with the overcoat layer. Note that a substrate having a light-transmitting property is used as the sealing substrate 1031.

Although an example in which full color display is performed using four colors of red, green, blue, and white is shown here, there is no particular limitation and full color display using three colors of red, green, and blue or four colors of red, green, blue, and yellow may be performed.

FIG. 8 illustrates a passive matrix light-emitting device which is one embodiment of the present invention. FIG.

Figure 8A:
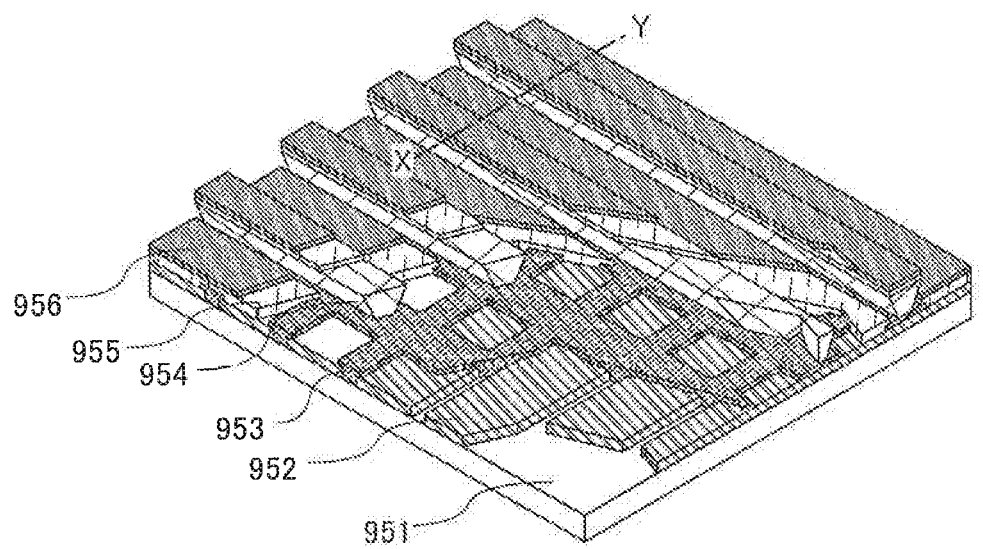
FIGS. 8A-8B Conceptual diagrams of a passive matrix light-emitting device.
Figure 8B:
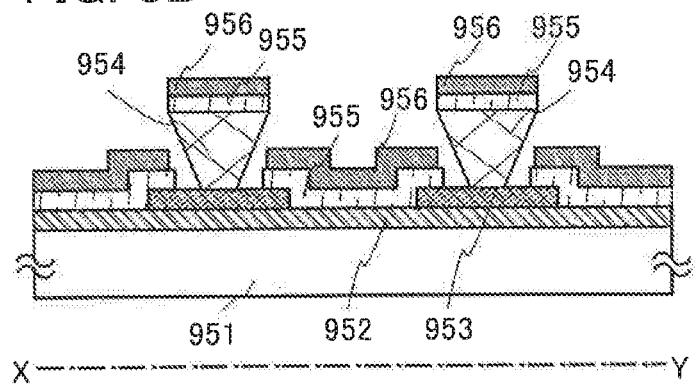

8(A) is a perspective view showing the light-emitting device, and FIG. 8(B) is a cross-sectional view taken along X-Y of FIG. 8(A). In FIG. 8, an EL layer 955 is provided between an electrode 952 and an electrode 956 over a substrate 951. An end portion of the electrode 952 is covered with an insulating layer 953. A partition layer 954 is provided over the insulating layer 953. Sidewalls of the partition layer 954 are aslope such that the distance between one sidewall and the other sidewall is gradually narrowed toward the surface of the substrate. That is, a cross section in a short side direction of the partition layer 954 is a trapezoidal shape, and a lower side (the side facing the same direction as the plane direction of the insulating layer 953, and touching the insulating layer 953) is shorter than an upper side (the side facing the same direction as the plane direction of the insulating layer 953, and not touching the insulating layer 953). By providing the partition layer 954 in this manner, defects of the light-emitting element due to static electricity and the like can be prevented.

Since many minute light-emitting elements arranged in a matrix can be controlled with the FETs formed in the pixel portion, the above-described light-emitting device can be suitably used as a display device for displaying images.

<<Lighting Device>>

Figure 9A:
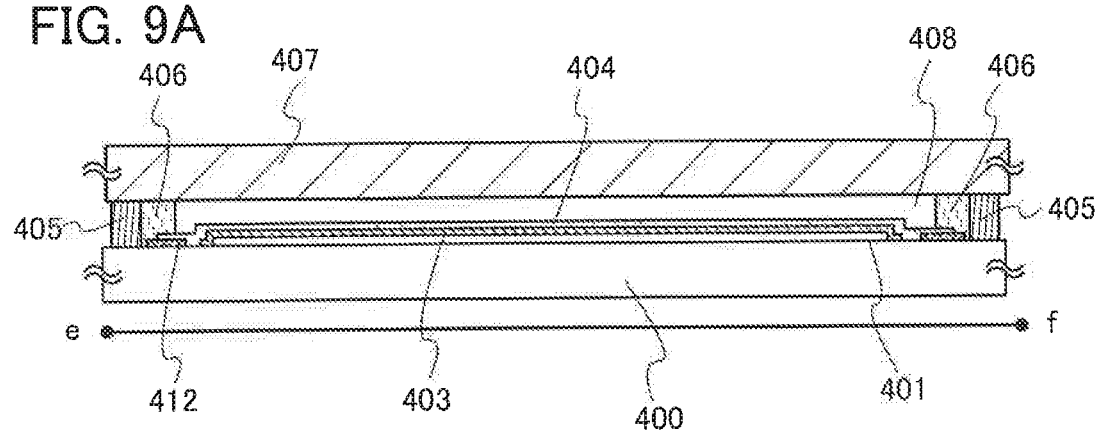
FIGS. 9A-9B Views showing a lighting device.
Figure 9B:
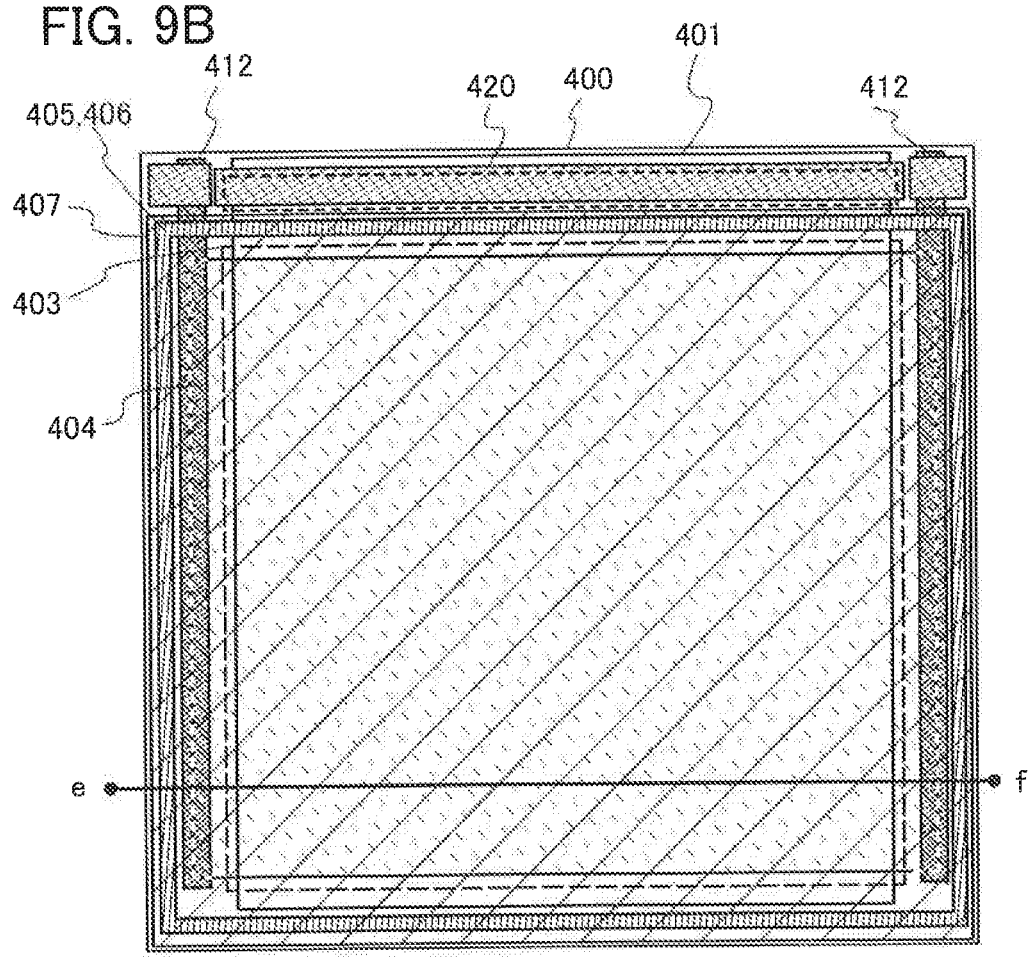

A lighting device of one embodiment of the present invention is described with reference to FIG. 9. FIG. 9(B) is a top view of the lighting device, and FIG. 9(A) is a cross-sectional view taken along e-f in FIG. 9(B).

In the lighting device, an anode 401 is formed over a substrate 400 which is a support having a light-transmitting property. The anode 401 corresponds to the anode 101 in FIGS. 2(A) and 2(B). When light emission is extracted from the anode 401 side, the anode 401 is formed using a material having a light-transmitting property.

A pad 412 for applying voltage to a cathode 404 is formed over the substrate 400.

An EL layer 403 is formed over the anode 401. The EL layer 403 corresponds to the EL layer 103 in FIGS. 2(A) and 2(B) and the like. For these structures, the corresponding description can be referred to.

The cathode 404 is formed to cover the EL layer 403. The cathode 404 corresponds to the cathode 102 in FIG. 2(A). The cathode 404 is formed to contain a material having high reflectivity when light emission is extracted from the anode 401 side. The cathode 404 is connected to the pad 412, whereby voltage is applied.

A light-emitting element is formed with the anode 401, the EL layer 403, and the cathode 404. The light-emitting element is fixed to a sealing substrate 407 with sealing materials 405 and 406 and sealing is performed, whereby the lighting device is completed. It is possible to use only either the sealing material 405 or 406. A desiccant can be mixed into the inner sealing material 406 (not shown in FIG. 9(B)), whereby moisture is adsorbed and reliability is increased.

Part of the pad 412 and the anode 401 can be extended to the outside of the sealing materials 405 and 406 to be an external input terminal. An IC chip 420 mounted with a converter or the like may be provided over the external input terminal.

<<Electronic Device>>

Examples of an electronic device which is one embodiment of the present invention are described. Examples of the electronic device include a television device (also referred to as a television or a television receiver), a monitor of a computer or the like, a digital camera, a digital video camera, a digital photo frame, a mobile phone (also referred to as a mobile telephone or a mobile phone device), a portable game console, a portable information terminal, an audio reproducing device, and a large-sized game machine such as a pachinko machine. Specific examples of these electronic devices are described below.

FIG. 10(A) illustrates an example of a television device. In the television device, a display portion 7103 is incorporated in a housing 7101. Here, a structure in which the housing 7101 is supported by a stand 7105 is shown. Images can be displayed on the display portion 7103, and the display portion 7103 is formed of light-emitting elements arranged in a matrix.

The television device can be operated with an operation switch of the housing 7101 or a separate remote controller 7110. With operation keys 7109 of the remote controller 7110, control of channels and volume can be performed and images displayed on the display portion 7103 can be operated. Furthermore, the remote controller 7110 may be provided with a display portion 7107 displaying data output from the remote controller 7110.

The television device is provided with a receiver, a modem, and the like. With the use of the receiver, a general television broadcast can be received. Moreover, when the display device is connected to a communication network with wires or without wires via the modem, one-way (from a sender to a receiver) or two-way (between a sender and a receiver, between receivers, or the like) information communication can be performed.

FIG. 10(B1) is a computer, which includes a main body 7201, a housing 7202, a display portion 7203, a keyboard 7204, an external connection port 7205, a pointing device 7206, and the like. Note that this computer is fabricated by using light-emitting elements arranged in a matrix in the display portion 7203. The computer in FIG. 10(B1) may have a mode illustrated in FIG. 10(B2). The computer in FIG. 10(B2) is provided with a second display portion 7210 instead of the keyboard 7204 and the pointing device 7206. The second display portion 7210 is a touch panel type, and input can be performed by operation of display for input displayed on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken during storage or carriage.

FIGS. 10(C) and 10(D) illustrate an example of a portable information terminal. The portable information terminal is provided with a display portion 7402 incorporated in a housing 7401, operation buttons 7403, an external connection port 7404, a speaker 7405, a microphone 7406, and the like. Note that the portable information terminal has the display portion 7402 including light-emitting elements arranged in a matrix.

Information can be input to the portable information terminal illustrated in FIGS. 10(C) and 10(D) by touching the display portion 7402 with a finger or the like. In that case, operations such as making a call and creating e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or creating e-mail, a text input mode mainly for inputting text is selected for the display portion 7402 so that text displayed on a screen can be input. In that case, it is preferable to display a keyboard or number buttons on almost the entire screen of the display portion 7402.

When a detection device including a sensor such as a gyroscope sensor or an acceleration sensor sensing inclination is provided inside the mobile phone, the display on the screen of the display portion 7402 can be automatically changed by determining the orientation (vertical or horizontal) of the mobile phone.

The screen modes are switched by touching the display portion 7402 or operating the operation buttons 7403 of the housing 7401. Alternatively, the screen modes can be switched depending on the kinds of images displayed on the display portion 7402. For example, when an image signal for display on the display portion is a signal of moving image data, the screen mode is switched to the display mode; when the signal is text data, the screen mode is switched to the input mode.

In the input mode, when input by touching the display portion 7402 is not performed within a specified period while a signal sensed by an optical sensor in the display portion 7402 is sensed, the screen mode may be controlled so as to be switched from the input mode to the display mode.

The display portion 7402 can also function as an image sensor. For example, an image of a palm print, a fingerprint, or the like is taken by touch on the display portion 7402 with the palm or the finger, whereby personal authentication can be performed. By using a backlight or a sensing light source which emits near-infrared light in the display portion, an image of a finger vein, a palm vein, or the like can be taken.

Note that in the above electronic devices, the structures described in this specification can be combined as appropriate.

A light-emitting element of one embodiment of the present invention is preferably used for the display portion. The light-emitting element can have good emission efficiency. The light-emitting element can have a low drive voltage. Thus, the electronic device including the light-emitting element of one embodiment of the present invention can have low power consumption.

Figure 11:
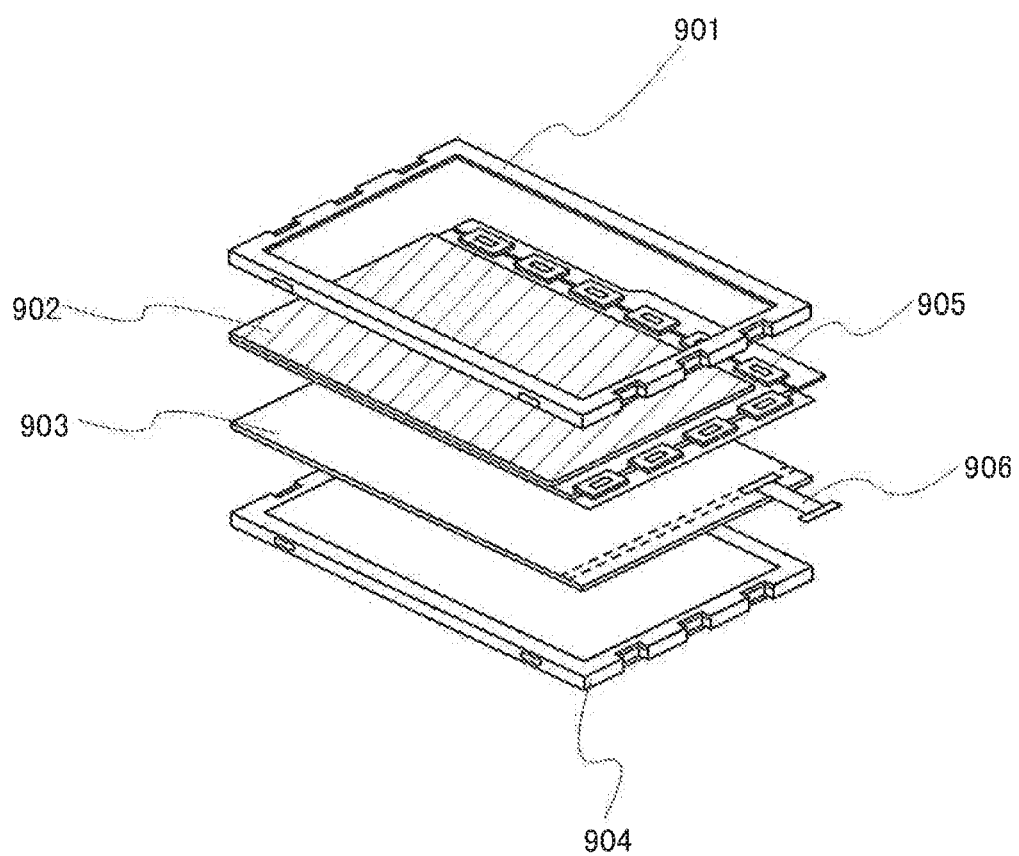
FIG. 11 A view showing a light source.

FIG. 11 illustrates an example of a liquid crystal display device in which the light-emitting element is used for a backlight. The liquid crystal display device illustrated in FIG. 11 includes a housing 901, a liquid crystal layer 902, a backlight unit 903, and a housing 904. The liquid crystal layer 902 is connected to a driver IC 905. The light-emitting element is used for the backlight unit 903, to which current is supplied through a terminal 906.

As the light-emitting element, a light-emitting element of one embodiment of the present invention is preferably used. By using the light-emitting element for the backlight of the liquid crystal display device, the backlight can have reduced power consumption.

Figure 12:
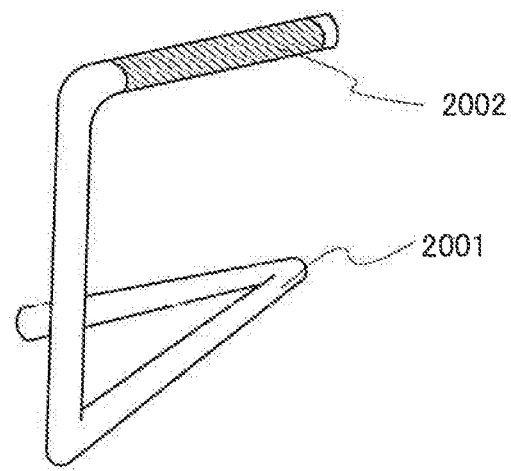
FIG. 12 A view showing a lighting device.

FIG. 12 illustrates an example of a desk lamp of one embodiment of the present invention. The desk lamp illustrated in FIG. 12 includes a housing 2001 and a light source 2002, and a lighting device including a light-emitting element is used as the light source 2002.

Figure 13:
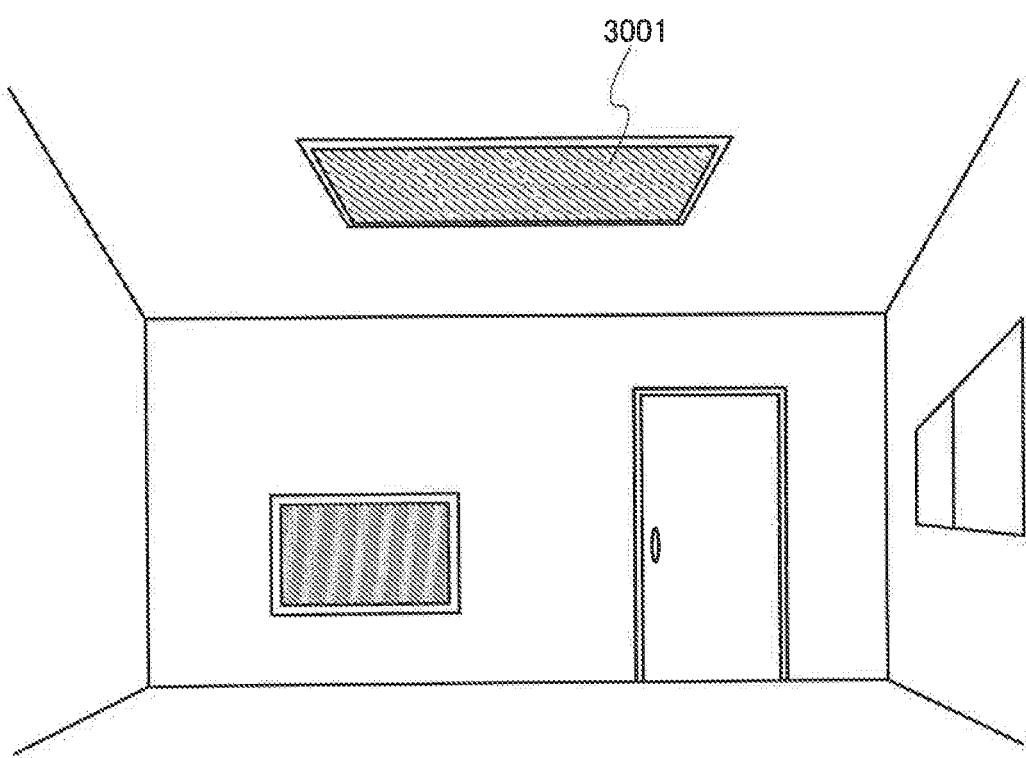
FIG. 13 A view showing a lighting device.

FIG. 13 illustrates an example of an indoor lighting device 3001. The light-emitting element of one embodiment of the present invention is preferably used in the lighting device 3001.

Figure 14:
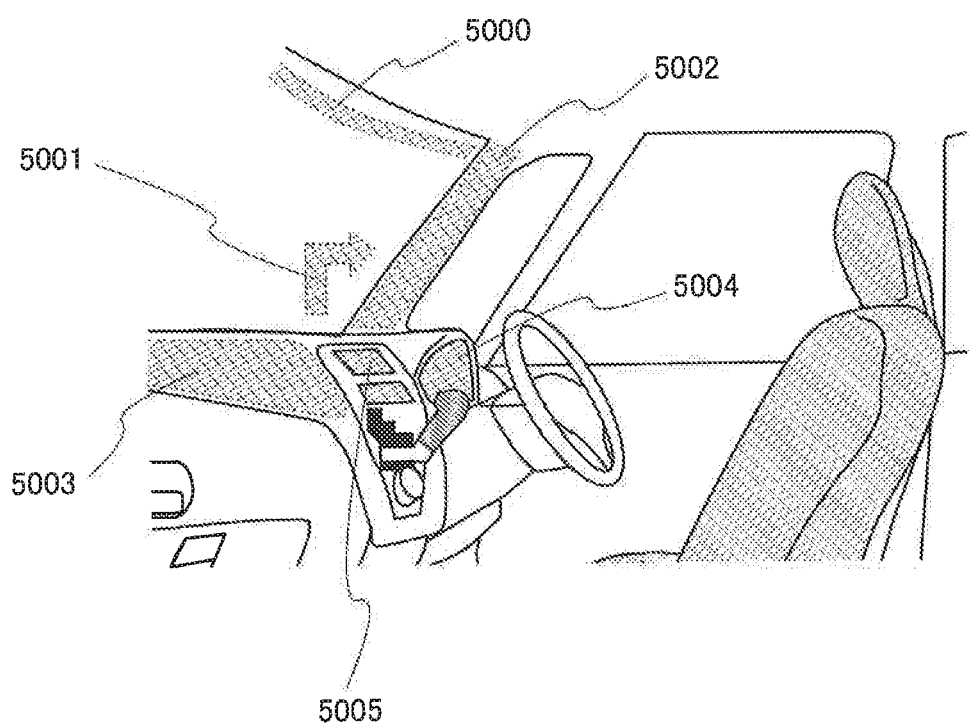
FIG. 14 Views showing in-vehicle display devices and lighting devices.

An automobile which is one embodiment of the present invention is illustrated in FIG. 14. In the automobile, light-emitting elements are mounted on a windshield and a dashboard. A display region 5000 to a display region 5005 are provided by using the light-emitting elements. The light-emitting elements of one embodiment of the present invention are preferably used, in which case this can suppress power consumption of the display region 5000 to the display region 5005, showing suitability for use in an automobile.

The display region 5000 and the display region 5001 are display devices which are provided in the automobile windshield and which use the light-emitting elements. When a first electrode and a second electrode are fabricated with electrodes having light-transmitting properties in these light-emitting elements, what is called a see-through display device, through which the opposite side can be seen, can be obtained. Such see-through display devices can be provided even in the windshield of the automobile, without hindering the vision. In the case where a transistor for driving or the like is provided, a transistor having a light-transmitting property, such as an organic transistor using an organic semiconductor material or a transistor using an oxide semiconductor, is preferably used.

The display region 5002 is a display device which is provided in a pillar portion and which uses the light-emitting element. The display region 5002 can compensate for the view hindered by the pillar by showing an image taken by an imaging means provided in the car body. Similarly, the display region 5003 provided in the dashboard portion can compensate for the view hindered by the car body by showing an image taken by an imaging means provided on the outside of the automobile, which leads to elimination of blind areas and enhancement of safety. Showing an image so as to compensate for the area which cannot be seen enables safety confirmation to be performed more naturally without uneasiness.

The display region 5004 and the display region 5005 can provide a variety of kinds of information such as navigation information, a speedometer, a rotation rate, a mileage, an oil supply amount, a gear position, and air-condition setting. The content or layout of the display can be changed based on a user's preference as appropriate. Such information can also be provided by the display region 5000 to the display region 5003. The display region 5000 to the display region 5005 can also be used as lighting devices.

Figure 15A:
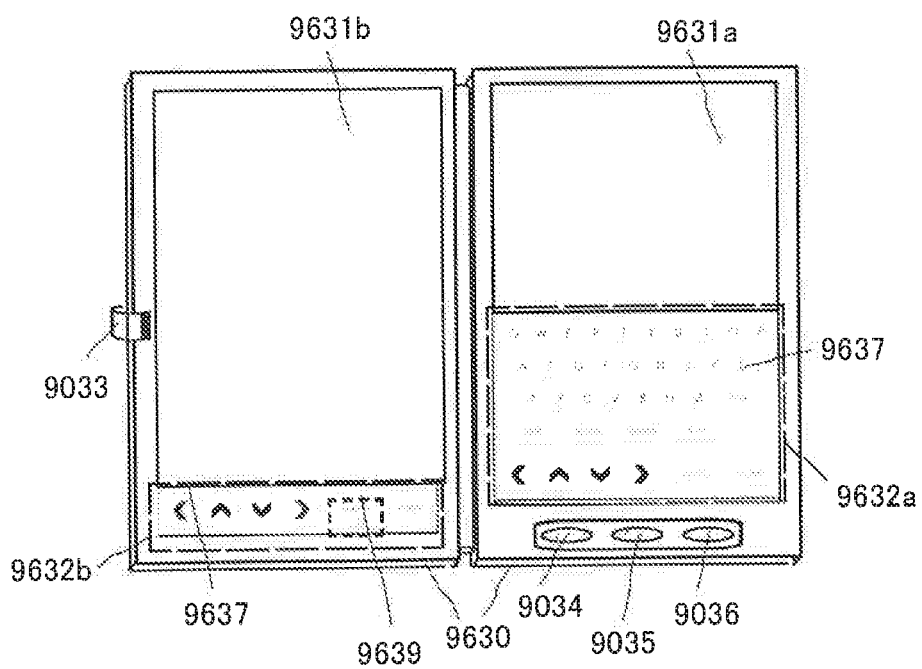
FIGS. 15A-15C Views showing an electronic device.
Figure 15B:
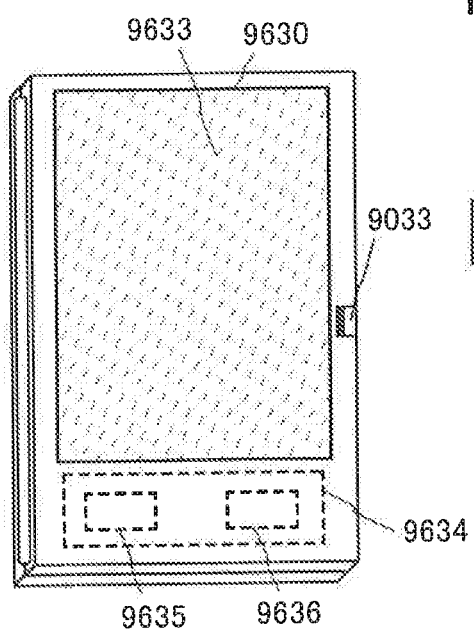

FIG. 15(A) and FIG. 15(B) illustrate an example of a double-foldable tablet terminal. FIG. 15(A) is the opened state and the tablet terminal includes a housing 9630, a display portion 9631*a*, a display portion 9631*b*, a display mode changing switch 9034, a power switch 9035, a power-saving-mode changing switch 9036, a fastener 9033, and an operation switch 9038. The tablet terminal is fabricated by using a light-emitting device which includes the light-emitting element of one embodiment of the present invention for one or both of the display portion 9631*a* and the display portion 9631*b*.

Part of the display portion 9631*a* can be a touch panel region 9632*a* and data can be input when a displayed operation key 9637 is touched. Note that a structure in which half of the area of the display portion 9631*a* has only a display function and the other half of the area has a touch panel function is illustrated as an example; however, the structure is not limited to this. The whole area in the display portion 9631*a* may have a touch panel function. For example, the display portion 9631*a* can display keyboard buttons in the whole area to be a touch panel, and the display portion 9631*b* can be used as a display screen.

In the display portion 9631*b*, as in the display portion 9631*a*, part of the display portion 9631*b* can be a touch panel region 9632*b*. When a finger, a stylus, or the like touches the place where a keyboard display switching button 9639 is displayed in the touch panel, keyboard buttons can be displayed on the display portion 9631*b*.

Touch input can also be performed on the touch panel region 9632*a* and the touch panel region 9632*b* at the same time.

The display mode changing switch 9034 can switch the display orientation between vertical display, horizontal display, and the like, and between monochrome display and color display, for example. With the power-saving-mode changing switch 9036, the luminance of display can be optimized depending on the amount of external light at the time when the tablet terminal is in use, which is detected with an optical sensor incorporated in the tablet terminal. The tablet terminal may include another detection device such as a sensor detecting inclination, e.g., a gyroscope or an acceleration sensor, in addition to the optical sensor.

Although an example in which the display areas of the display portion 9631*a* and the display portion 9631*b* are the same is illustrated in FIG. 15(A), without limitation thereon, the size of one of the display areas may be different from the size of the other, and the display quality may also be different. For example, one may be a display panel that can display higher-definition images than the other.

FIG. 15(B) illustrates an example in the closed state in which the tablet terminal in this embodiment includes the housing 9630, a solar cell 9633, a charge and discharge control circuit 9634, a battery 9635, and a DCDC converter 9636. In FIG. 15(B), a structure including the battery 9635 and the DCDC converter 9636 is illustrated as an example of the charge and discharge control circuit 9634.

Since the tablet terminal can be folded in half, the housing 9630 can be in the closed state when the tablet terminal is not in use. Thus, the display portion 9631*a* and the display portion 9631*b* can be protected, whereby a tablet terminal with excellent endurance and excellent reliability for long-term use can be provided.

The tablet terminal illustrated in FIG. 15(A) and FIG. 15(B) can also have a function of displaying various kinds of data (e.g., a still image, a moving image, and a text image), a function of displaying a calendar, a date, the time, or the like on the display portion, a touch-input function of operating or editing data displayed on the display portion by touch input, a function of controlling processing by various kinds of software (programs), and the like.

The solar cell 9633, which is attached on the surface of the tablet terminal, can supply electric power to the touch panel, the display portion, a video signal processing portion, and the like. Note that the solar cell 9633 is preferably provided on one surface or two surfaces of the housing 9630 because the battery 9635 can be charged efficiently.

Figure 15C:
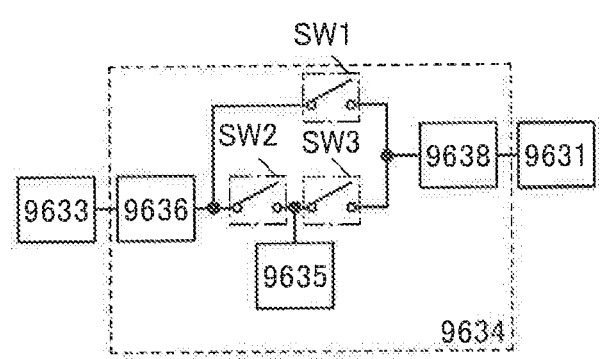

The structure and operation of the charge and discharge control circuit 9634 illustrated in FIG. 15(B) are described with reference to a block diagram illustrated in FIG. 15(C). The solar cell 9633, the battery 9635, the DCDC converter 9636, a converter 9638, switches SW1 to SW3, and the display portion 9631 are illustrated in FIG. 15(C), and the battery 9635, the DCDC converter 9636, the converter 9638, and the switches SW1 to SW3 correspond to the charge and discharge control circuit 9634 illustrated in FIG. 11(B).

First, an example of the operation in the case where electric power is generated by the solar cell 9633 with external light is described. The voltage of electric power generated by the solar cell is raised or lowered by the DCDC converter 9636 so as to be a voltage for charging the battery 9635. Then, when the electric power stored by the solar cell 9633 is used for the operation of the display portion 9631, the switch SW1 is turned on and the voltage is raised or lowered by the converter 9638 so as to be a voltage needed for the display portion 9631. When display on the display portion 9631 is not performed, SW1 may be turned off and SW2 may be turned on so that the battery 9635 is charged.

The solar cell 9633 is described as an example of a power generation means; however, the power generation means is not particularly limited, and the battery 9635 may be charged with another power generation means such as a piezoelectric element or a thermoelectric conversion element (Peltier element). A non-contact power transmission module that transmits and receives electric power wirelessly (without contact) to charge the battery or a combination with other charging means may be employed, and the power generation means is not necessarily provided.

One embodiment of the present invention is not limited to the tablet terminal having the shape illustrated in FIG. 15 as long as the above display portion 9631 is included.

Figure 16A:
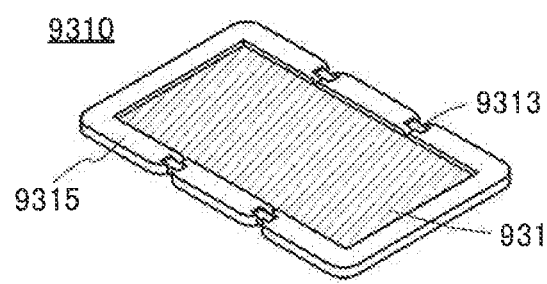
FIGS. 16A-16C Views showing an electronic device.
Figure 16B:
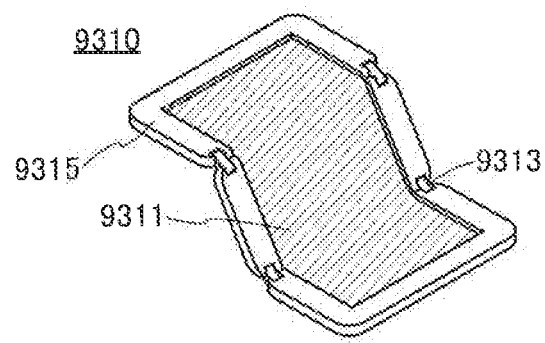
Figure 16C:
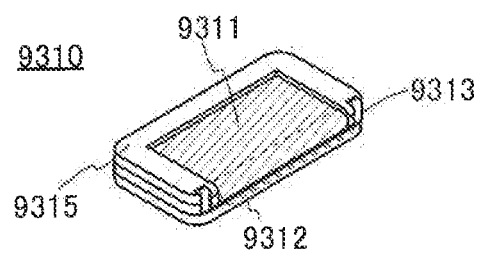

FIGS. 16(A) to 16(C) illustrate a foldable portable information terminal 9310. FIG. 16(A) illustrates the portable information terminal 9310 in an opened state. FIG. 16(B) illustrates the portable information terminal 9310 in a state in the middle of change from one of an opened state and a folded state to the other. FIG. 16(C) illustrates the portable information terminal 9310 in a folded state. The portable information terminal 9310 has excellent portability when in a folded state. The portable information terminal 9310 has excellent browsability when in an opened state because of a seamless large display region.

A display panel 9311 is supported by three housings 9315 joined together by hinges 9313. The display panel 9311 may be a touch panel (an input/output device) including a touch sensor (an input device). By bending the display panel 9311 at a portion between two housings 9315 with the use of the hinges 9313, the portable information terminal 9310 can be reversibly changed in shape from an opened state to a folded state. A light-emitting device of one embodiment of the present invention can be used for the display panel 9311. A display region 9312 in the display panel 9311 is a display region that is positioned at a side surface of the portable information terminal 9310 in a folded state. In the display region 9312, information icons, file shortcuts of frequently used applications or programs, and the like can be displayed, and confirmation of information and start of application can be smoothly performed.

Example 1

<<Synthesis Example 1>>

In this example, a method of synthesizing a light-emitting element material of one embodiment of the present invention is described in detail. In this example, a synthesis example of [2-{(9H-carbazol-9-yl-2-pyridinyl-κN}phenyl-κC]bis[2-(2-pyridinyl-κN)phenyl-κC]iridium(III) (abbreviation: [Ir(ppy)$_2$(Czppy)]), which is an organometallic complex including iridium as a central metal and a ligand including a first skeleton having a hole-transport property and a second skeleton having a light-emitting property, is specifically exemplified. A structure of [Ir(ppy)$_2$(Czppy)] is shown below.

[Chemical 8]

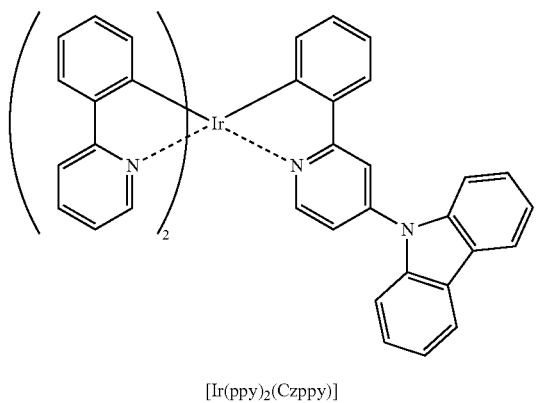

(100)

[Ir(ppy)$_2$(Czppy)]

In the above-described [Ir(ppy)$_2$(Czppy)], the carbazole skeleton corresponds to the first skeleton having a hole-transport property and the 2-pyridylphenyl skeleton corresponds to the second skeleton having a light-emitting property.

<Step 1: Synthesis of 4-chloro-2-phenylpyridine>

First, 12 g of 2,4-dichloropyridine, 9.9 g of a phenylboronic acid, 34 g of potassium carbonate, 400 mL of DME, and 240 mL of water were put into a three-neck flask equipped with a reflux pipe, and the atmosphere in the flask was replaced with nitrogen. Furthermore, 0.94 g of tetrakis (triphenylphosphine)palladium(0) was added, followed by irradiation with microwaves (2.45 GHz, 400 W) for 2 hours. After the reaction, extraction was performed with ethyl acetate. After that, purification was performed by silica gel column chromatography using dichloromethane as a developing solvent, whereby 12 g of the object (a yield of 80%, a yellow oily substance) was obtained. The synthesis scheme of Step 1 is shown in (a-1) below.

[Chemical 9]

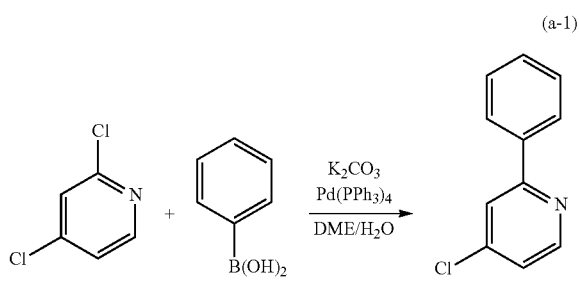

(a-1)

<Step 2: Synthesis of 9-(2-phenylpyridin-4-yl)-9H-carbazole (Abbreviation: HCzppy)>

Next, 12 g of 4-chloro-2-phenylpyridine obtained in Step 1 above, 13 g of 9H-carbazole, and 11 g of sodium-tert-butoxide (abbreviation: tert-BuONa) were put into a three-neck flask equipped with a reflux pipe, and the atmosphere in the flask was replaced with nitrogen. Furthermore, 280 mL of toluene, 1.3 g of tri-tert-butylphosphine, and 3.0 g of tris(dibenzylideneacetone)dipalladium(0) (abbreviation: Pd$_2$(dba)$_3$) were added, and heating and stirring were performed for 5 hours at 120° C. The obtained reactant was filtered and the solvent of the filtrate was distilled off, followed by purification by silica gel column chromatography using dichloromethane:hexane=1:1 as a developing solvent, whereby 11 g of the object (a yield of 53%, a yellow oily substance) was obtained. The synthesis scheme of Step 2 is shown in (a-2) below.

[Chemical 10]

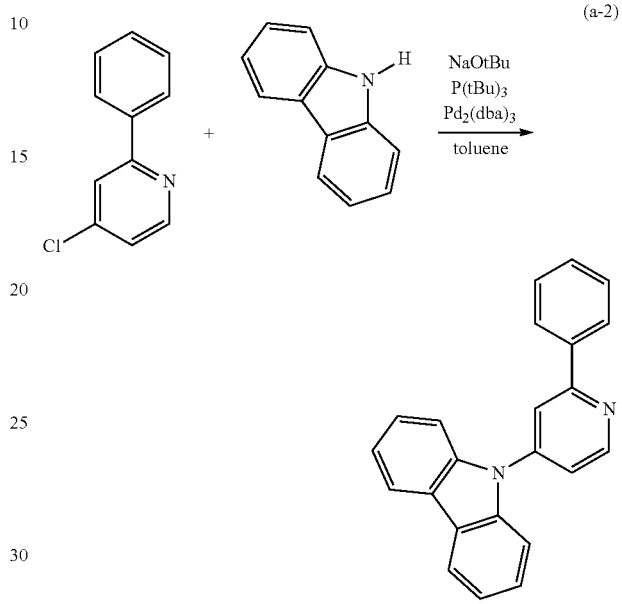

(a-2)

<Step 3: Synthesis of [Ir(ppy)$_2$(Czppy)]>

Next, 2.8 g of di-μ-chloro-tetrakis{2-[2-pyridinyl-κN]phenyl-κC}diiridium(III) (abbreviation: [Ir(ppy)$_2$Cl]$_2$) and 200 mL of dichloromethane were put into a three-neck flask, and the atmosphere in the flask was replaced with nitrogen. A mixed solution of 2.0 g of silver triflate and 40 mL of methanol was dripped thereinto, followed by stirring at room temperature for 20 hours. After the obtained mixture was filtered through Celite, concentration was performed, whereby a solid was obtained.

To this solid, 2.2 g of HCzppy obtained in Step 2 above, 50 mL of 2-ethoxyethanol (abbreviation: 2-EE), and 50 mL of N,N-dimethylformamide (abbreviation: DMF) were added, and reflux was performed in a nitrogen atmosphere for 17 hours. The obtained mixture was concentrated, followed by purification by silica gel column chromatography using dichloromethane:hexane=1:1 as a developing solvent; the proportion of hexane was gradually decreased and only dichloromethane was used as a developing solvent at the end. After that, further purification was performed by silica gel column chromatography using chloroform:hexane=3:2 as a developing solvent. The obtained solution was concentrated and recrystallization was performed from a mixed solvent of dichloromethane and methanol, whereby the organometallic complex [Ir(ppy)$_2$(Czppy)], which is one embodiment of the present invention, was obtained as an orange solid (yield: 19%).

By a train sublimation method, 0.52 g of the obtained orange solid was sublimated. The solid was heated under the sublimation purification conditions where the pressure was 2.6 Pa and the argon flow rate was 5 mL/min at 300° C. After the sublimation purification, an orange solid which was the object was obtained in a yield of 74%. The synthesis scheme of Step 3 is shown in (a-3) below.

[Chemical 11]

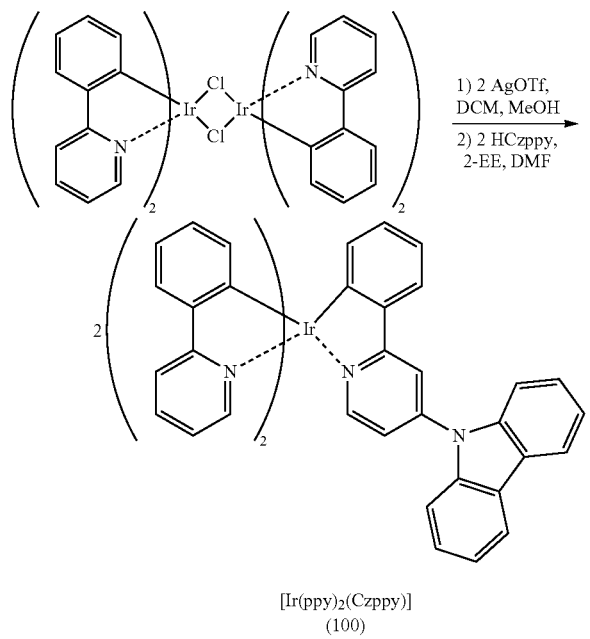

[Ir(ppy)₂(Czppy)]
(100)

Figure 17:
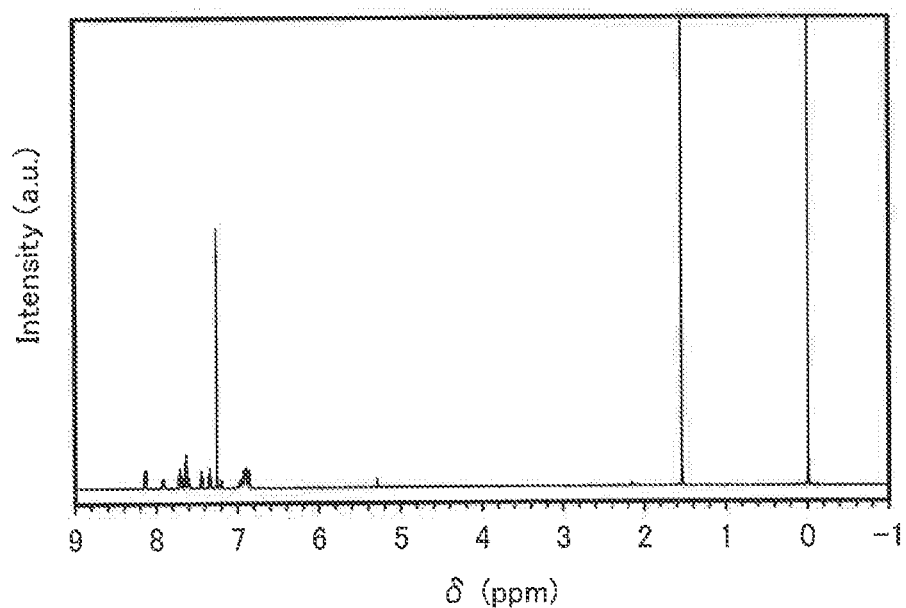
FIG. 17 A $^1$H-NMR spectrum of [Ir(ppy)$_2$(Czppy)]

Analysis results by nuclear magnetic resonance ($^1$H-NMR) spectroscopy of the orange solid obtained in Step 3 above are shown below. FIG. 17 shows an $^1$H-NMR chart. These results reveal that the organometallic complex [Ir(ppy)₂(Czppy)], which is one embodiment of the present invention represented by Structural Formula (100) above, was obtained in this synthesis example.

$^1$H-NMR. δ (CDCl₃): 6.85-6.98 (m, 11H), 7.20 (dd, 1H), 7.32-7.35 (t, 2H), 7.42-7.45 (t, 2H), 7.59-7.65 (m, 6H), 7.67 (d, 1H), 7.70-7.72 (t, 3H), 7.92 (dd, 2H), 8.13-8.16 (t, 3H).

Next, an ultraviolet-visible absorption spectrum (hereinafter, simply referred to as an "absorption spectrum") and an emission spectrum of a deoxidized dichloromethane solution of [Ir(ppy)₂(Czppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which an absolute PL quantum yield measurement system (C11347-01 manufactured by Hamamatsu Photonics K.K.) was used and the deoxidized dichloromethane solution (0.010 mmol/L) was put and sealed in a quartz cell under a nitrogen atmosphere in a glove box (LABstar M13 (1250/780) manufactured by Bright Co., Ltd.).

Figure 18:
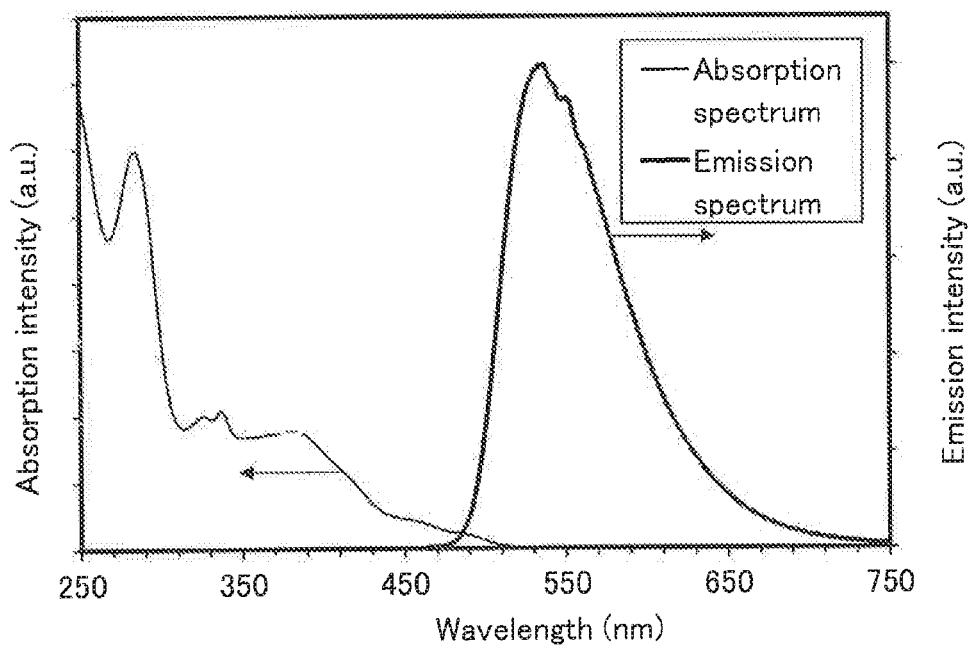
FIG. 18 An absorption spectrum and an emission spectrum of [Ir(ppy)$_2$(Czppy)]

FIG. 18 shows measurement results of the obtained absorption spectrum and emission spectrum. The horizontal axis represents wavelength and the vertical axes represent absorption intensity and emission intensity. In FIG. 18, two solid lines are shown; the thin solid line represents the absorption spectrum, and the thick solid line represents the emission spectrum. The absorption spectrum shown in FIG. 18 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 18, the organometallic complex [Ir(ppy)₂(Czppy)], which is one embodiment of the present invention, has an emission peak at 537 nm, and yellow-green light emission was observed from the dichloromethane solution.

Example 2

<<Synthesis Example 2>>

In this example, a method of synthesizing a light-emitting element material of one embodiment of the present invention is described in detail. In this example, a synthesis example of an organometallic complex bis[2-{4-(9H-carbazol-9-yl)-2-pyridinyl-κN}phenyl-κC][2-(2-pyridinyl-κN)phenyl-κC]iridium(III) (abbreviation: [Ir(ppy)(Czppy)₂]), in which iridium is a central metal and which includes a ligand including a first skeleton having a hole-transport property and a second skeleton having a light-emitting property, is specifically exemplified. A structure of [Ir(ppy)(Czppy)₂] is shown below.

[Chemical 12]

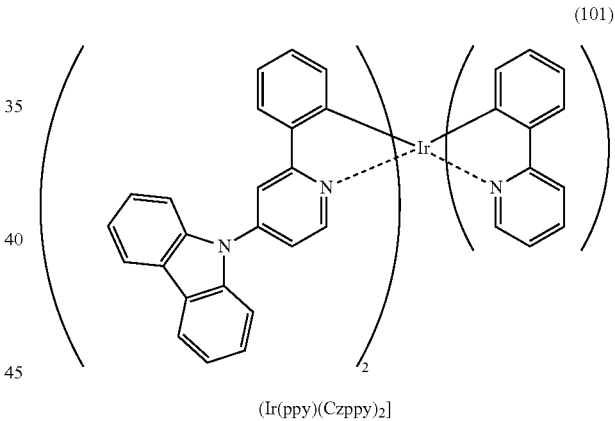

(Ir(ppy)(Czppy)₂]

In the above-described [Ir(ppy)(Czppy)₂], the carbazole skeleton corresponds to the first skeleton having a hole-transport property and the 2-pyridylphenyl skeleton corresponds to the second skeleton having a light-emitting property.

<Step 1: Synthesis of di-μ-chloro-tetrakis[4-(9H-carbazol-9-yl)-2-pyridinyl-κN)phenyl-κC]diiridium(III) (abbreviation: [Ir(Czppy)₂Cl]₂)>

First, 6.1 g of HCzppy, 2.9 g of iridium(III) chloride hydrate, 90 mL of 2-ethoxyethanol, and 30 mL of water were put into a round-bottom flask equipped with a reflux pipe and microwave irradiation (2.45 GHz, 200 W) was performed for 2 hours while argon bubbling was performed. The obtained mixture was filtered, followed by washing with methanol to give 6.3 g of the object (a yield of 76%, a yellow solid). The synthesis scheme of Step 1 is shown in (b-1) below.

[Chemical 13]

(b-1)

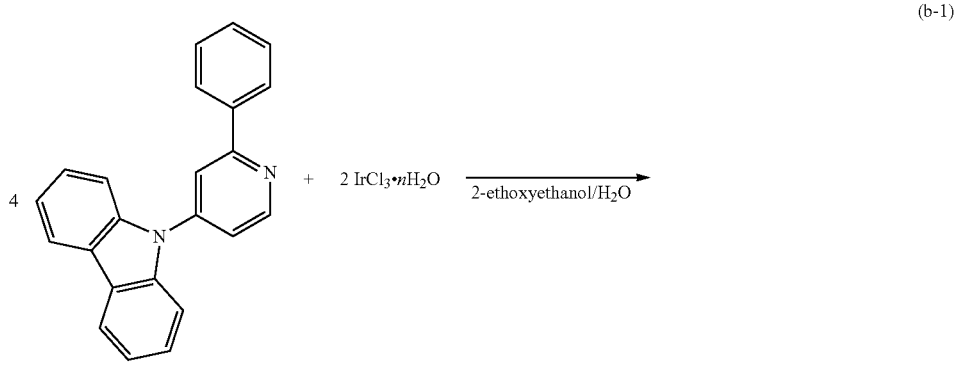

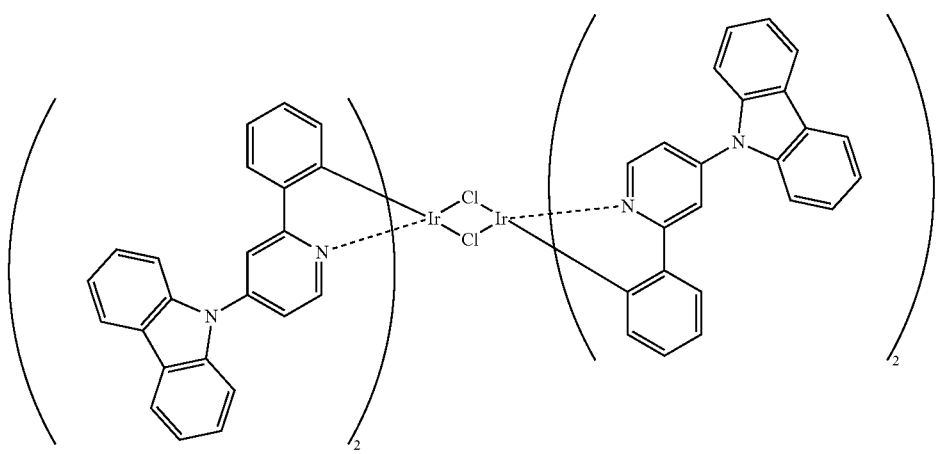

<Step 2: Synthesis of [Ir(ppy)(Czppy)₂]>

Next, 4.3 g of [Ir(Czppy)₂Cl]₂ obtained in Step 1 above and 250 mL of dichloromethane (abbreviation: DCM) were put into a three-neck flask, and the atmosphere in the flask was replaced with nitrogen. A mixed solution of 1.9 g of silver triflate and 40 mL of isopropanol was dripped thereinto, followed by stirring at room temperature for 20 hours. After the obtained mixture was filtered through Celite, concentration was performed, whereby a solid was obtained. To this solid, 1.6 g of 2-phenylpyridine (abbreviation: Hppy), 50 mL of 2-ethoxyethanol, and 50 mL of N,N-dimethylformamide (abbreviation: DMF) were added, and reflux was performed in a nitrogen atmosphere for 17 hours.

The obtained mixture was concentrated, followed by purification by silica gel column chromatography using dichloromethane:hexane=1:1 as a developing solvent. Furthermore, purification was performed by silica gel column chromatography using chloroform:hexane=3:2 as a developing solvent. The obtained solution was concentrated and recrystallization was performed from dichloromethane and methanol, whereby [Ir(ppy)(Czppy)₂] was obtained as an orange solid (yield: 7%). The synthesis scheme of Step 2 is shown in (b-2) below.

[Chemical 14]

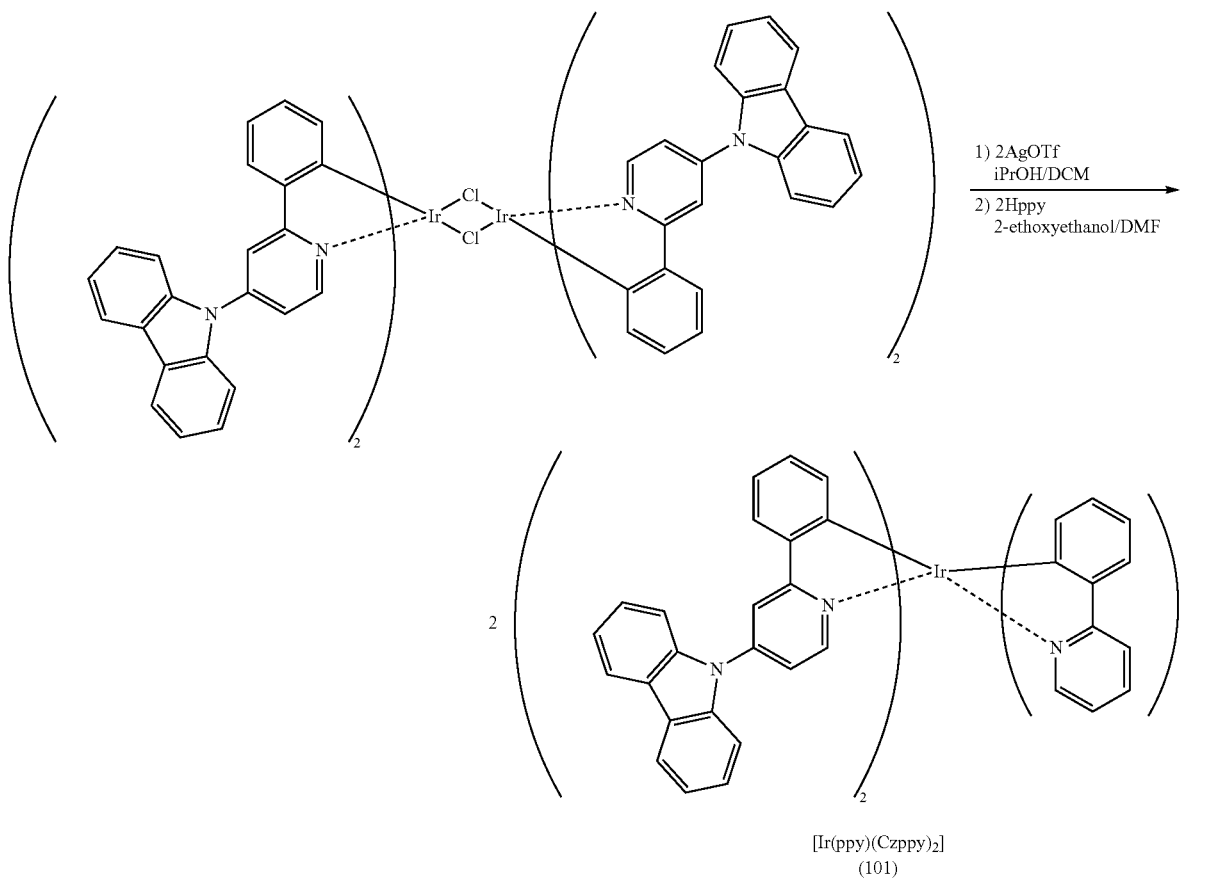

[Ir(ppy)(Czppy)₂]
(101)

Figure 19:
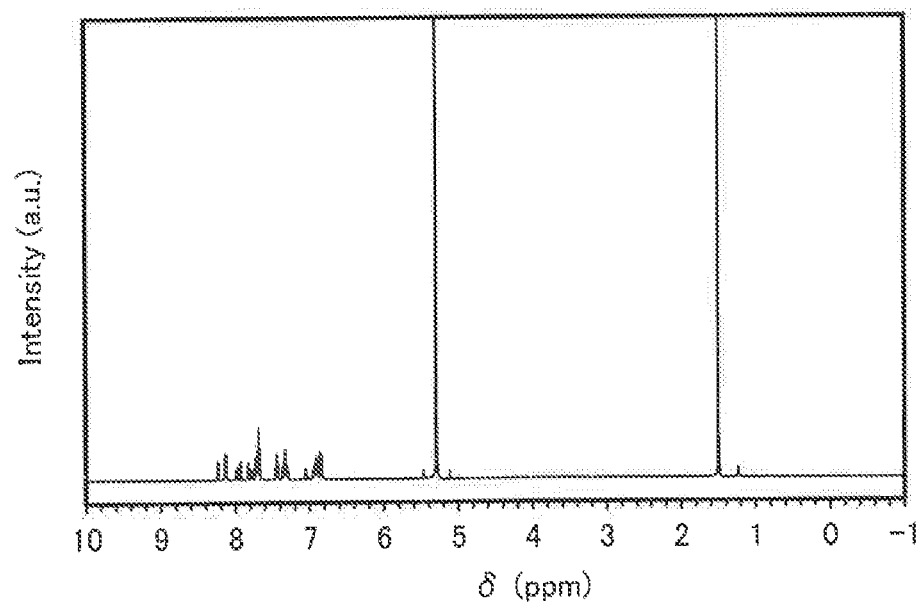
FIG. 19 A $^1$H-NMR spectrum of [Ir(ppy)(Czppy)$_2$]

Analysis results by nuclear magnetic resonance (¹H-NMR) spectroscopy of the orange solid obtained in Step 2 above are shown below. FIG. 19 shows an ¹H-NMR chart. These results revealed that the organometallic complex [Ir(ppy)(Czppy)₂], which is one embodiment of the present invention represented by Structural Formula (101) above, was obtained in Synthesis example 2.

¹H-NMR δ (CD$_2$Cl$_2$): 6.82-6.96 (m, 9H), 7.04-7.07 (t, 1H), 7.29-7.37 (m, 6H), 7.42-7.46 (m, 4H), 7.67-7.74 (m, 8H), 7.80 (d, 1H), 7.83 (d, 1H), 7.93 (d, 1H), 7.98 (d, 1H), 8.12-8.15 (ms, 4H), 8.23-8.25 (ms, 2H).

Next, an ultraviolet-visible absorption spectrum (hereinafter, simply referred to as an "absorption spectrum") and an emission spectrum of a deoxidized dichloromethane solution of [Ir(ppy)(Czppy)₂] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which an absolute PL quantum yield measurement system (C11347-01 manufactured by Hamamatsu Photonics K.K.) was used and the deoxidized dichloromethane solution (0.010 mmol/L) was put and sealed in a quartz cell under a nitrogen atmosphere in a glove box (LABstar M13 (1250/780) manufactured by Bright Co., Ltd.).

Figure 20:
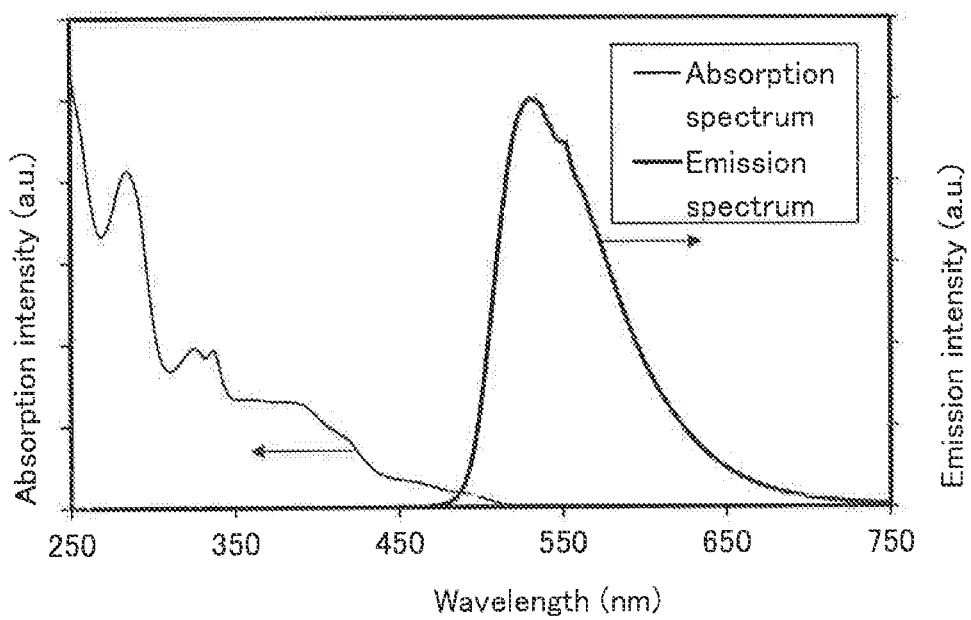
FIG. 20 An absorption spectrum and an emission spectrum of [Ir(ppy)(Czppy)$_2$]

FIG. 20 shows measurement results of the obtained absorption spectrum and emission spectrum. The horizontal axis represents wavelength and the vertical axes represent absorption intensity and emission intensity. In FIG. 20, two solid lines are shown; the thin solid line represents the absorption spectrum, and the thick solid line represents the emission spectrum. The absorption spectrum shown in FIG. 20 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 20, the organometallic complex [Ir(ppy)(Czppy)₂], which is one embodiment of the present invention, has an emission peak at 530 nm, and yellow-green light emission was observed from the dichloromethane solution.

Example 3

Figure 21:
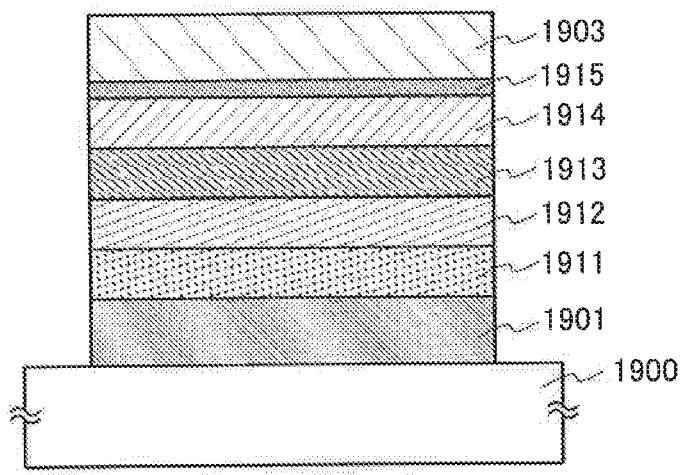
FIG. 21 A schematic view of an element structure of a light-emitting element.
Figure 22:
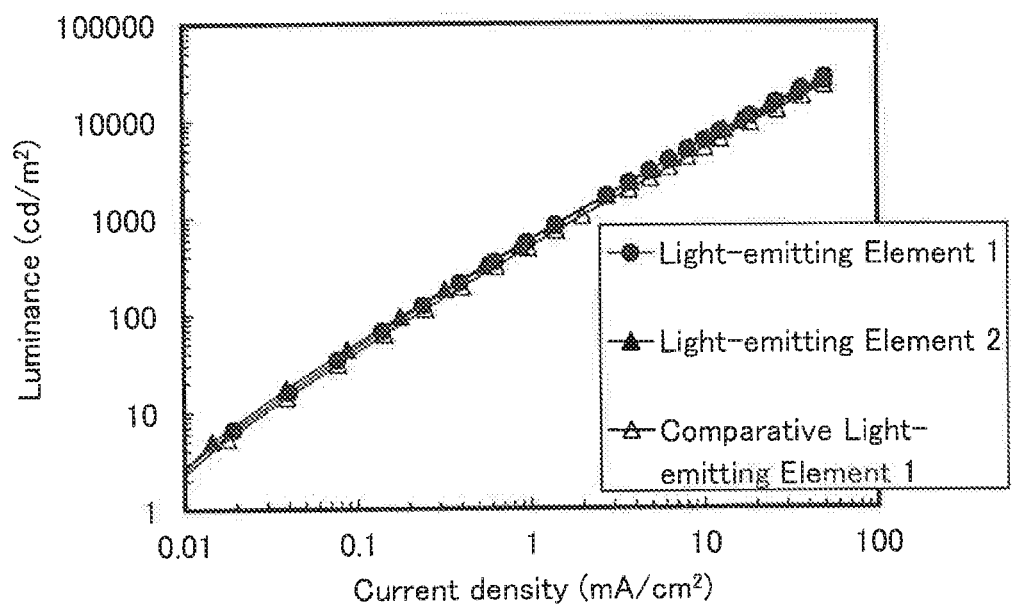
FIG. 22 Luminance-current density characteristics of a light-emitting element 1, a light-emitting element 2, and a comparative light-emitting element 1.
Figure 23:
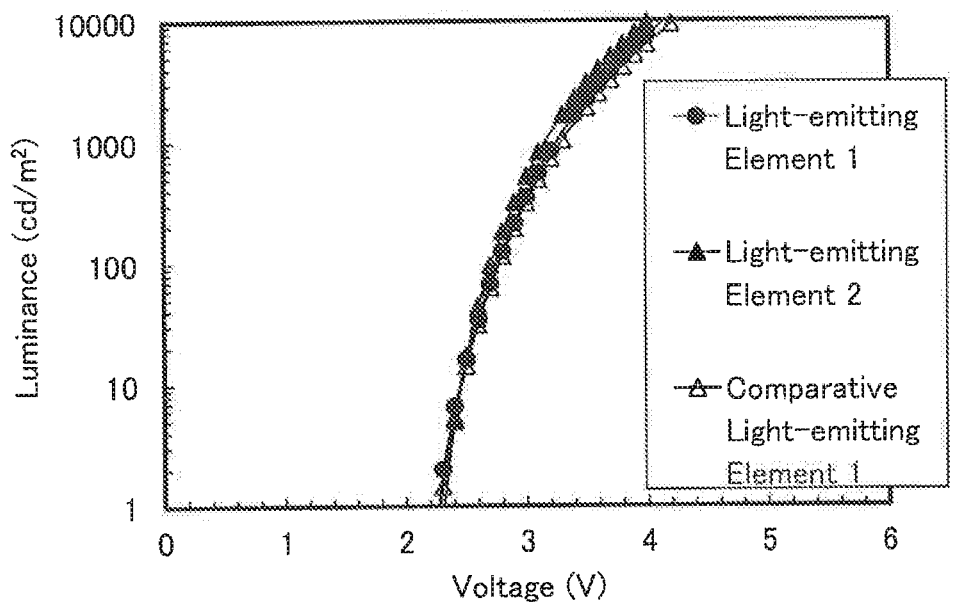
FIG. 23 Luminance-voltage characteristics of the light-emitting element 1, the light-emitting element 2, and the comparative light-emitting element 1.
Figure 24:
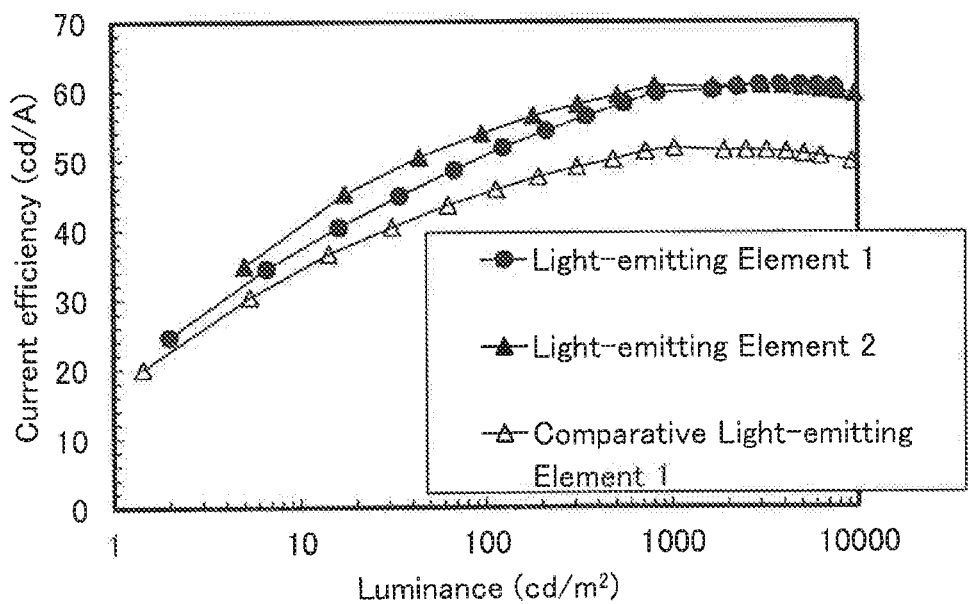
FIG. 24 Current efficiency-luminance characteristics of the light-emitting element 1, the light-emitting element 2, and the comparative light-emitting element 1.
Figure 25:
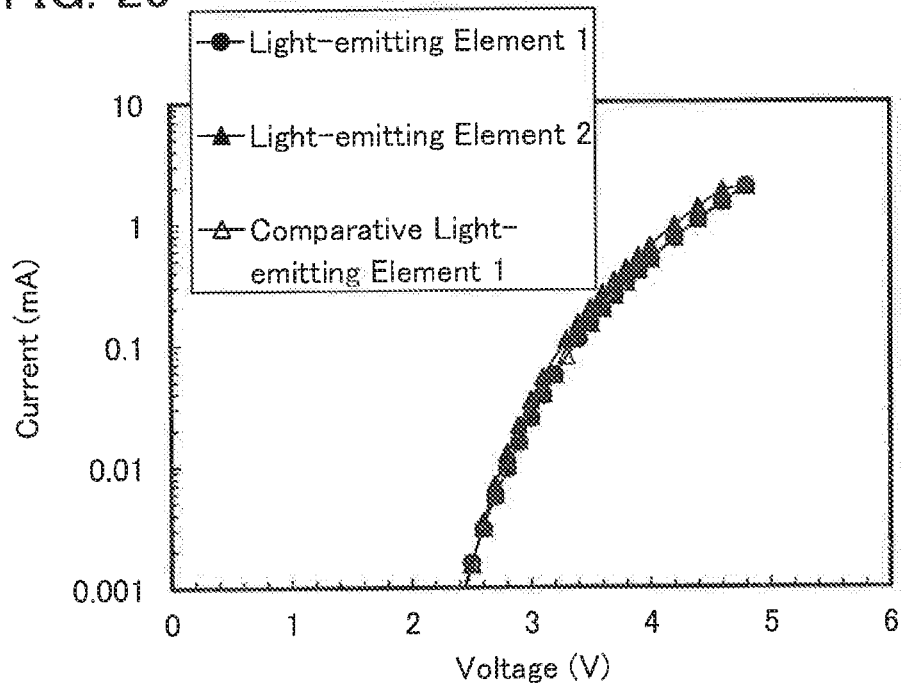
FIG. 25 Current-voltage characteristics of the light-emitting element 1, the light-emitting element 2, and the comparative light-emitting element 1.

In this example, element structures, fabrication methods, and properties of a light-emitting element 1 in which [2-{(9H-carbazol-9-yl)-2-pyridinyl-κN}phenyl-κC]bis[2-(2-pyridinyl-κN)phenyl-κC]iridium(III) (abbreviation: [Ir(ppy)₂ (Czppy)]) (Structural Formula (100)) described in Example 1 is used as a guest material of a light-emitting layer and a light-emitting element 2 in which [Ir(ppy)(Czppy)₂] (Structural Formula (101)) described in Example 2 is used as a guest material of a light-emitting layer as light-emitting elements which are embodiments of the present invention and a comparative light-emitting element 1 in which tris(2-phenylpyridinato-N,C²')iridium(III) (abbreviation: [Ir(ppy)₃]) is used as a guest material of a light-emitting layer are described. Note that FIG. 21 illustrates an element structure of the light-emitting elements used in this example, and Table 1 shows specific structures. Chemical formulae of materials used in this example are shown below.

TABLE 1

| | First electrode | Hole-injection layer | Hole-transport layer | Light-emitting layer | Electron-transpor layer | Electron-injection layer | Second electrode |
|---|---|---|---|---|---|---|---|
| Light-emitting element 1 | ITO (70 nm) | DBT3P-II:MoOx (4:2, 60 nm) | PCCP (20 nm) | * | mPCCzPTzn-02 (15 nm) | Bphen (10 nm) | LiF (1 nm) | Al (200 nm) |
| Light-emitting element 2 | ITO (70 nm) | DBT3P-II:MoOx (4:2, 60 nm) | PCCP (20 nm) | ** | mPCCzPTzn-02 (15 nm) | Bphen (10 nm) | LiF (1 nm) | Al (200 nm) |
| Comparative light-emitting element 1 | ITO (70 nm) | DBT3P-II:MoOx (4:2, 60 nm) | PCCP (20 nm) | *** | mPCCzPTzn-02 (15 nm) | Bphen (10 nm) | LiF (1 nm) | Al (200 nm) |

\* mPCCzPTzn-02:PCCP:[Ir(ppy)$_2$(Czppy)] (0.5:0.5:0.10 (20 nm)\0.8:0.2:0.10 (20 nm))
\*\* mPCCzPTzn-02:PCCP:[Ir(ppy)(Czppy)$_2$] (0.5:0.5:0.10 (20 nm)\0.8:0.2:0.10 (20 nm))
\*\*\* mPCCzPTzn-02:PCCP:[Ir(ppy)$_3$] (0.5:0.5:0.10 (20 nm)\0.8:0.2:0.10 (20 nm))

[Chemical 15]

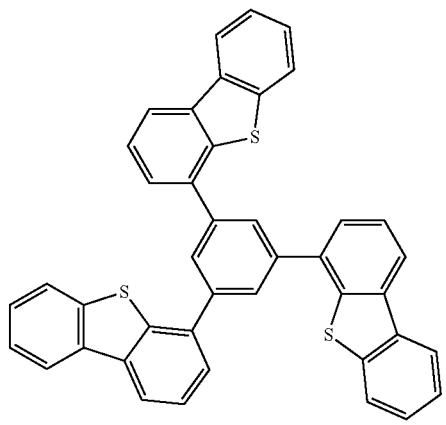

DBT3P-II

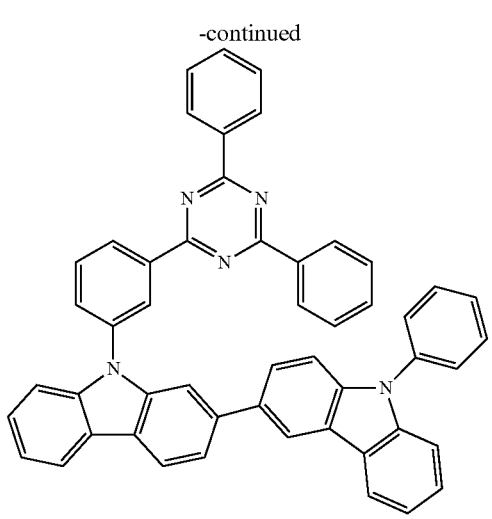

mPCCzPTzn-02

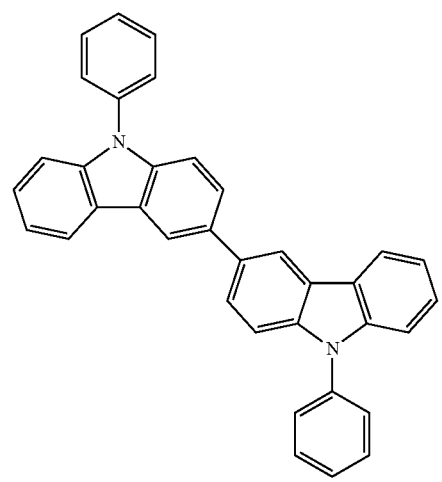

PCCP

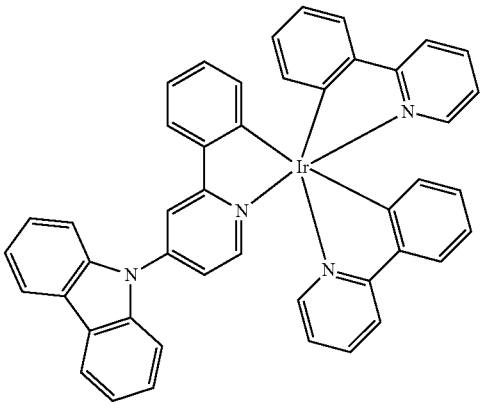

(100)

[Ir(ppy)$_2$(Czppy)]

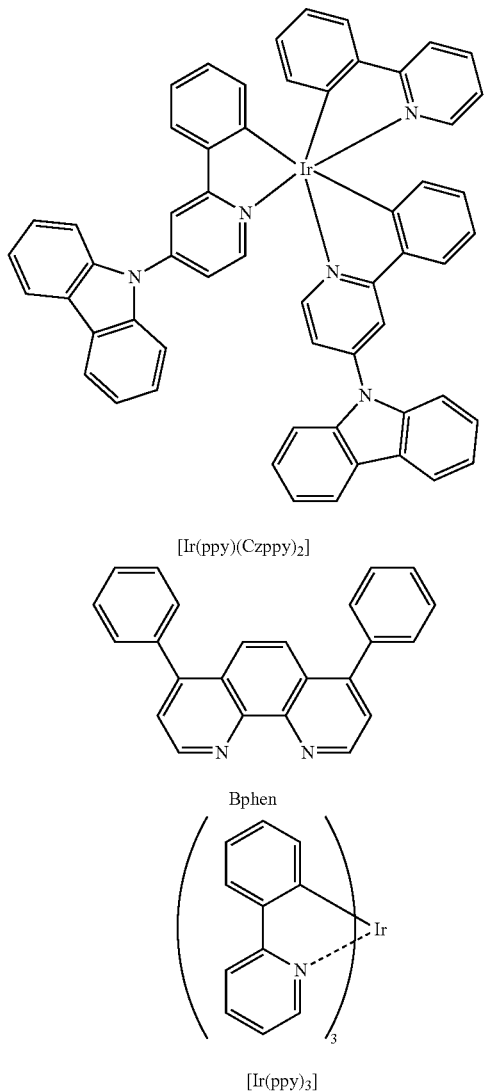

<<Fabrication of Light-Emitting Elements>>

In the light-emitting elements described in this example, as illustrated in FIG. 21, a hole-injection layer 1911, a hole-transport layer 1912, a light-emitting layer 1913, an electron-transport layer 1914, and an electron-injection layer 1915 are stacked in this order over an anode 901 formed over a substrate 1900, and a cathode 1903 is stacked over the electron-injection layer 1915.

First, the anode 1901 was formed over the substrate 1900. The electrode area was set to 4 mm² (2 mm×2 mm). A glass substrate was used as the substrate 1900. The anode 1901 was formed by depositing indium tin oxide (ITO) containing silicon to a thickness of 70 nm by a sputtering method.

As pretreatment, a surface of the substrate was washed with water, baking was performed at 200° C. for 1 hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 1911 was formed over the anode 1901. For the formation of the hole-injection layer 1911, the pressure in the vacuum evaporation apparatus was reduced to $10^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=4:2 (weight ratio) and the thickness was 60 nm.

Then, the hole-transport layer 1912 was formed over the hole-injection layer 1911. The hole-transport layer 1912 was formed to a thickness of 20 nm by evaporation using 9-phenyl-9H-3-(9-phenyl-9H-carbazol-3-yl)carbazole (abbreviation: PCCP).

Next, the light-emitting layer 1913 was formed over the hole-transport layer 1912.

For the light-emitting layer 1913 in the light-emitting element 1, 9-[3-(4,6-diphenyl-1,3,5-triazin-2-yl)phenyl]-9'-phenyl-2,3'-bi-9H-carbazole (abbreviation: mPCCzPTzn-02) as a host material, PCCP as an assist material, and [Ir(ppy)₂(Czppy)] as a guest material (phosphorescent material) were used and co-evaporated such that mPCCzPTzn-02:PCCP:[Ir(ppy)₂(Czppy)]=0.5:0.5:0.10 (weight ratio). The thickness was set to 20 nm. Co-evaporation was further performed such that mPCCzPTzn-02:PCCP:[Ir(ppy)₂(Czppy)]=0.8:0.2:0.10 (weight ratio). The thickness was set to 20 nm. Accordingly, the light-emitting layer 1913 has a stacked-layer structure with a thickness of 40 nm.

For the light-emitting layer 1913 in the light-emitting element 2, mPCCzPTzn-02 as a host material, PCCP as an assist material, and [Ir(ppy)(Czppy)₂] as a guest material (phosphorescent material) were used and co-evaporated such that mPCCzPTzn-02:PCCP: [Ir(ppy)(Czppy)₂]=0.5: 0.5:0.10 (weight ratio). The thickness was set to 20 nm. Furthermore, co-evaporation was performed such that mPCCzPTzn-02:PCCP: [Ir(ppy)(Czppy)₂]=0.8:0.2:0.1 (weight ratio). The thickness was set to 20 nm. Accordingly, the light-emitting layer 1913 has a stacked-layer structure with a thickness of 40 nm.

For the light-emitting layer 1913 in the comparative light-emitting element 1, mPCCzPTzn-02 as a host material, PCCP as an assist material, and [Ir(ppy)₃] as a guest material (phosphorescent material) were used and co-evaporated such that mPCCzPTzn-02:PCCP:[Ir(ppy)₃]=0.5:0.5:0.10 (weight ratio). The thickness was set to 20 nm. Furthermore, co-evaporation was performed such that mPCCzPTzn-02: PCCP:[Ir(ppy)₃]=0.8:0.2:0.1 (weight ratio). The thickness was set to 20 nm. Accordingly, the light-emitting layer 1913 has a stacked-layer structure with a thickness of 40 nm.

Next, the electron-transport layer 1914 was formed over the light-emitting layer 1913. The electron-transport layer 1914 was formed by sequential evaporation such that the thickness of mPCCzPTzn-02 was 15 nm and the thickness of bathophenanthroline (abbreviation: Bphen) was 10 nm.

Then, the electron-injection layer 1915 was formed over the electron-transport layer 1914. The electron-injection layer 1915 was formed to a thickness of 1 nm by evaporation of lithium fluoride (LiF).

After that, the cathode 1903 was formed over the electron-injection layer 1915. The cathode 1903 was formed using aluminum to a thickness of 200 nm by an evaporation method.

Through the above steps, the light-emitting elements in which the EL layer was interposed between a pair of electrodes were formed over the substrate 1900. The hole-injection layer 1911, the hole-transport layer 1912, the light-emitting layer 1913, the electron-transport layer 1914, and the electron-injection layer 1915 described in the above steps were functional layers forming the EL layer in one embodiment of the present invention. In all the evaporation steps in the above fabrication method, evaporation was performed by a resistance-heating method.

The light-emitting elements fabricated as described above were each sealed using another substrate (not illustrated). The other substrate was fixed onto the substrate 1900 with a sealant in a glove box containing a nitrogen atmosphere, a sealing material was applied so as to surround the light-emitting element formed over the substrate 1900, and then irradiation with 365-nm ultraviolet light at 6 J/cm² and heat treatment were performed at 80° C. for 1 hour.

<<Operation Characteristics of Light-Emitting Elements>>

Operation characteristics of the fabricated light-emitting elements (the light-emitting element 1, the light-emitting element 2, and the comparative light-emitting element 1) were measured. Note that the measurements were performed at room temperature. The results are shown in FIG. 22 to FIG. 25.

These results reveal that the light-emitting elements (the light-emitting element 1, the light-emitting element 2, and the comparative light-emitting element 1) which are embodiments of the present invention have favorable current efficiency and high external quantum efficiency. Table 2 below shows initial values of main characteristics of the light-emitting elements at around 1000 cd/m².

TABLE 2

|  | Voltage (V) | Current (mA) | Current density (mA/cm²) | Chromaticity (x, y) | Luminance (cd/m²) | Current efficiency (cd/A) | Power efficiency (lm/W) | External quantum efficiency (%) |
|---|---|---|---|---|---|---|---|---|
| Light-emitting element 1 | 3.2 | 0.056 | 1.4 | (0.38, 0.59) | 840 | 60 | 59 | 17 |
| Light-emitting element 2 | 3.1 | 0.054 | 1.3 | (0.37, 0.60) | 820 | 61 | 62 | 17 |
| Comparative light-emitting element 1 | 3.3 | 0.080 | 2.0 | (0.35, 0.61) | 1000 | 52 | 49 | 15 |

Figure 26:
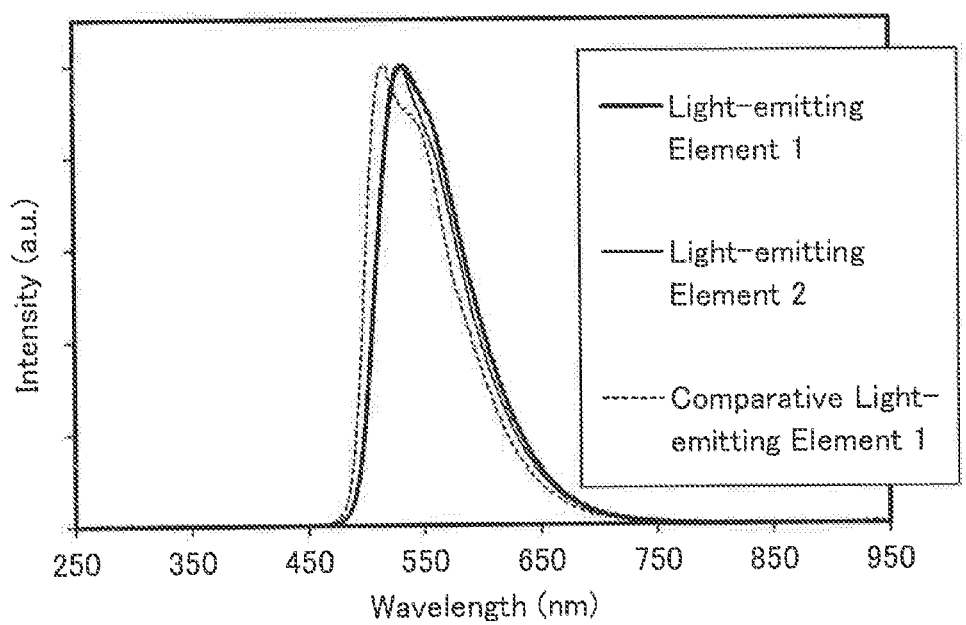
FIG. 26 Emission spectra of the light-emitting element 1, the light-emitting element 2, and the comparative light-emitting element 1.
Figure 27:
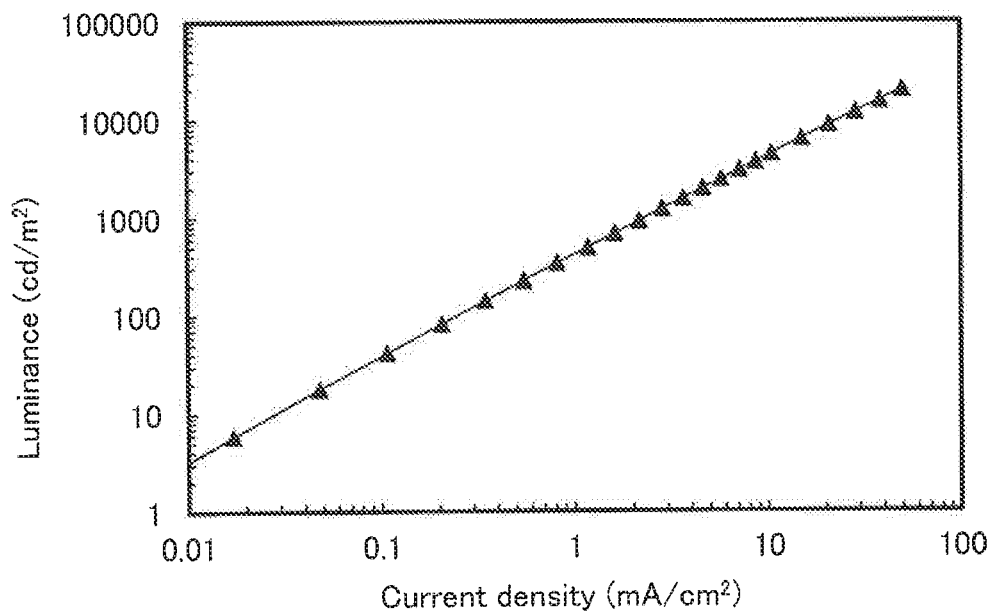
FIG. 27 Luminance-current density characteristics of a light-emitting element 3.
Figure 28:
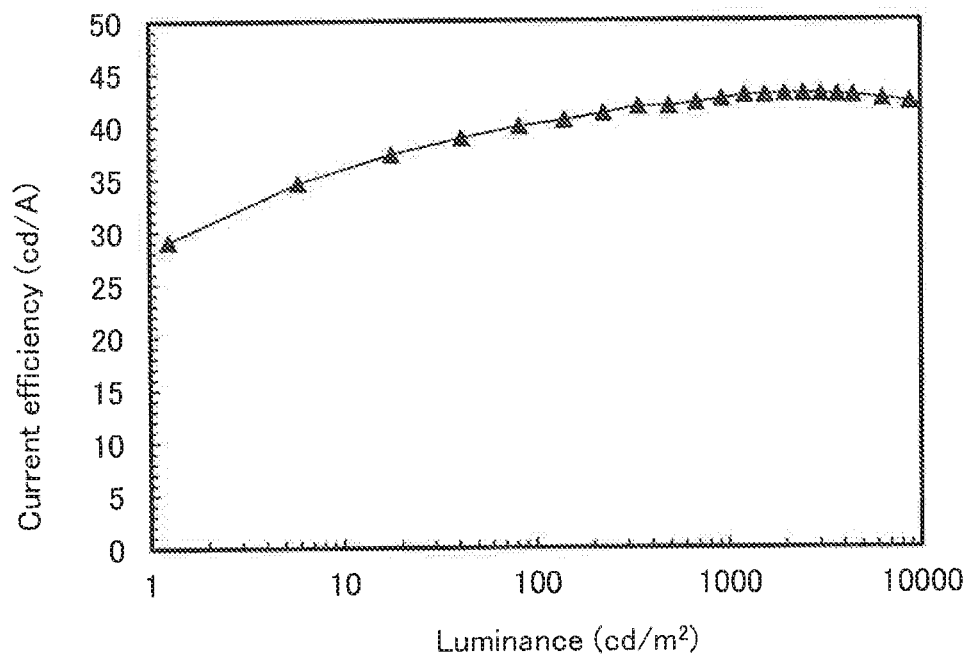
FIG. 28 Current efficiency-luminance characteristics of the light-emitting element 3.
Figure 29:
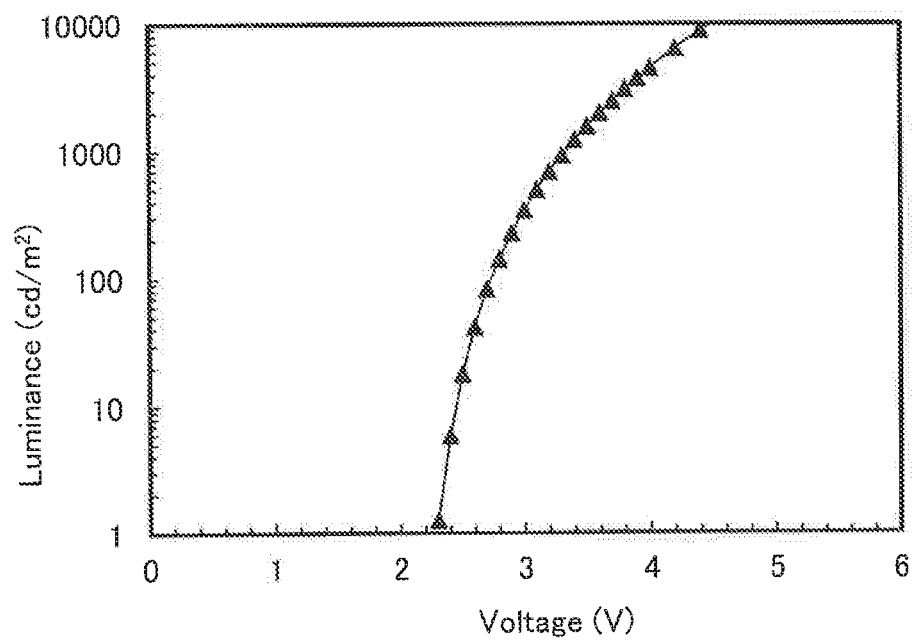
FIG. 29 Luminance-voltage characteristics of the light-emitting element 3.
Figure 30:
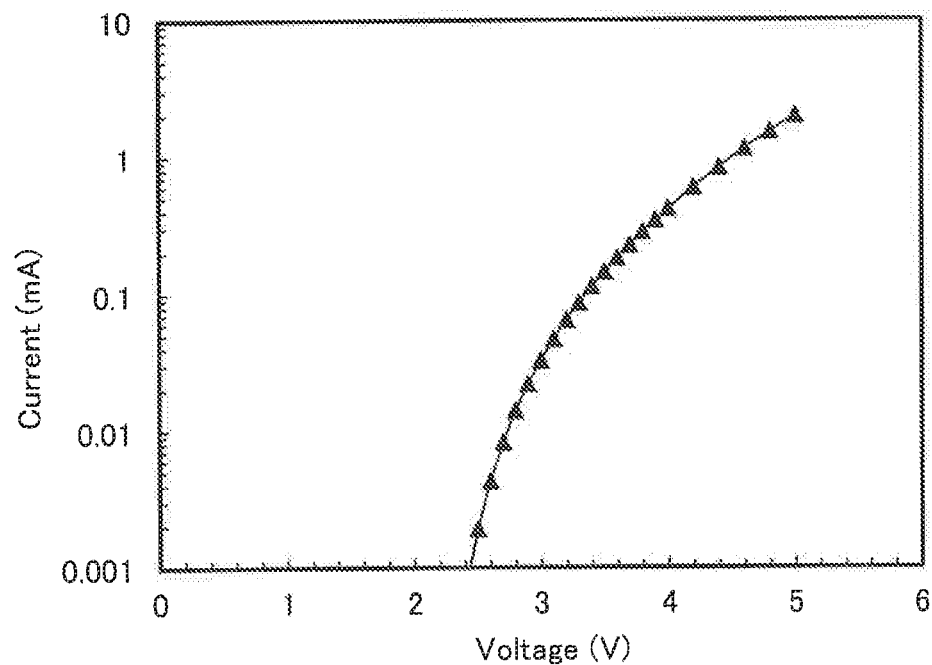
FIG. 30 Current-voltage characteristics of the light-emitting element 3.
Figure 31:
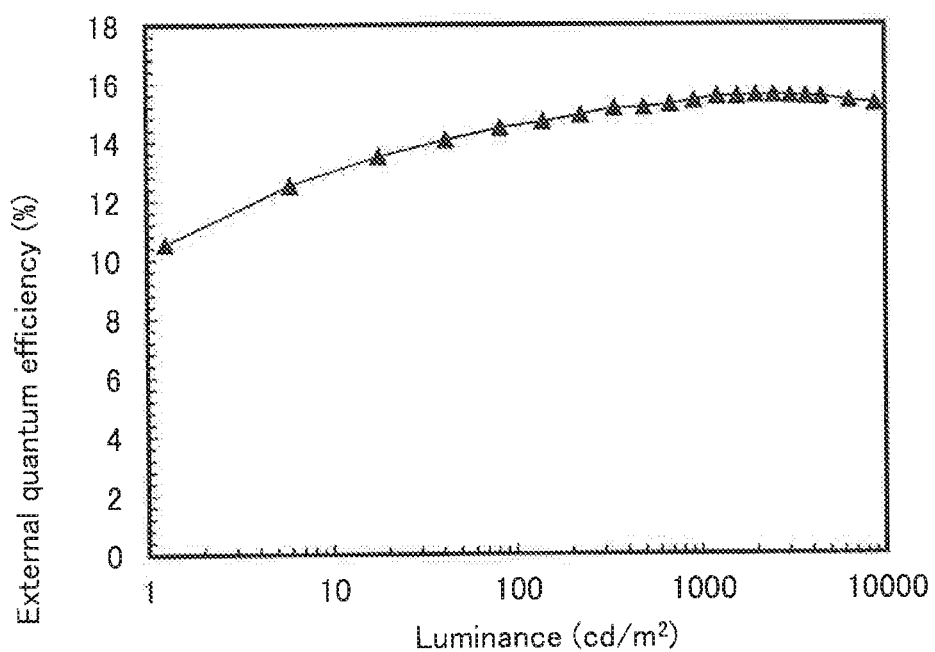
FIG. 31 External quantum efficiency-luminance characteristics of the light-emitting element 3.

FIG. 26 shows emission spectra when current at a current density of 2.5 mA/cm² was applied to the light-emitting element 1, the light-emitting element 2, and the comparative light-emitting element 1. As shown in FIG. 26, the emission spectrum of the light-emitting element 1 has a peak at around 531 nm which is probably derived from light emission of the organometallic complex [Ir(ppy)$_2$(Czppy)] included in the light-emitting layer 1913. The emission spectrum of the light-emitting element 2 has a peak at around 531 nm which is probably derived from light emission of the organometallic complex [Ir(ppy)(Czppy)$_2$] included in the light-emitting layer 1913. The emission spectrum of the comparative light-emitting element 1 has a peak at around 517 nm which is probably derived from light emission of the organometallic complex [Ir(ppy)$_3$] included in the light-emitting layer 1913. Note that the organometallic complexes which are embodiments of the present invention and used in the light-emitting element 1 and the light-emitting element 2 have a carbazole skeleton at the 4-position of a 2-phenylpyridine skeleton. Thus, carriers (electrons or holes) can be easily injected and transported, the emission efficiency of the elements can be improved, and the driving voltage can be reduced. This shows that the light-emitting elements 1 and 2 exhibit higher current efficiency and lower driving voltage than the comparative light-emitting element 1.

Example 4

In this example, an element structure, a fabrication method, and properties of a light-emitting element 3 in which a light-emitting layer is formed of only bis{2-[6-(9H-carbazol-9-yl)-4-pyridinyl-κN3]phenyl-κC}-{2-[2-pyridinyl-κN]phenyl-κC}iridium(III) (abbreviation: [Ir(czppm)$_2$(ppy)]) (Structural Formula (102)) which is a light-emitting element material of the present invention. Note that FIG. 21 illustrates an element structure of the light-emitting element used in this example, and Table 3 shows a specific structure. Chemical formulae of materials used in this example are shown below.

TABLE 3

| Hole-injection layer | Hole-transport layer | Light-emitting layer | Electron-transport layer | | Electron-injection layer |
|---|---|---|---|---|---|
| 50 nm | 20 nm | 30 nm | 30 nm | 15 nm | 1 nm |
| DBT3P-II:MoOx (2:1) | PCBBiF | Ir(Czppm)$_2$(ppy) | 2mDBTBPDBq-II | Bphen | LiF |

[Chemical 16]

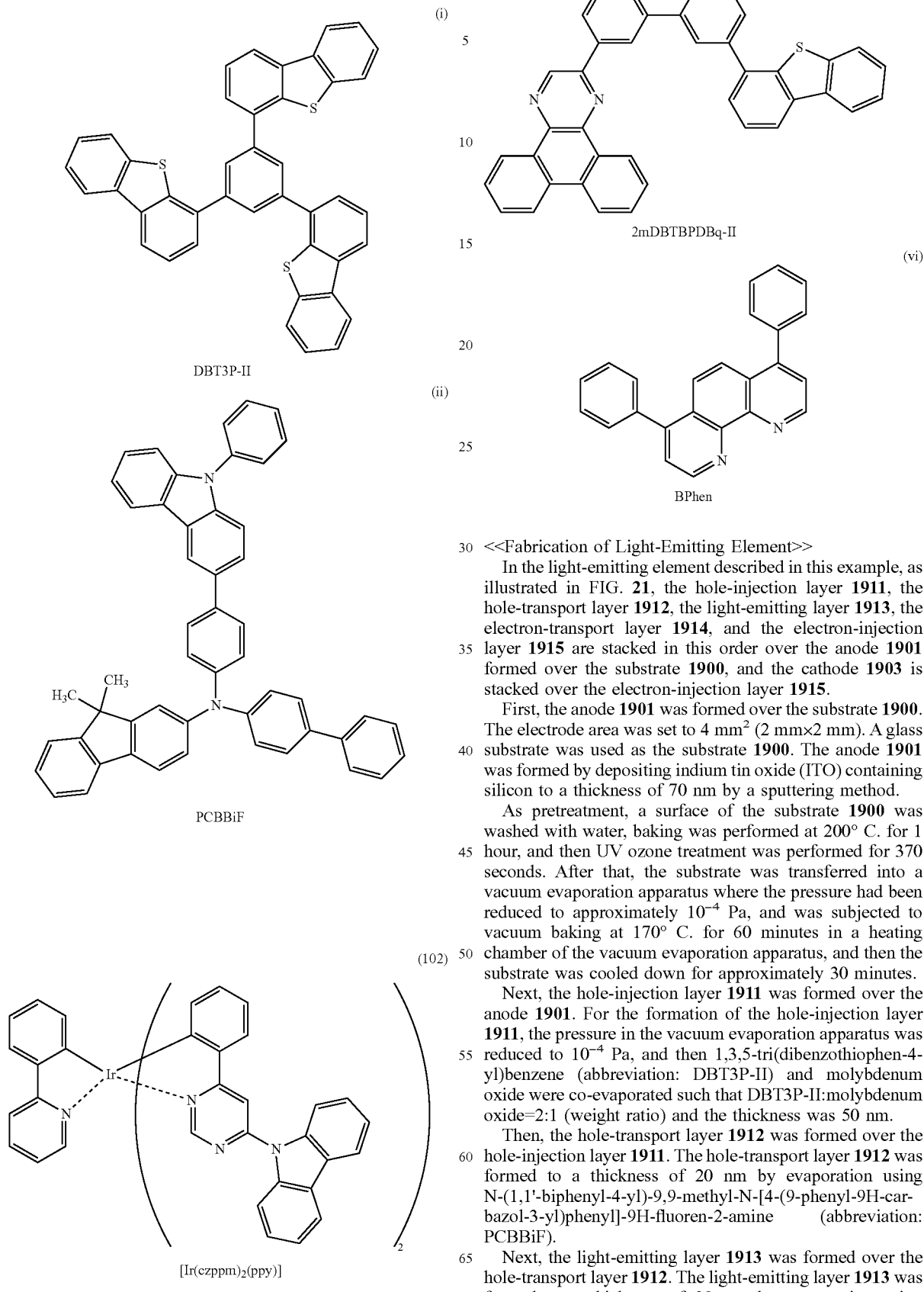

<<Fabrication of Light-Emitting Element>>

In the light-emitting element described in this example, as illustrated in FIG. 21, the hole-injection layer 1911, the hole-transport layer 1912, the light-emitting layer 1913, the electron-transport layer 1914, and the electron-injection layer 1915 are stacked in this order over the anode 1901 formed over the substrate 1900, and the cathode 1903 is stacked over the electron-injection layer 1915.

First, the anode 1901 was formed over the substrate 1900. The electrode area was set to 4 mm$^2$ (2 mm×2 mm). A glass substrate was used as the substrate 1900. The anode 1901 was formed by depositing indium tin oxide (ITO) containing silicon to a thickness of 70 nm by a sputtering method.

As pretreatment, a surface of the substrate 1900 was washed with water, baking was performed at 200° C. for 1 hour, and then UV ozone treatment was performed for 370 seconds. After that, the substrate was transferred into a vacuum evaporation apparatus where the pressure had been reduced to approximately 10$^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 1911 was formed over the anode 1901. For the formation of the hole-injection layer 1911, the pressure in the vacuum evaporation apparatus was reduced to 10$^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (weight ratio) and the thickness was 50 nm.

Then, the hole-transport layer 1912 was formed over the hole-injection layer 1911. The hole-transport layer 1912 was formed to a thickness of 20 nm by evaporation using N-(1,1'-biphenyl-4-yl)-9,9-methyl-N-[4-(9-phenyl-9H-carbazol-3-yl)phenyl]-9H-fluoren-2-amine (abbreviation: PCBBiF).

Next, the light-emitting layer 1913 was formed over the hole-transport layer 1912. The light-emitting layer 1913 was formed to a thickness of 30 nm by evaporation using bis{246-(9H-carbazol-9-yl)-4-pyridinyl-κN3]phenyl-κC}-{2-[2-pyridinyl-κN]phenyl-κC}iridium(III) (abbreviation: [Ir(czppm)₂(ppy)]) represented by Structural Formula (102) above.

Next, the electron-transport layer 1914 was formed over the light-emitting layer 1913. For the formation of the electron-transport layer 1914, 2-[3'-(dibenzothiophen-4-yl)biphenyl-3-yl]dibenzo[f,h]quinoxaline (abbreviation: 2mDBTBPDBq-II) represented by Structural Formula (iv) above was evaporated to a thickness of 30 nm, and then, bathophenanthroline (abbreviation: BPhen) represented by Structural Formula (vi) above was evaporated to a thickness of 15 nm.

Then, the electron-injection layer 1915 was formed over the electron-transport layer 1914. The electron-injection layer 1915 was formed to a thickness of 1 nm by evaporation using lithium fluoride (LiF).

After that, the cathode 1903 was formed over the electron-injection layer 1915. The cathode 1903 was formed using aluminum to a thickness of 200 nm by an evaporation method.

Through the above steps, the light-emitting element in which the EL layer was interposed between a pair of electrodes was formed over the substrate 1900. The hole-injection layer 1911, the hole-transport layer 1912, the light-emitting layer 1913, the electron-transport layer 1914, and the electron-injection layer 1915 described in the above steps were functional layers forming the EL layer in one embodiment of the present invention. In all the evaporation steps in the above fabrication method, evaporation was performed by a resistance-heating method.

The light-emitting element fabricated as described above was sealed using another substrate (not illustrated). The other substrate was fixed onto the substrate 1900 with a sealant in a glove box containing a nitrogen atmosphere, a sealing material was applied so as to surround the light-emitting element formed over the substrate 1900, and then irradiation with 365-nm ultraviolet light at 6 J/cm² and heat treatment were performed at 80° C. for 1 hour.

<<Operation Characteristics of Light-Emitting Element>>

Operation characteristics of the fabricated light-emitting element 3 were measured. Note that the measurements were performed at room temperature (in an atmosphere kept at 25° C.). The results are shown in FIG. 27 to FIG. 31.

These results reveal that the light-emitting element 3 which is one embodiment of the present invention has favorable current efficiency and high external quantum efficiency even though the light-emitting layer was formed of a single material. Table 4 below shows initial values of main characteristics of the light-emitting element at around 1000 cd/m².

TABLE 4

| Voltage (V) | Current (mA) | Current density (mA/cm²) | Chromaticity x | Chromaticity y | Current efficiency (cd/A) | External quantum efficiency (%) |
|---|---|---|---|---|---|---|
| 3.3 | 0.09 | 2.2 | 0.52 | 0.48 | 43 | 15 |

Figure 32:
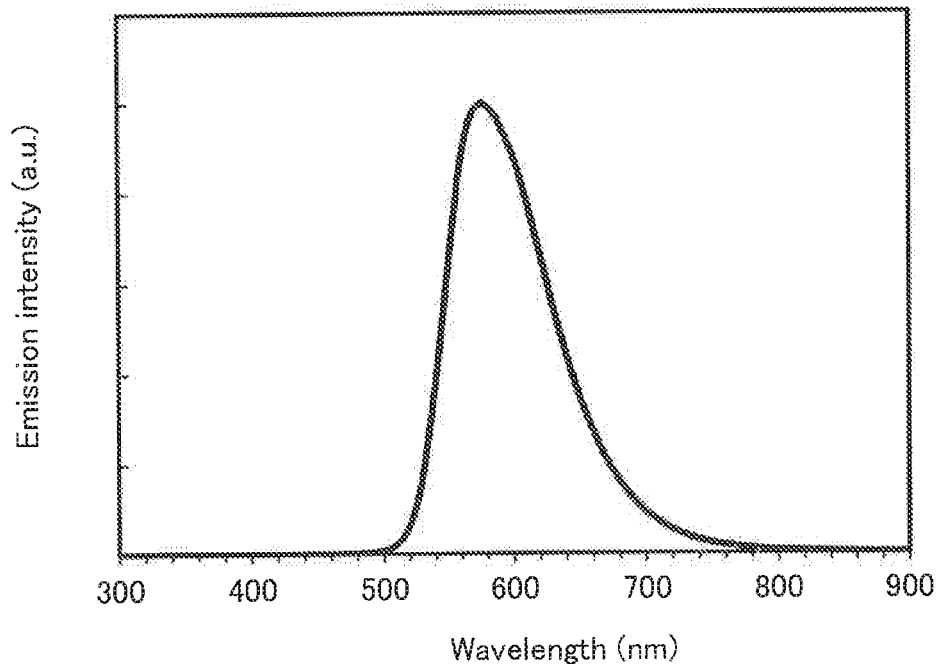
FIG. 32 An emission spectrum of the light-emitting element 3.

FIG. 32 shows an emission spectrum when current at a current density of 2.5 mA/cm² was applied to the light-emitting element 3. As shown in FIG. 32, the emission spectrum of the light-emitting element 3 has a peak at around 568 nm which is probably derived from light emission of the organometallic complex [Ir(czppm)₂(ppy)] included in the light-emitting layer 1913. Note that the organometallic complex of one embodiment of the present invention which was used in the light-emitting element 3 has a carbazole skeleton at the 6-position of a 4-phenylpyrimidine skeleton. Thus, carriers (electrons or holes) can be easily injected and transported, the emission efficiency of the element can be improved, and the driving voltage can be reduced. Since the carbazole skeleton (carrier-transport skeleton) is located in the periphery of the light-emitting skeleton, concentration quenching caused by the interaction between the light-emitting skeleton of one molecule and the light-emitting skeleton of another molecule can be inhibited. Therefore, high external quantum efficiency can be achieved even by the light-emitting layer consisting of a single material. As described above, even when the light-emitting element includes a light-emitting layer consisting of a single material, it is found that a light-emitting element exhibiting favorable characteristics such as high current efficiency and a low driving voltage can be provided by using the light-emitting element material of one embodiment of the present invention.

Example 5

<<Synthesis Example 3>>

In this synthesis example, a synthesis example of bis{2-[6-(9H-carbazol-9-yl)-4-pyrimidinyl-κN3]phenyl-κC]-{2-[2-pyridinyl-κN]phenyl-κC}iridium(III) (abbreviation: [Ir(czppm)₂(ppy)]), which is an organometallic complex including iridium as a central metal and a ligand including a first skeleton having a hole-transport property and a second skeleton having a light-emitting property, is disclosed. A structure of [Ir(czppm)₂(ppy)] is shown below.

[Chemical 17]

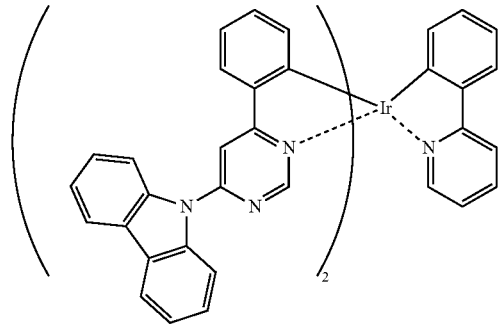

In [Ir(czppm)₂(ppy)] shown above, the carbazole skeleton corresponds to the first skeleton having a hole-transport property and the 4-phenylpyrimidine skeleton corresponds to the second skeleton having a light-emitting property.

<Step 1; Synthesis of 4-carbazol-9-yl-6-phenylpyrimidine (Abbreviation: Hczppm)>

Into a three-neck flask, 0.053 g of sodium hydride (60% in mineral oil) and 30 mL of dry N,N-dimethylformamide (abbreviation: dry DMF) were put, and the atmosphere in the flask was replaced with nitrogen. To this, 1.76 g of carbazole and 30 mL of dry DMF were added, and stirring was performed at room temperature for 1 hour. After that, 1.76 g of 4-chloro-6-phenylpyrimidine and 30 mL of dry DMF were added, and the solution was stirred at room temperature for 4 hours to be reacted. After the reaction, water was added to the obtained solution, suction filtration was performed, and a solid was obtained. The obtained solid was purified by flash column chromatography using dichloromethane as a developing solvent, so that the objective pyrimidine derivative Hczppm was obtained (a white powder, a yield of 62%). The synthesis scheme of Step 1 is shown below.

[Chemical 18]

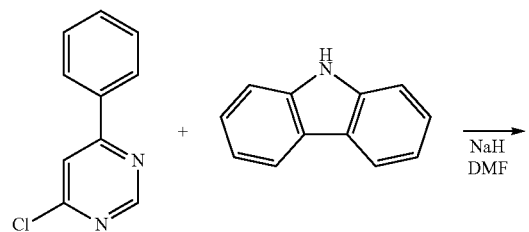

[Chemical 19]

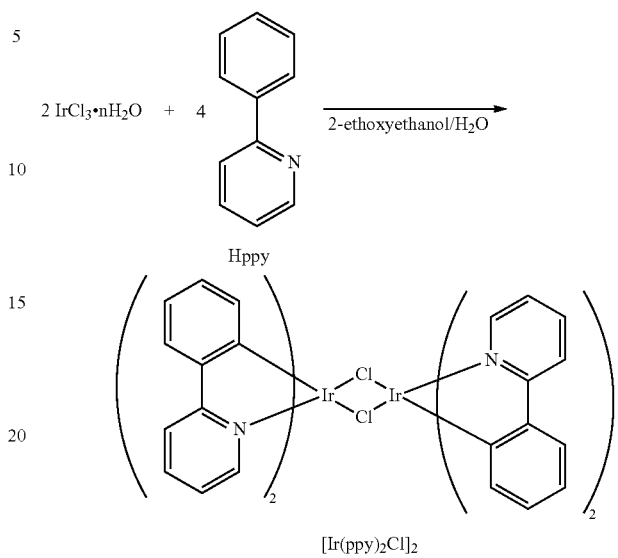

<Step 3; Synthesis of bis{2-[6-(9H-carbazol-9-yl)-4-pyrimidinyl-κN3]phenyl-κC]-{2-[2-pyridinyl-κN]phenyl-κC} iridium(III) (Abbreviation: [Ir(czppm)₂(ppy)])>

Into a light-shielded three-neck flask, 3.69 g of the dinuclear complex [Ir(ppy)₂Cl]₂ obtained in Step 2 above and 390 mL of dichloromethane were put, and the atmosphere in the flask was replaced with nitrogen. To this mixture, a solution in which 2.27 g of silver trifluoromethanesulfonate was dissolved into 180 mL of methanol was dripped, and stirring was performed at room temperature for 24 hours. The obtained mixture was filtered through a filter aid, and then, the filtrate was concentrated to give a solid. Then, the obtained solid, 3.90 g of Hczppm, and 40 mL of ethanol were put into a three-neck flask equipped with a reflux pipe, and the atmosphere in the flask was replaced with nitrogen. Heating was performed at 90° C. for 48 hours and then the obtained mixture was suction-filtered. The obtained residue was purified by silica gel column chromatography using hexane:ethyl acetate=6:1 as a developing solvent, and then recrystallization was performed from a mixed solvent of dichloromethane and methanol, whereby [Ir(czppm)₂(ppy)] which is the light-emitting element material of one embodiment of the present invention was obtained as a yellow orange powder (a yield of 6%). The synthesis scheme of Step 3 is shown below.

<Step 2; Synthesis of di-μ-chloro-tetrakis{2-[2-pyridinyl-κN]phenyl-κC}diiridium(III) (Abbreviation: [Ir(ppy)₂Cl]₂)>

Into a recovery flask equipped with a reflux pipe, 30 mL of 2-ethoxyethanol, 10 mL of water, 3.88 g of 2-phenylpyridine (abbreviation: Hppy), and 3.49 g of iridium chloride hydrate (IrC₁₃.H₂O) (manufactured by Furuya Metal Co., Ltd.) were put, and the atmosphere in the flask was replaced with argon. Then, microwave irradiation (2.45 GHz, 100 W) was performed for 2 hours to cause reaction. After the reaction, the obtained mixture was suction-filtered using methanol, and washing was performed, whereby the dinuclear complex [Ir(ppy)₂Cl]₂ was obtained (a yellow solid, a yield of 59%). The synthesis scheme of Step 2 is shown below.

[Chemical 20]

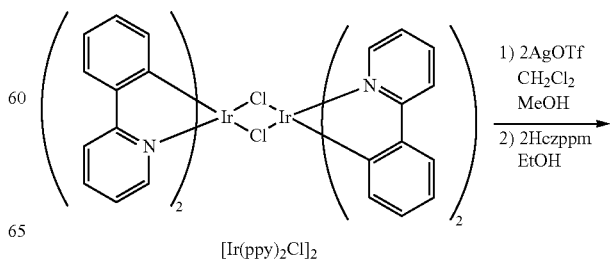

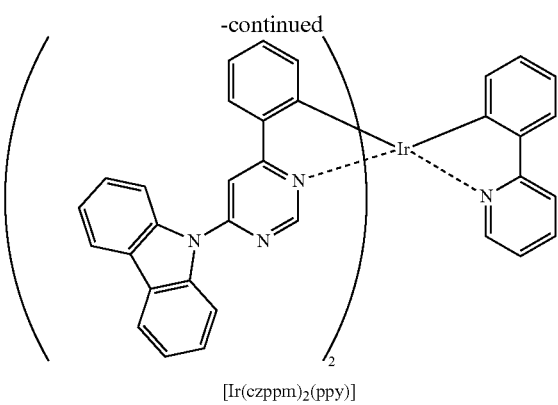

[Ir(czppm)₂(ppy)]

Figure 33A:
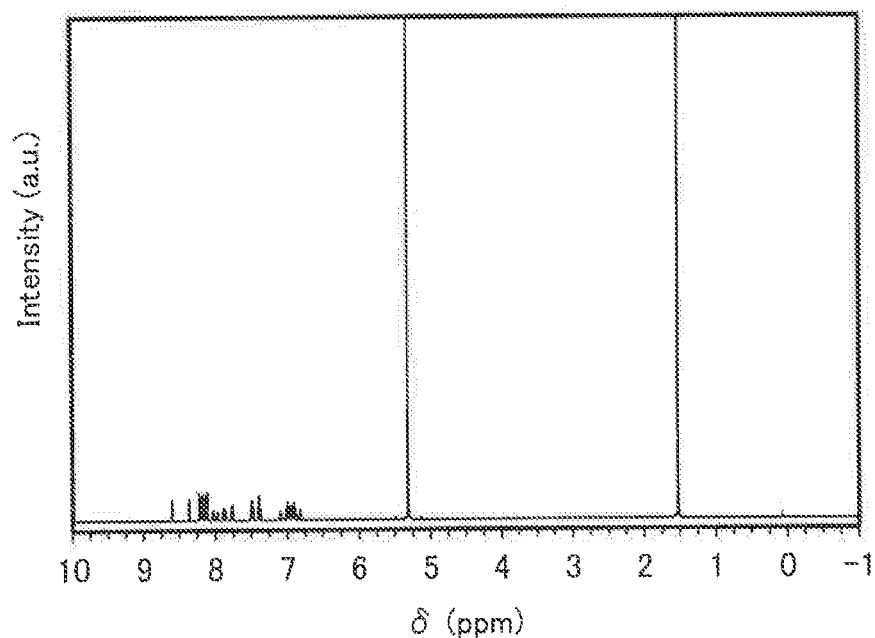
FIG. 33 A spectrum of [Ir(czppm)$_2$(ppy)].
Figure 33B:
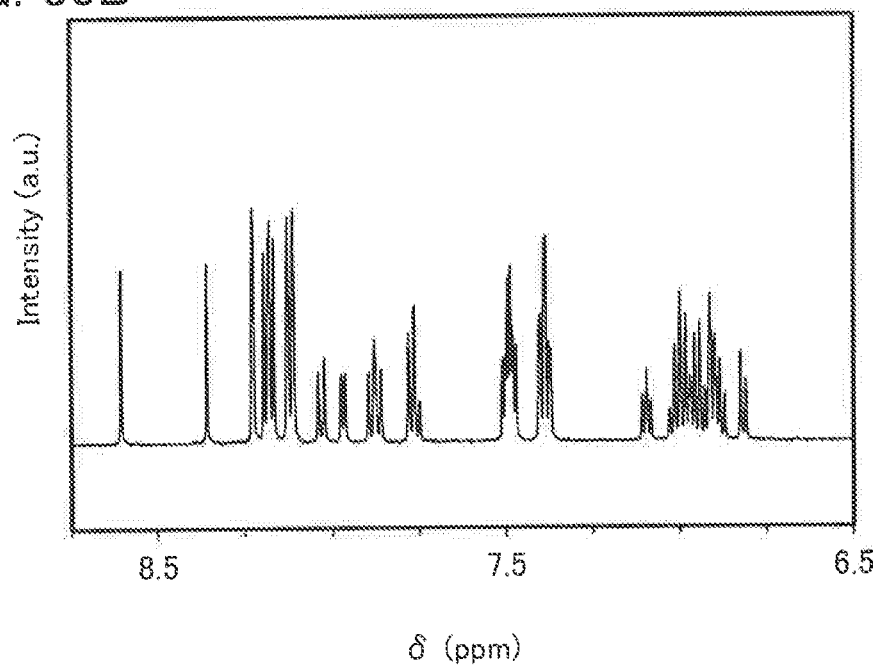

Analysis results by nuclear magnetic resonance (¹H-NMR) spectroscopy of the yellow orange powder obtained in Step 3 above are shown below. FIGS. 33(A) and 33(B) show ¹H-NMR charts. FIG. 33(B) is a chart where the range of 6.50 ppm to 8.75 ppm in FIG. 33(A) is enlarged. This reveals that [Ir(czppm)₂(ppy)], which is the light-emitting element material of one embodiment of the present invention represented by the above structural formula, was obtained in Synthesis example 3.

¹H-NMR δ (CD₂Cl₂): 6.82 (d, 1H), 6.87-7.03 (m, 8H), 7.10 (t, 1H), 7.37-7.40 (m, 4H), 7.47-7.51 (m, 4H), 7.75-7.78 (m, 2H), 7.88 (t, 2H), 7.97 (d, 1H), 8.03 (d, 1H), 8.12 (d, 4H), 8.18 (dd, 4H), 8.23 (s, 2H), 8.36 (s, 1H), 8.61 (s, 1H).

Figure 34:
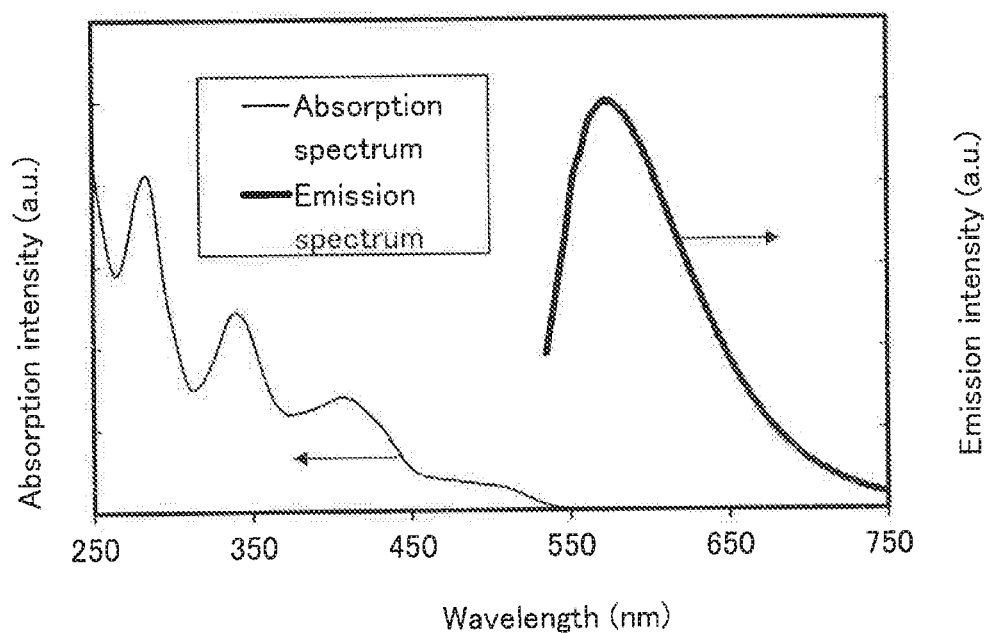
FIG. 34 An absorption spectrum and an emission spectrum of [Ir(czppm)$_2$(ppy)].

Next, an ultraviolet-visible absorption spectrum (hereinafter, simply referred to as an "absorption spectrum") and an emission spectrum of a dichloromethane solution of [Ir(czppm)₂(ppy)] were measured. The measurement of the absorption spectrum was conducted at room temperature, for which an ultraviolet-visible spectrophotometer (V550 type manufactured by JASCO Corporation) was used and the dichloromethane solution (9.9 µmol/L) was put into a quartz cell. The measurement of the emission spectrum was conducted at room temperature, for which an absolute PL quantum yield measurement system (C11347-01 manufactured by Hamamatsu Photonics K.K.) was used and the deoxidized dichloromethane solution (9.9 µmol/L) was put and sealed in a quartz cell under a nitrogen atmosphere in a glove box (LABstar M13 (1250/780) manufactured by Bright Co., Ltd.). FIG. 34 shows measurement results of the obtained absorption spectrum and emission spectrum. The horizontal axis represents wavelength and the vertical axes represent absorption intensity and emission intensity. In FIG. 34, two solid lines are shown; the thin solid line represents the absorption spectrum, and the thick solid line represents the emission spectrum. The absorption spectrum shown in FIG. 34 is the results obtained in such a way that the absorption spectrum measured by putting only dichloromethane in a quartz cell was subtracted from the absorption spectrum measured by putting the dichloromethane solution (9.9 µmon) in a quartz cell.

As shown in FIG. 34, [Ir(czppm)₂(ppy)], which is the light-emitting element material of the present invention, has an emission peak at 574 nm, and yellow light emission was observed.

Example 6

<<Synthesis Example 4>>

In this synthesis example, a method of synthesizing an organometallic complex [4-(4,6-diphenyl-1,3,5-triazin-2-yl)-2-(2-pyridinyl-κN)phenyl-κC]bis[2-(2-pyridinyl-κN)phenyl-κC]iridium(III) (abbreviation: [Ir(ppy)₂(5dptznppy)]), in which iridium is a central metal and which includes a ligand including a first skeleton having an electron-transport property and a second skeleton having a light-emitting property, is disclosed. A structural formula of [Ir(ppy)₂(5dptznppy)] is shown below.

[Chemical 21]

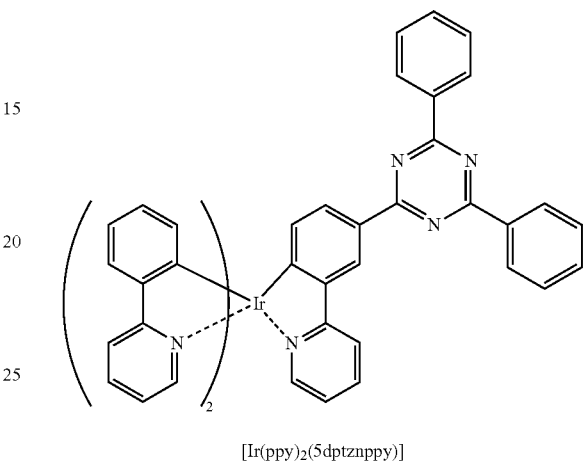

[Ir(ppy)₂(5dptznppy)]

<Step 1: Synthesis of 3-(4,6-diphenyl-1,3,5-triazin-2-yl) phenylboronic acid pinacol ester>

First, 2.0 g of 2-(3-bromophenyl)-4,6-diphenyl-1,3,5-triazine, 1.6 g of bis(pinacolato)diboron (abbreviation: (Bpin)₂), 1.5 g of potassium acetate, and 25 mL of N,N-dimethylformamide were put into a three-neck flask equipped with a reflux pipe, and the atmosphere in the flask was replaced with nitrogen. Furthermore, 0.042 g of [1,1'-bis(diphenylphosphino)ferrocene]palladium(II) dichloride dichloromethane adduct (abbreviation: Pd(dppf)₂Cl₂·CH₂Cl₂) was added, and heating and stirring were performed at 150° C. for 3 hours.

The solvent of the obtained reaction solution was distilled off and the residue was purified by silica gel column chromatography using toluene as a developing solvent, whereby 2.0 g of the object was obtained (a yield of 88%, a white solid). The synthesis scheme of Step 1 is shown below.

[Chemical 22]

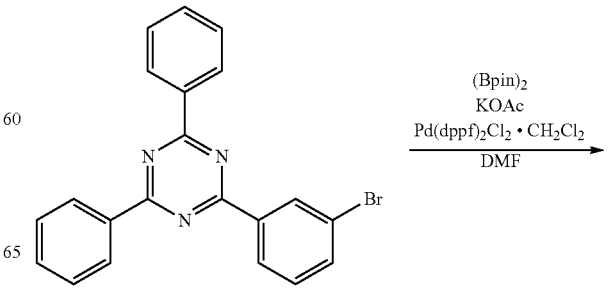

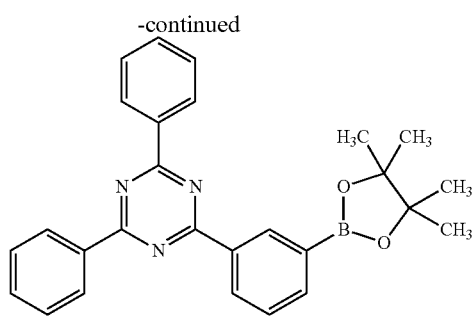

<Step 2: Synthesis of 2-[3-(4,6-diphenyl-1,3,5-triazin-2-yl)phenyl]pyridine (Abbreviation: H5dptznppy)>

Next, 2.8 g of 3-(4,6-diphenyl-1,3,5-triazin-2-yl)phenylboronic acid pinacol ester obtained in Step 1 above, 0.9 g of 2-bromopyridine, 1.6 g of potassium carbonate, 50 mL of tetrahydrofuran (abbreviation: THF), and 25 mL of water were put into a three-neck flask equipped with a reflux pipe, and the atmosphere in the flask was replaced with nitrogen. Furthermore, 0.33 g of tetrakis(triphenylphosphine)palladium(0) was added, and heating and stirring were performed at 70° C. for 24 hours. After the reaction, extraction was performed with ethyl acetate. After that, purification was performed by silica gel column chromatography using dichloromethane as a developing solvent, whereby 2.2 g of the object (a yield of 98%, a white solid) was obtained. The synthesis scheme of Step 2 is shown below.

[Chemical 23]

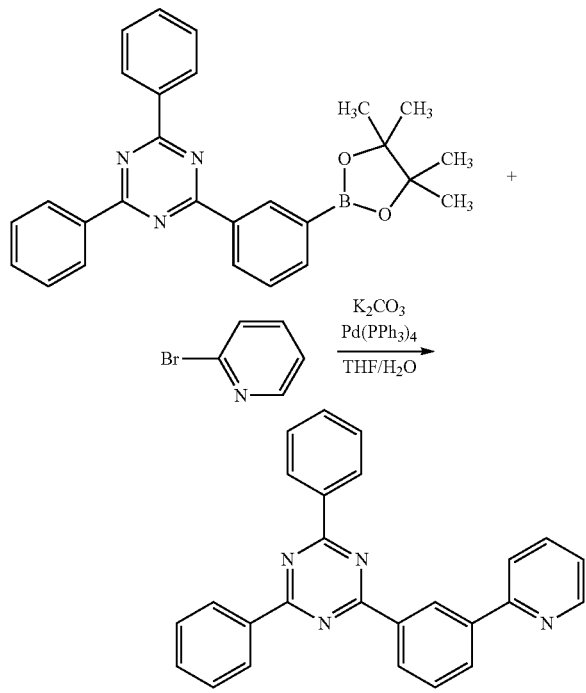

<Step 3: Synthesis of [4-(4,6-diphenyl-1,3,5-triazin-2-y0-2-(2-pyridinyl-κN)phenyl-κC]bis[2-(2-pyridinyl-κN)phenyl-κC]iridium(III) abbreviation: [Ir(ppy)₂(5dptznppy)]>

Next, 1.9 g of [Ir(ppy)₂Cl]₂ and 190 mL of dichloromethane were put into a three-neck flask, and the atmosphere in the flask was replaced with nitrogen. A mixed solution of 1.1 g of silver triflate and 90 mL of methanol was dripped thereinto, followed by stirring at room temperature for 20 hours. After the obtained mixture was filtered through Celite, concentration was performed, whereby a solid was obtained. To this solid, 2.0 g of H5dptznppy obtained in Step 2 above and 70 mL of ethanol were added, and reflux was performed for 24 hours under a nitrogen atmosphere. The obtained reactant was filtered and the residue was purified by silica gel column chromatography using dichloromethane as a developing solvent. After that, further purification was performed by high performance liquid chromatography using chloroform as a mobile phase. The obtained solution was concentrated and recrystallization was performed from a mixed solvent of dichloromethane and hexane, so that a yellow solid was obtained (yield: 28%). The synthesis scheme of Step 3 is shown below.

[Chemical 24]

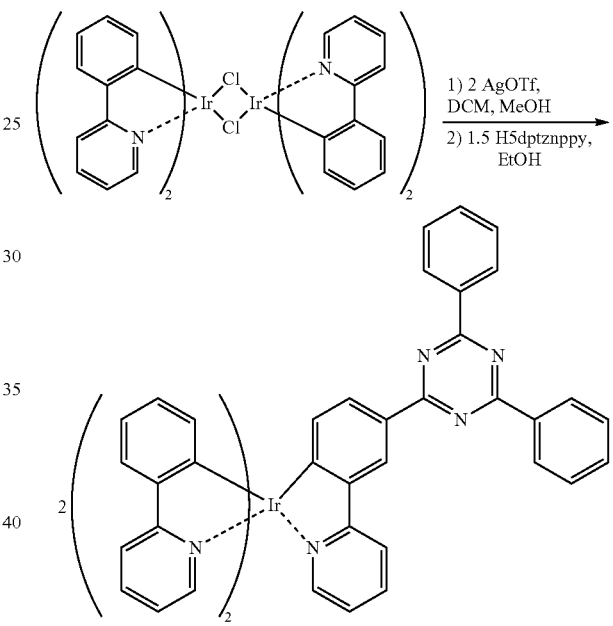

Figure 35:
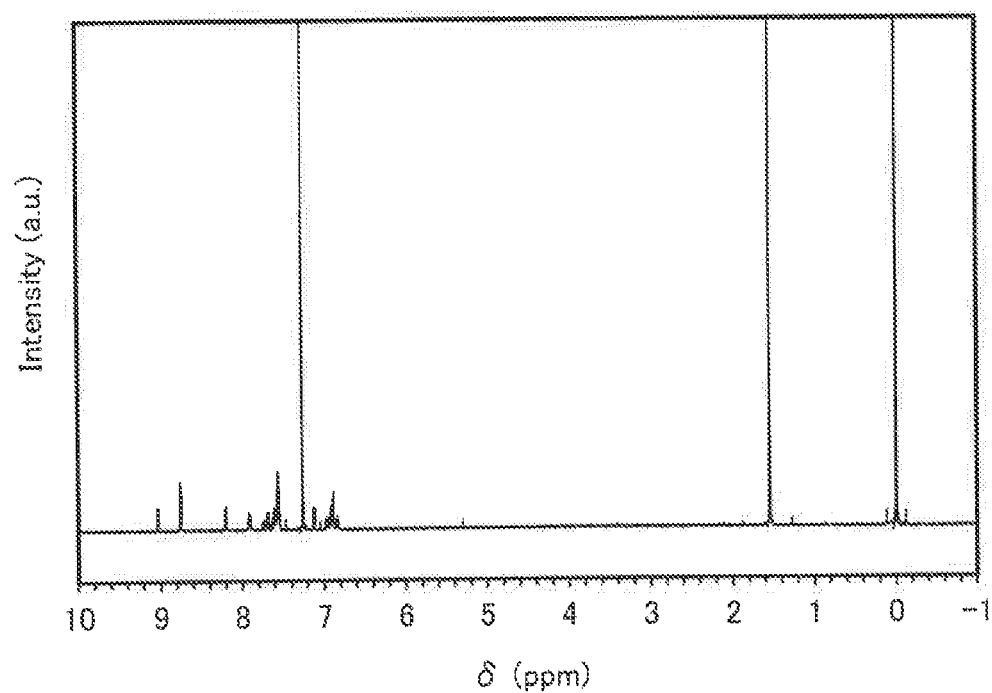
FIG. 35 A $^1$H-NMR spectrum of [Ir(ppy)$_2$(5dptznppy)].

Analysis results by nuclear magnetic resonance ($^1$H-NMR) spectroscopy of the yellow solid obtained in Step 3 above are shown below. FIG. 35 shows an $^1$H-NMR chart. These results revealed that the organometallic complex [Ir(ppy)₂(5dptznppy)], which is one embodiment of the present invention, was obtained in this synthesis example.

$^1$H-NMR. δ (CDCl₃): 6.84-6.99 (m, 9H), 7.13 (d, 1H), 7.53-7.64 (m, 11H), 7.68 (d, 2H), 7.74 (t, 1H), 7.91 (t, 2H), 8.21 (d, 2H), 8. 76 (d, 4H), 9.03 (s, 1H). Note that the peak at around 5.30 is a peak derived from dichloromethane.

Figure 36:
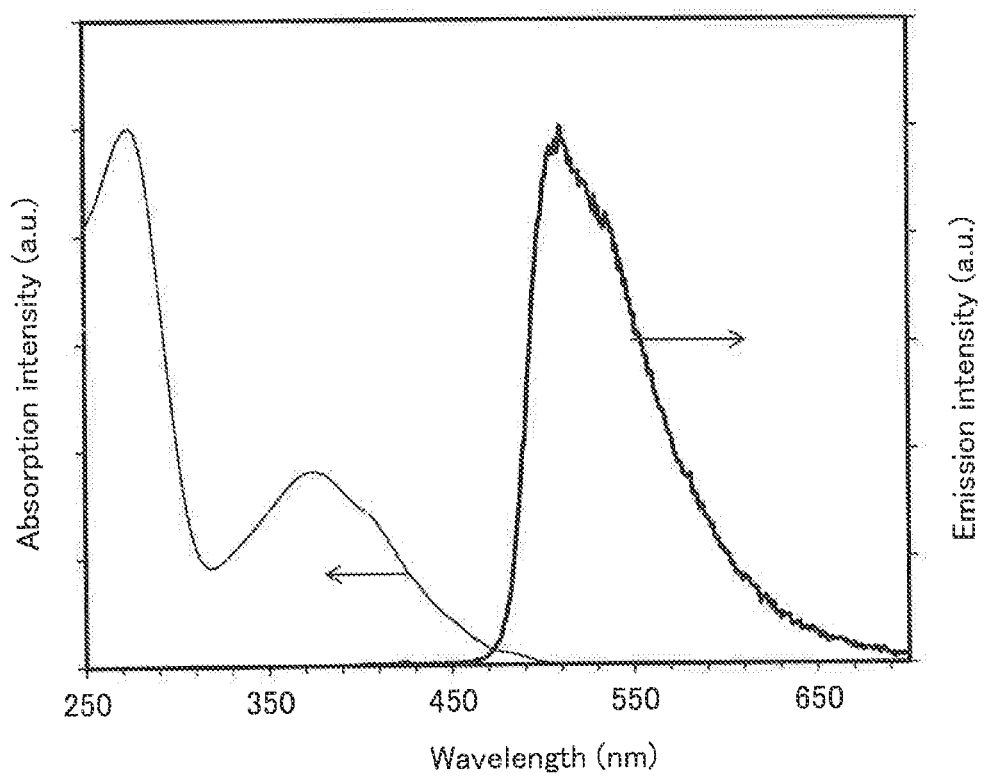
FIG. 36 An absorption spectrum and an emission spectrum of [Ir(ppy)$_2$(5dptznppy)].

Next, an ultraviolet-visible absorption spectrum (hereinafter, simply referred to as an "absorption spectrum") and an emission spectrum of a dichloromethane solution of [Ir(ppy)₂(5dptznppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 36 shows measurement results of the obtained absorption spectrum and emission spectrum. The horizontal axis represents wavelength and the vertical axes represent absorption intensity and emission intensity. In FIG. 36, two solid lines are shown; the thin solid line represents the absorption spectrum, and the thick solid line represents the emission spectrum. The absorption spectrum shown in FIG. 36 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 36, the organometallic complex [Ir(ppy)$_2$(5dptznppy)], which is one embodiment of the present invention, has an emission peak at 510 nm, and yellow-green light emission was observed from the dichloromethane solution.

Example 7

<<Synthesis Example 5>>

In this synthesis example, a method of synthesizing an organometallic complex bis[4-(4,6-diphenyl-1,3,5-triazin-2-yl)-2-(2-pyridinyl-κN)phenyl-κC][2-(2-pyridinyl-κN)phenyl-κC]iridium(III) (abbreviation: [Ir(5dptznppy)$_2$(ppy)]), in which iridium is a central metal and which includes a ligand including a first skeleton having an electron-transport property and a second skeleton having a light-emitting property, is disclosed. A structural formula of [Ir(5dptznppy)$_2$(ppy)] is shown below.

[Chemical 25]

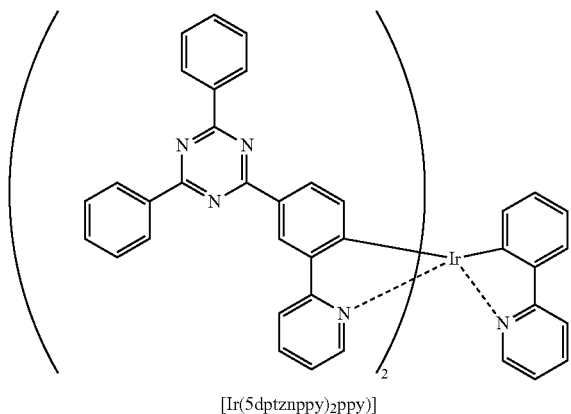

[Ir(5dptznppy)$_2$ppy)]

<Step 1: Synthesis of 2-[3-(4,6-diphenyl-1,3,5-triazin-2-yl)phenyl]pyridine (Abbreviation: H5dptznppy)>

The synthesis was conducted in a manner similar to Step 2 of Synthesis example 4 in Example 6.

<Step 2: Synthesis of [Ir(5dptznppy)$_2$(ppy)]>

Into a three-neck flask, 1.9 g of [Ir(ppy)$_2$Cl]$_2$ and 190 mL of dichloromethane were put, and the atmosphere in the flask was replaced with nitrogen. A mixed solution of 1.1 g of silver triflate and 90 mL of methanol was dripped thereinto, followed by stirring at room temperature for 20 hours. After the obtained mixture was filtered through Celite, concentration was performed, whereby a solid was obtained. To this solid, 2.0 g of H5dptznppy and 70 mL of ethanol were added, and reflux was performed for 24 hours under a nitrogen atmosphere. The obtained reactant was filtered and the residue was purified by silica gel column chromatography using dichloromethane as a developing solvent. After that, further purification was performed by high performance liquid chromatography using chloroform as a mobile phase. The obtained solution was concentrated and recrystallization was performed from a mixed solvent of dichloromethane and hexane, so that a yellow solid was obtained (yield: 3.5%). The synthesis scheme of Step 2 is shown below.

[Chemical 26]

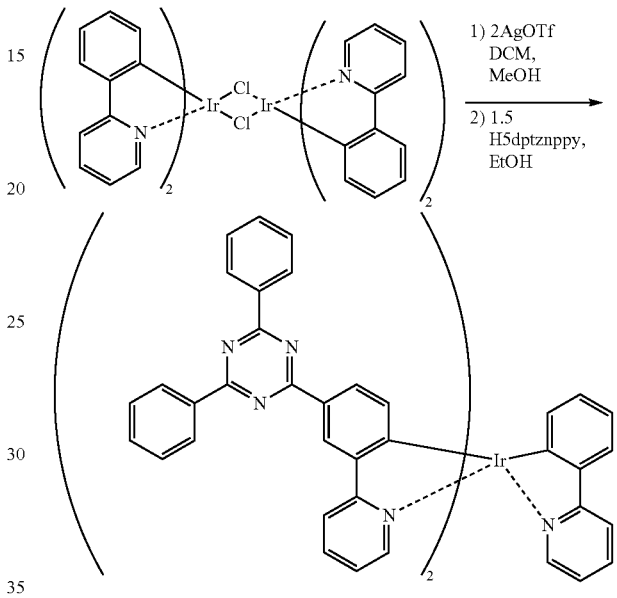

Figure 37:
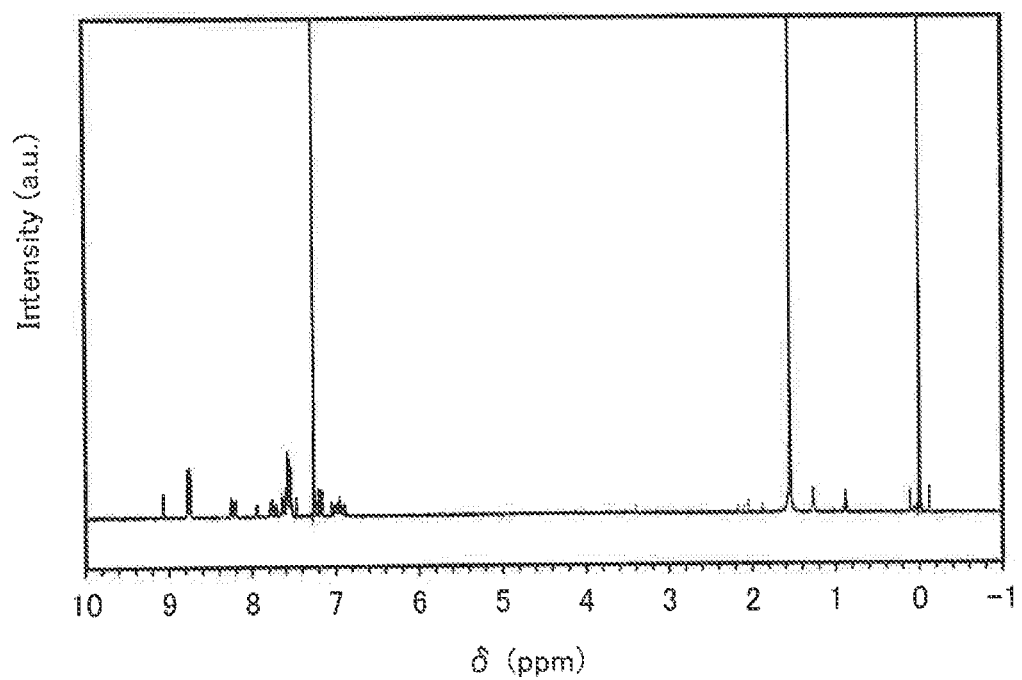
FIG. 37 A $^1$H-NMR spectrum of [Ir(5dptznppy)$_2$(ppy)].

Analysis results by nuclear magnetic resonance ($^1$H-NMR) spectroscopy of the yellow solid are shown below. FIG. 37 shows an $^1$H-NMR chart. These results revealed that the organometallic complex [Ir(5dptznppy)$_2$(ppy)], which is one embodiment of the present invention, was obtained in this synthesis example.

$^1$H-NMR δ (CDCl$_3$): 6.89-7.05 (m, 6H), 7.16 (d, 1H), 7.19 (d, 1H), 7.52-7.65 (m, 16H), 7.71 (d, 1H), 7.75-7.80 (m, 2H), 7.94 (d, 1H), 8.20-8.27 (m, 4H), 8.74 (d, 4H), 8.78 (d, 4H), 9.07 (d, 2H).

Figure 38:
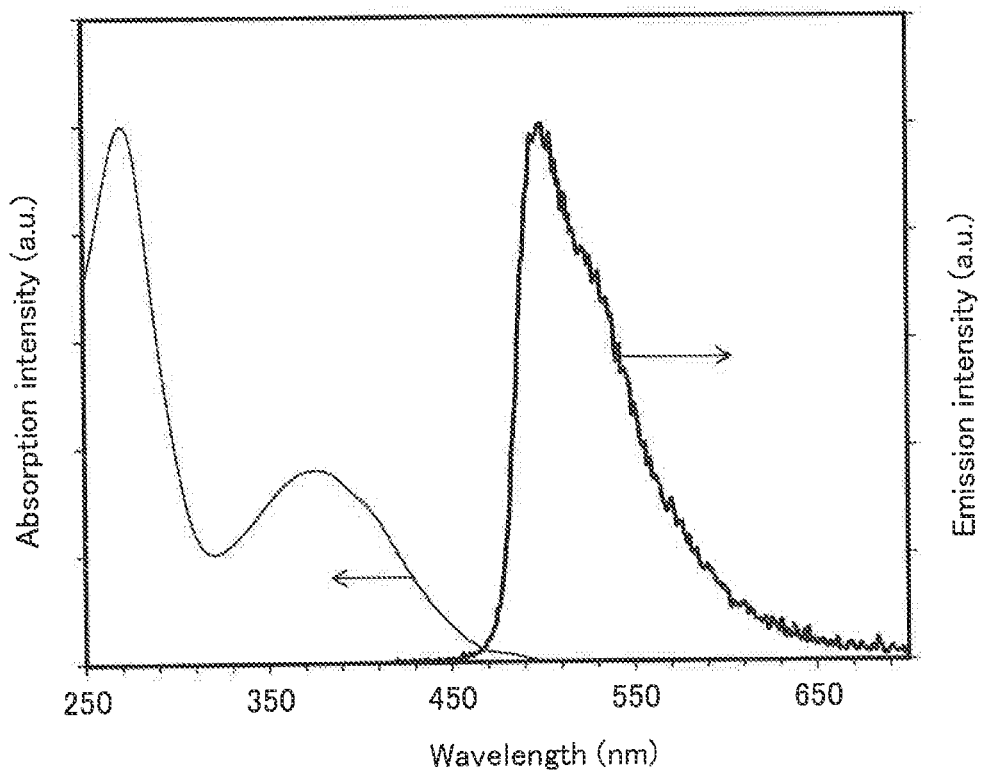
FIG. 38 An absorption spectrum and an emission spectrum of [Ir(5dptznppy)$_2$(ppy)].

Next, an ultraviolet-visible absorption spectrum (hereinafter, simply referred to as an "absorption spectrum") and an emission spectrum of a dichloromethane solution of [Ir(5dptznppy)$_2$(ppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 38 shows measurement results of the obtained absorption spectrum and emission spectrum. The horizontal axis represents wavelength and the vertical axes represent absorption intensity and emission intensity. In FIG. 38, two solid lines are shown; the thin solid line represents the absorption spectrum, and the thick solid line represents the emission spectrum. The absorption spectrum shown in FIG. 38 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 38, the organometallic complex [Ir(5dptznppy)₂(ppy)], which is one embodiment of the present invention, has an emission peak at 501 nm, and yellow-green light emission was observed from the dichloromethane solution.

Example 8

<<Synthesis Example 6>>

In this synthesis example, a method of synthesizing an organometallic complex [2-(4-diphenylamino-2-pyridinyl-κN)phenyl-κC]bis[2-(2-pyridinyl-κN)phenyl-κC]iridium (III) (abbreviation: [Ir(ppy)₂(dpappy)]), in which iridium is a central metal and which includes a ligand including a first skeleton having a hole-transport property and a second skeleton having a light-emitting property, is disclosed. A structural formula of [Ir(ppy)₂(dpappy)] is shown below.

[Chemical 27]

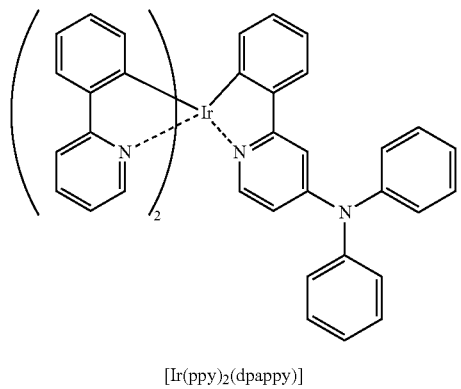

[Ir(ppy)₂(dpappy)]

<Step 1: Synthesis of 4-chloro-2-phenylpyridine>The synthesis of 4-chloro-2-phenylpyridine was conducted in a manner similar to Step 1 of Synthesis 1 in Example 1.

<Step 2: Synthesis of 4-diphenylamino-2-phenylpyridine (Abbreviation: Hdpappy)>

Next, 4.5 g of 4-chloro-2-phenylpyridine obtained in Step 1 above, 4.9 g of diphenylamine, and 4.1 g of sodium-tert-butoxide were put into a three-neck flask equipped with a reflux pipe, and the atmosphere in the flask was replaced with nitrogen. Furthermore, 105 mL of toluene, 0.57 mL of tri-tert-butylphosphine, and 1.1 g of tris(dibenzylideneacetone)dipalladium(0) (abbreviation: Pd₂(dba)₃) were added, and heating and stirring were performed at 120° C. for 5 hours. The obtained reactant was filtered and the solvent of the filtrate was distilled off, followed by purification by silica gel column chromatography using ethyl acetate:hexane=2:1 as a developing solvent, whereby 2.4 g of the object (a yield of 31%, a yellow solid) was obtained. The synthesis scheme of Step 2 is shown below.

[Chemical 28]

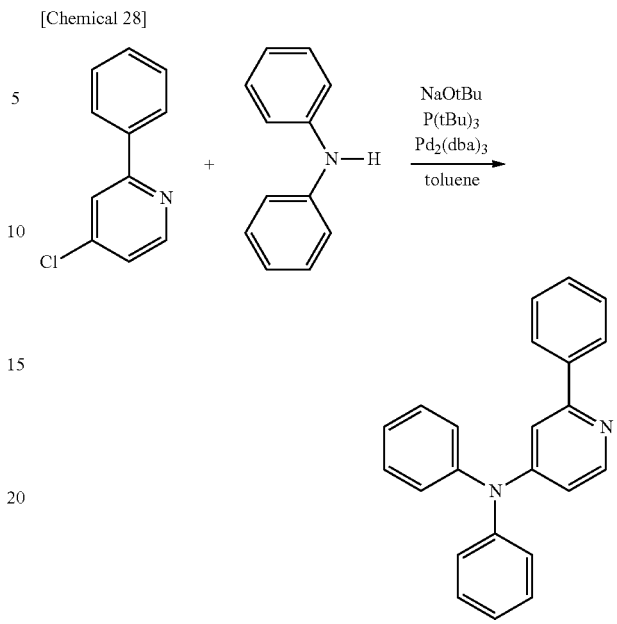

<Step 3: Synthesis of [2-(4-diphenylamino-2-pyridinyl-κN)phenyl-κC]bis[2-(2-pyridinyl-κN)phenyl-κC]iridium(III) (abbreviation: [Ir(ppy)₂(dpappy)])>

Next, 1.8 g of [Ir(ppy)₂Cl]₂ and 180 mL of dichloromethane were put into a three-neck flask, and the atmosphere in the flask was replaced with nitrogen. A mixed solution of 1.1 g of silver triflate and 86 mL of methanol was dripped thereinto, followed by stirring at room temperature for 20 hours. After the obtained mixture was filtered through Celite, concentration was performed, whereby a solid was obtained. To this solid, 1.5 g of Hdpappy obtained in Step 2 above, 35 mL of 2-ethoxyethanol, and 35 mL of N,N-dimethylformamide (abbreviation: DMF) were added, and reflux was performed for 17 hours under a nitrogen atmosphere. The obtained mixture was concentrated, followed by purification by silica gel column chromatography using dichloromethane:hexane=1:1 as a developing solvent. After that, further purification was performed by high performance liquid chromatography using chloroform as a mobile phase. The obtained solution was concentrated and recrystallization was performed from a mixed solvent of dichloromethane and hexane, so that an orange solid was obtained (yield: 20%).

By a train sublimation method, 0.41 g of the obtained orange solid was sublimated. The solid was heated under the sublimation purification conditions where the pressure was 1.5 Pa and the argon flow rate was 5 mL/min at 310° C. After the sublimation purification, an orange solid which was the object was obtained in a yield of 68%. The synthesis scheme of Step 3 is shown below.

[Chemical 29]

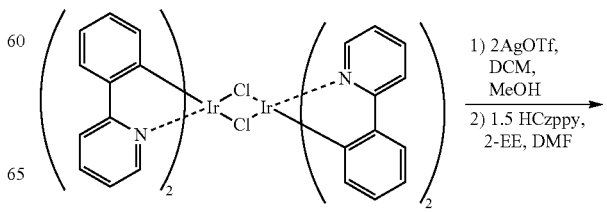

Figure 39:
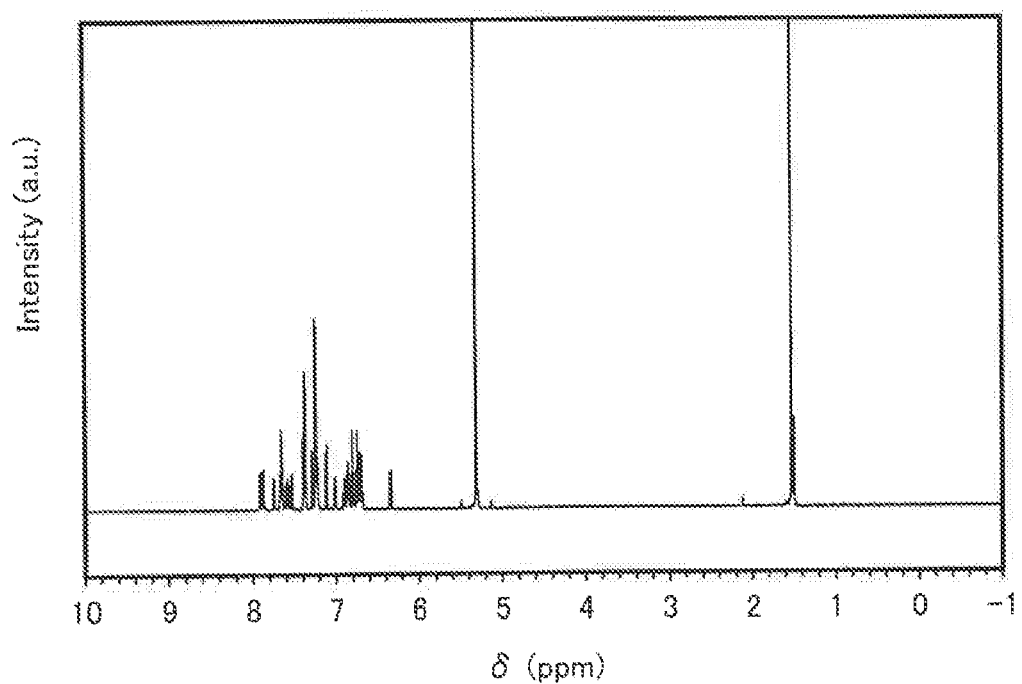
FIG. 39 A $^1$H-NMR spectrum of [Ir(ppy)$_2$(dpappy)].

Analysis results by nuclear magnetic resonance ($^1$H-NMR) spectroscopy of the orange solid obtained in Step 3 above are shown below. FIG. 39 shows an $^1$H-NMR chart. These results reveal that [Ir(ppy)$_2$(dpappy)] was obtained in this synthesis example.

$^1$H-NMR. δ (CD$_2$Cl$_2$): 6.34 (dd, 1H), 6.68-6.92 (m, 10H), 7.01 (t, 1H), 7.11 (d, 1H), 7.22-7.26 (m, 7H), 7.29 (d, 1H), 7.37-7.40 (m, 4H), 7.53 (d, 1H), 7.59 (t, 1H), 7.66 (t, 3H), 7.74 (d, 1H), 7.87 (d, 1H), 7.91 (d, 1H).

Figure 40:
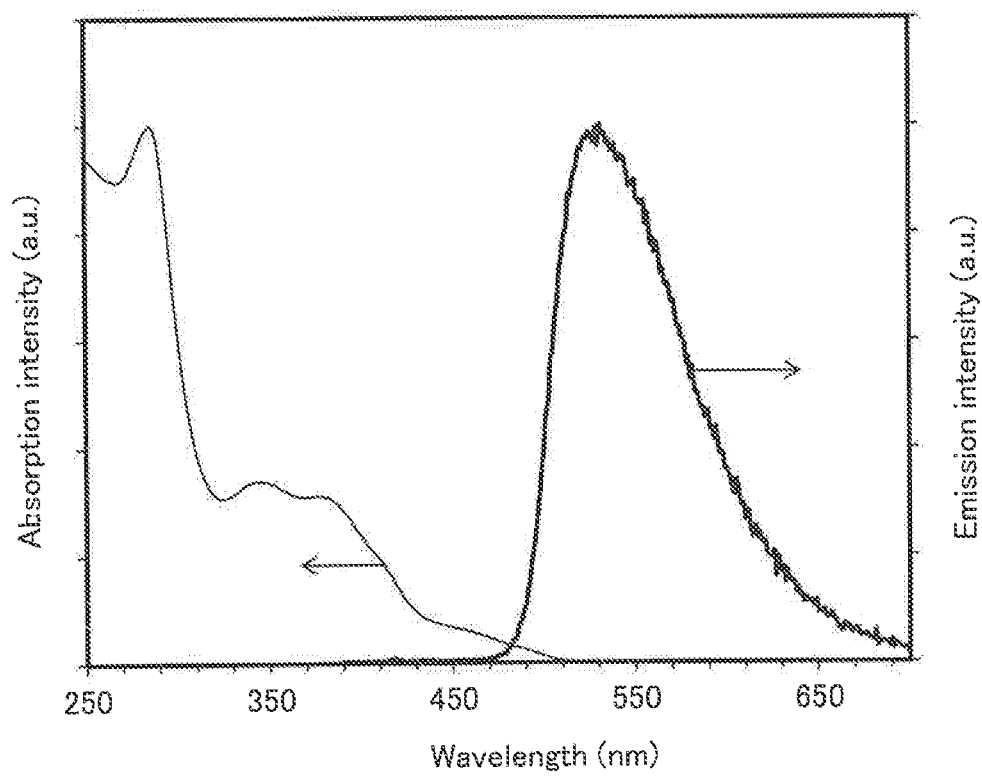
FIG. 40 An absorption spectrum and an emission spectrum of [Ir(ppy)$_2$(dpappy)].

Next, an ultraviolet-visible absorption spectrum (hereinafter, simply referred to as an "absorption spectrum") and an emission spectrum of a dichloromethane solution of [Ir(ppy)$_2$(dpappy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 40 shows measurement results of the obtained absorption spectrum and emission spectrum. The horizontal axis represents wavelength and the vertical axes represent absorption intensity and emission intensity. In FIG. 40, two solid lines are shown; the thin solid line represents the absorption spectrum, and the thick solid line represents the emission spectrum. The absorption spectrum shown in FIG. 40 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 40, the organometallic complex [Ir(ppy)$_2$(dpappy)], which is one embodiment of the present invention, has an emission peak at 531 nm, and yellow-green light emission was observed from the dichloromethane solution.

Example 9

<<Synthesis Example 7>>

This synthesis example shows a synthesis example of an organometallic complex bis[2-(4-diphenylamino-2-pyridinyl-κN)phenyl-κC][2-(2-pyridinyl-κN)phenyl-κC]iridium (III) (abbreviation: [Ir(dpappy)$_2$(ppy)]), in which iridium is a central metal and which includes a ligand including a first skeleton having a hole-transport property and a second skeleton having a light-emitting property. A structural formula of [Ir(dpappy)$_2$(ppy)] is shown below.

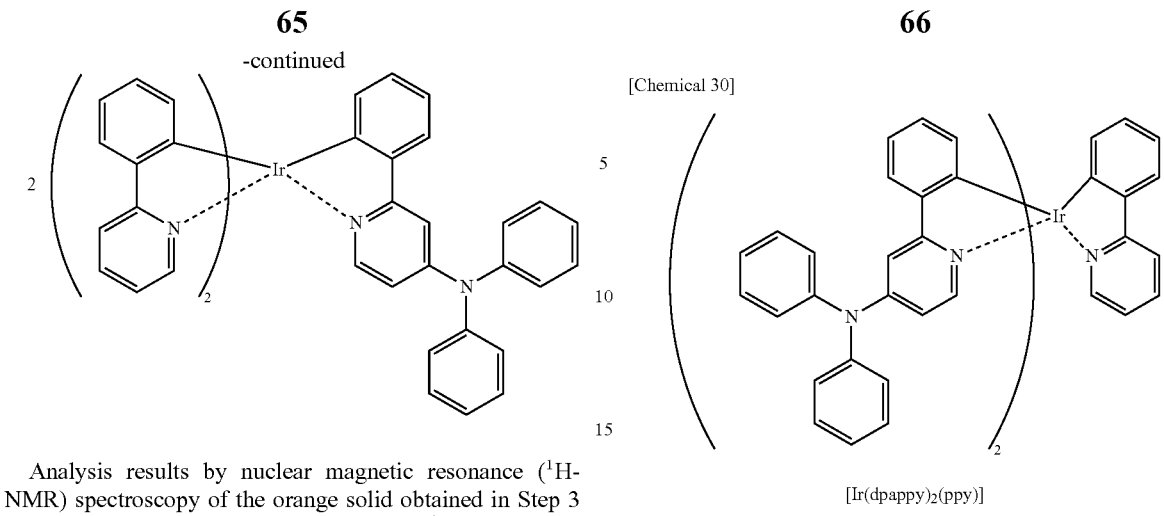

[Chemical 30]

[Ir(dpappy)$_2$(ppy)]

<Step 1: Synthesis of 4-chloro-2-phenylpyridine>

The synthesis of 4-chloro-2-phenylpyridine was conducted in a manner similar to Step 1 of Synthesis example 1 in Example 1.

<Step 2: Synthesis of 4-diphenylamino-2-phenylpyridine (Abbreviation: Hdpappy)>

The synthesis of Hdpappy was conducted in a manner similar to Step 2 of Synthesis example 6 in Example 8.

<Step 3: Synthesis of bis[2-(4-diphenylamino-2-pyridinyl-κN)phenyl-κC][2-(2-pyridinyl-κN)phenyl-κC]iridium(III) Abbreviation: [Ir(dpappy)$_2$(ppy)]>

First, 1.8 g of di-μ-chloro-tetrakis {2-[2-pyridinyl-κN]phenyl-κC}diiridium(III) (abbreviation: [Ir(ppy)$_2$Cl]$_2$) and 180 mL of dichloromethane were put into a three-neck flask, and the atmosphere in the flask was replaced with nitrogen. A mixed solution of 1.1 g of silver triflate and 86 mL of methanol was dripped thereinto, followed by stirring at room temperature for 20 hours. After the obtained mixture was filtered through Celite, concentration was performed, whereby a solid was obtained. To this solid, 1.5 g of Hdpappy, 35 mL of 2-ethoxyethanol (abbreviation: 2-EE), and 35 mL of N,N-dimethylformamide (abbreviation: DMF) were added, and reflux was performed for 17 hours under a nitrogen atmosphere. The obtained mixture was concentrated, followed by purification by silica gel column chromatography using dichloromethane:hexane=1:1 as a developing solvent. After that, further purification was performed by high performance liquid chromatography using chloroform as a mobile phase. The obtained solution was concentrated and recrystallization was performed from a mixed solvent of dichloromethane and hexane, so that an orange solid was obtained (yield: 7.7%).

By a train sublimation method, 0.22 g of the obtained orange solid was sublimated. The solid was heated under the sublimation purification conditions where the pressure was 1.5 Pa and the argon flow rate was 5 mL/min at 330° C. After the sublimation purification, an orange solid which was the object was obtained in a yield of 64%. The synthesis scheme of Step 3 is shown below.

[Chemical 31]

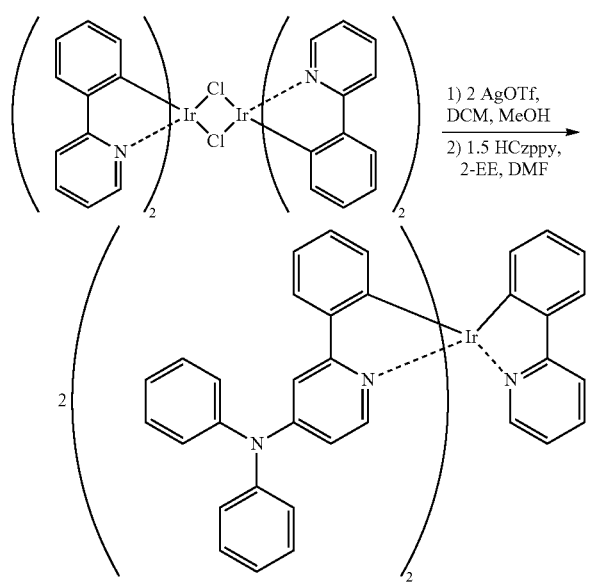

Figure 41:
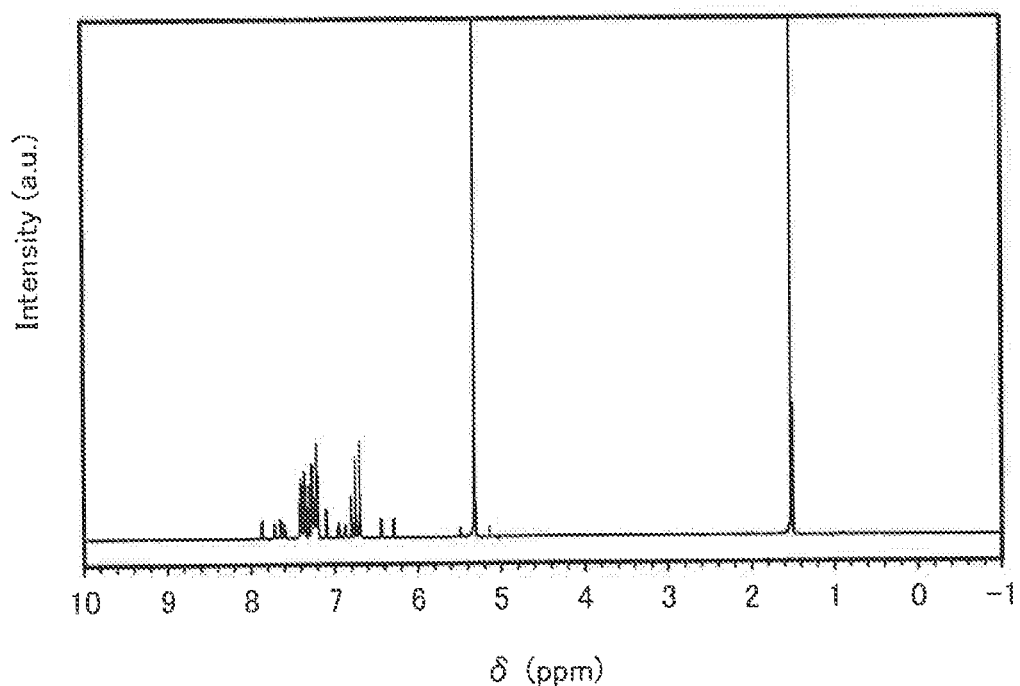
FIG. 41 A $^1$H-NMR spectrum of [Ir(dpappy)$_2$(ppy)].

Analysis results by nuclear magnetic resonance (¹H-NMR) spectroscopy of the orange solid obtained in Step 3 above are shown below. FIG. 41 shows an ¹H-NMR chart. These results revealed that the organometallic complex [Ir(dpappy)$_2$(ppy)], which is one embodiment of the present invention, was obtained in this synthesis example.

¹H-NMR δ (CD$_2$Cl$_2$): 6.29 (dd, 1H), 6.43 (dd, 1H), 6.72-6.69 (m, 3H), 6.75-7.73 (m, 2H), 6.80-6.79 (m, 2H), 6.89-6.86 (m, 1H), 6.95 (t, 1H), 7.10 (d, 1H), 7.42-7.19 (m, 26H), 7.60 (t, 1H), 7.65 (d, 1H), 7.71 (d, 1H), 7.87 (d, 1H).

Figure 42:
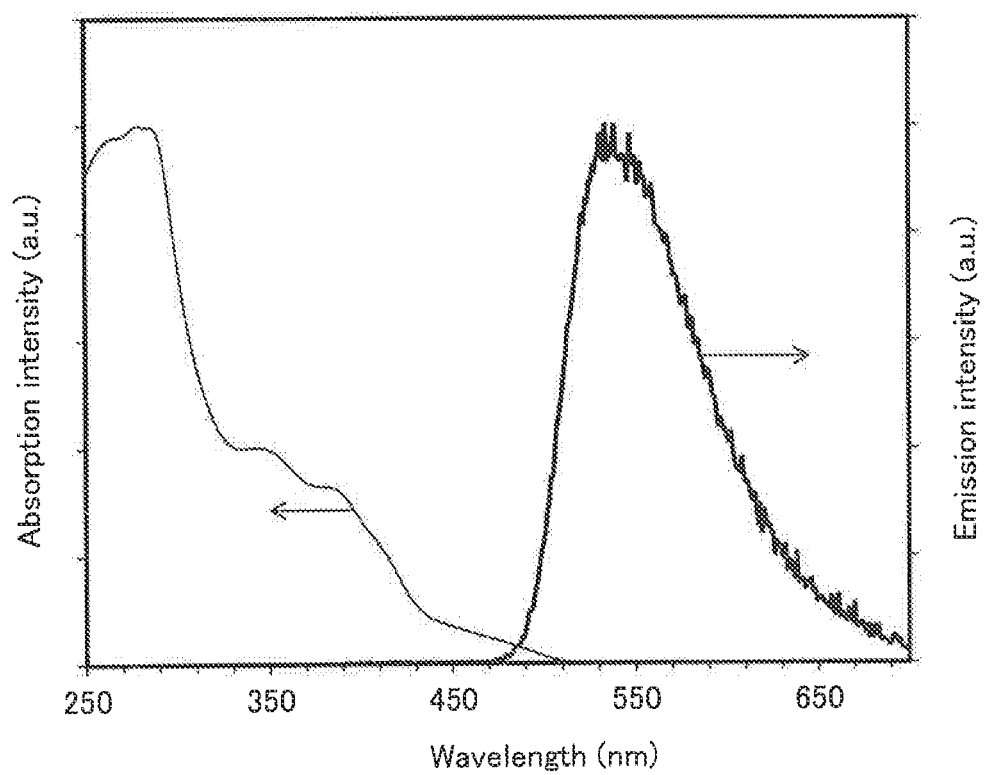
FIG. 42 An absorption spectrum and an emission spectrum of [Ir(dpappy)$_2$(ppy)].

Next, an ultraviolet-visible absorption spectrum (hereinafter, simply referred to as an "absorption spectrum") and an emission spectrum of a dichloromethane solution of [Ir(dpappy)$_2$(ppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 42 shows measurement results of the obtained absorption spectrum and emission spectrum. The horizontal axis represents wavelength and the vertical axes represent absorption intensity and emission intensity. In FIG. 42, two solid lines are shown; the thin solid line represents the absorption spectrum, and the thick solid line represents the emission spectrum. The absorption spectrum shown in FIG. 42 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 42, the organometallic complex [Ir(dpappy)$_2$(ppy)], which is one embodiment of the present invention, has an emission peak at 534 nm, and yellow-green light emission was observed from the dichloromethane solution.

Example 10

<<Synthesis Example 8>>

This synthesis example shows a synthesis example of an organometallic complex [4-(4,6-diphenyl-1,3,5-triazin-2-yl)-2-(4-methyl-5-phenyl-2-pyridinyl-κN)phenyl-κC]bis[2-(4-methyl-5-phenyl-2-pyridinyl-κN)phenyl-κC]iridium(III) (abbreviation: [Ir(mdppy)$_2$(5dptznmdppy)]), in which iridium is a central metal and which includes a ligand including a first skeleton having an electron-transport property and a second skeleton having a light-emitting property. A structural formula of [Ir (mdppy)$_2$(5dptznmdppy)] is shown below.

[Chemical 32]

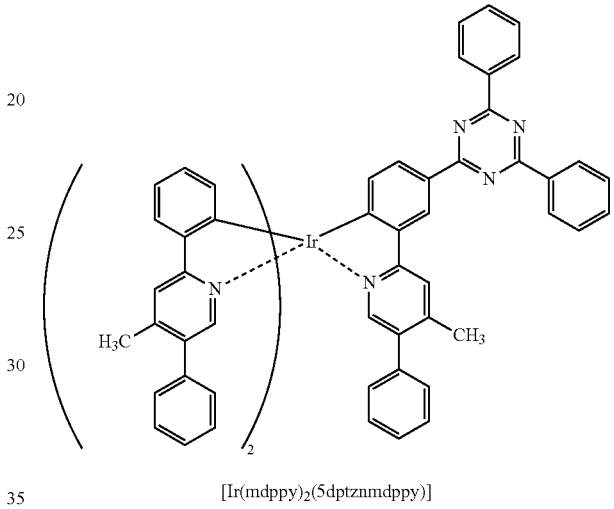

[Ir(mdppy)$_2$(5dptznmdppy)]

<Step 1: Synthesis of 3-(4,6-diphenyl-1,3,5-triazin-2-yl) phenylboronic acid pinacol ester>

First, 10 g of 2-(3-bromophenyl)-4,6-diphenyl-1,3,5-triazine, 7.9 g of bis(pinacolato)diboron (abbreviation: (Bpin)$_2$), 7.6 g of potassium acetate, and 125 mL of DMF were put into a three-neck flask equipped with a reflux pipe, and the atmosphere in the flask was replaced with nitrogen. Furthermore, 0.21 g of [1,1'-bis(diphenylphosphino)ferrocene]palladium(II) dichloride dichloromethane adduct (abbreviation: Pd(dppf)$_2$Cl$_2$CH$_2$Cl$_2$) was added, and heating and stirring were performed at 150° C. for 3 hours. The solvent of the obtained reaction solution was distilled off and the residue was purified by silica gel column chromatography using toluene as a developing solvent, whereby 7.1 g of the object was obtained (a yield of 63%, a white solid). The synthesis scheme of Step 1 is shown below.

[Chemical 33]

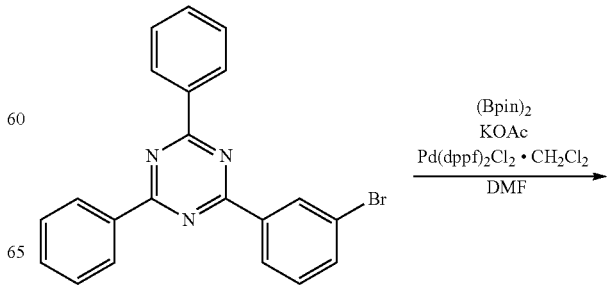

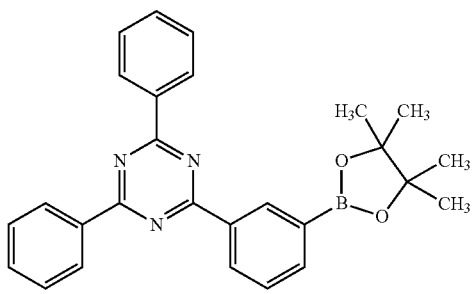

<Step 2: Synthesis of 5-bromo-2-[3-(4,6-diphenyl-1,3,5-triazin-2-yl)phenyl]-4-methylpyridine>

Next, 6.0 g of 3-(4,6-diphenyl-1,3,5-triazin-2-yl)phenylboronic acid pinacol ester obtained in Step 1 above, 4.4 g of 2,5-dibromo-4-methylpyridine, a solution obtained by dissolving 3.9 g of sodium carbonate into 21 mL of water, 84 mL of toluene, and 21 mL of ethanol were put into a three-neck flask equipped with a reflux pipe, and the atmosphere in the flask was replaced with nitrogen. Furthermore, 0.64 g of tetrakis(triphenylphosphine)palladium(0) was added, and heating and stirring were performed at 100° C. for 13 hours. After the reaction, extraction was performed with toluene. The solvent was distilled off, and recrystallization was performed from a mixed solvent of ethyl acetate and hexane, whereby 6.4 g of the object (a yield of 97%, a white solid) was obtained. The synthesis scheme of Step 2 is shown below.

[Chemical 34]

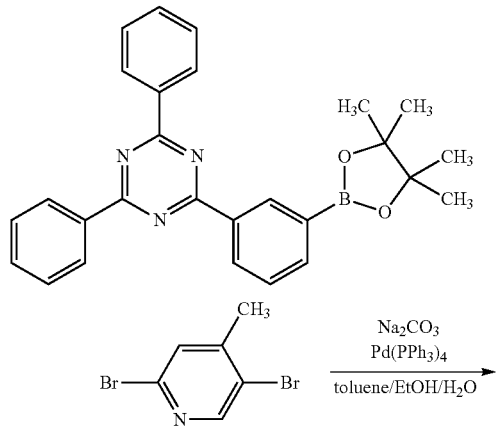

<Step 3: Synthesis of 2-[3-(4,6-diphenyl-1,3,5-triazin-2-yl)phenyl]-4-methyl-5-phenylpyridine (Abbreviation: H5-dptznmdppy)>

Next, 6.4 g of 5-bromo-2-[3-(4,6-diphenyl-1,3,5-triazin-2-yl)phenyl]-4-methylpyridine obtained in Step 2 above, 1.8 g of phenylboronic acid, 3.4 g of tripotassium phosphate, 65 mL of toluene, and 6.5 mL of water were put into a three-neck flask equipped with a reflux pipe, and the atmosphere in the flask was replaced with nitrogen. Furthermore, 0.22 g of 2-dicyclohexylphosphino-2',6'-dimethoxybiphenyl (abbreviation: SPhos) and 0.12 g of tris(dibenzylideneacetone)dipalladium(0) (abbreviation: $Pd_2(dba)_3$) were added, and the mixture was heated for 8 hours. After reaction, extraction was performed with toluene. After that, purification was performed by silica gel column chromatography using toluene as a developing solvent, whereby 5.4 g of the object (a yield of 86%, a pale yellow solid) was obtained. The synthesis scheme of Step 3 is shown below.

[Chemical 35]

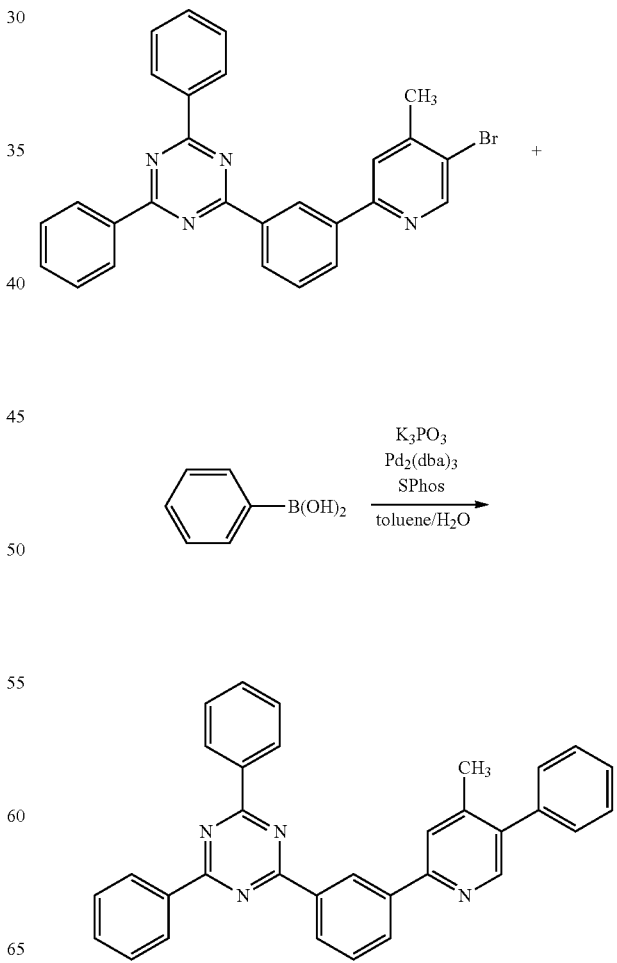

<Step 4: Synthesis of di-μ-chloro-tetrakis[2-(4-methyl-5-phenyl-2-pyridinyl-κN)phenyl-κC]diiridium(III) (Abbreviation: [Ir(mdppy)₂Cl]₂)>

Next, 3.2 g of 4-methyl-2,5-diphenylpyridine (abbreviation: Hmdppy), 1.9 g of iridium(III) chloride hydrate, 21 mL of 2-ethoxyethanol (abbreviation: 2-EE), and 7 mL of water were put into a round-bottom flask equipped with a reflux pipe and microwave irradiation (2.45 GHz, 100 W) was performed for 1 hour while argon bubbling was performed. The obtained mixture was filtered, followed by washing with methanol, whereby 3.2 g of the object (a yield of 72%, a yellow solid) was obtained. The synthesis scheme of Step 4 is shown below.

[Chemical 36]

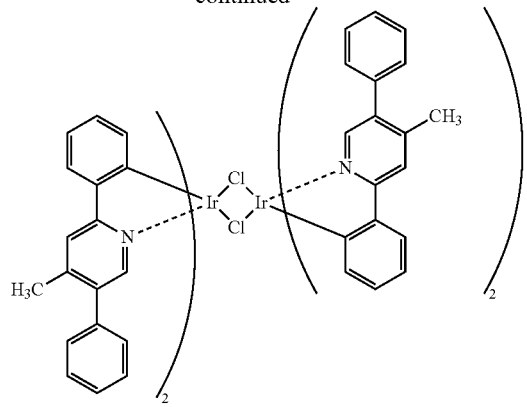

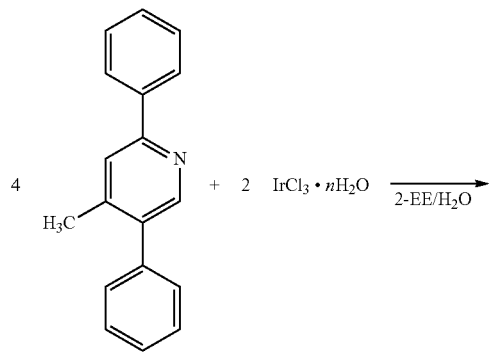

<Step 5: [4-(4,6-diphenyl-1,3,5-triazin-2-yl)-2-(4-methyl-5-phenyl-2-pyridinyl-κN)phenyl-κC]bis[2-(4-methyl-5-phenyl-2-pyridinyl-κN]phenyl-κC]iridium(III) (Abbreviation: [Ir(mdppy)₂(5dptznmdppy)])>

Next, 3.2 g of [Ir(mdppy)₂Cl]₂ obtained in Step 4 above and 230 mL of dichloromethane were put into a three-neck flask, and the atmosphere in the flask was replaced with nitrogen. A mixed solution of 1.5 g of silver triflate and 110 mL of methanol was dripped thereinto, followed by stirring at room temperature for 20 hours. After the obtained mixture was filtered through Celite, concentration was performed, whereby a solid was obtained. To this solid, 5.4 g of H5dptznmdppy obtained in Step 3 above and 75 mL of ethanol were added, and reflux was performed for 17 hours under a nitrogen atmosphere. The obtained reactant was filtered and the residue was purified by silica gel column chromatography using chloroform as a developing solvent. After that, further purification was performed by high performance liquid chromatography using chloroform as a mobile phase. The obtained solution was concentrated and recrystallization was performed from a mixed solvent of chloroform and hexane, so that a yellow solid was obtained (yield: 41%). The synthesis scheme of Step 5 is shown below.

[Chemical 37]

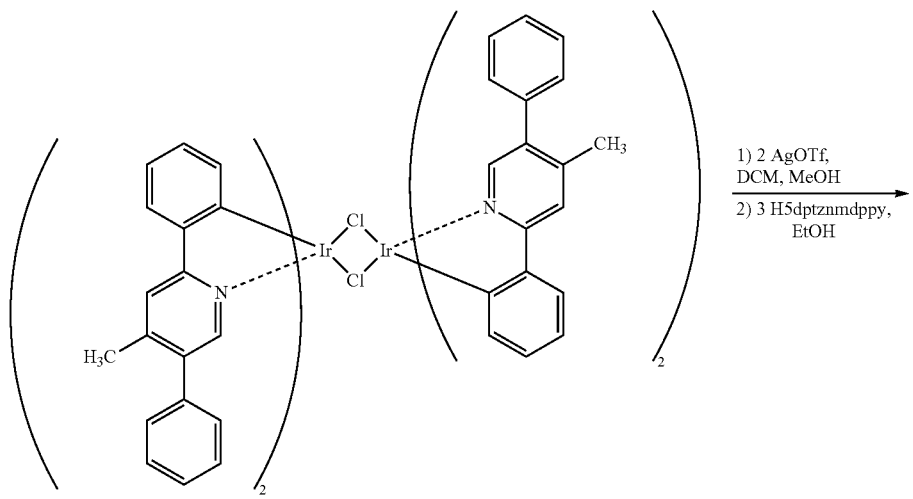

-continued

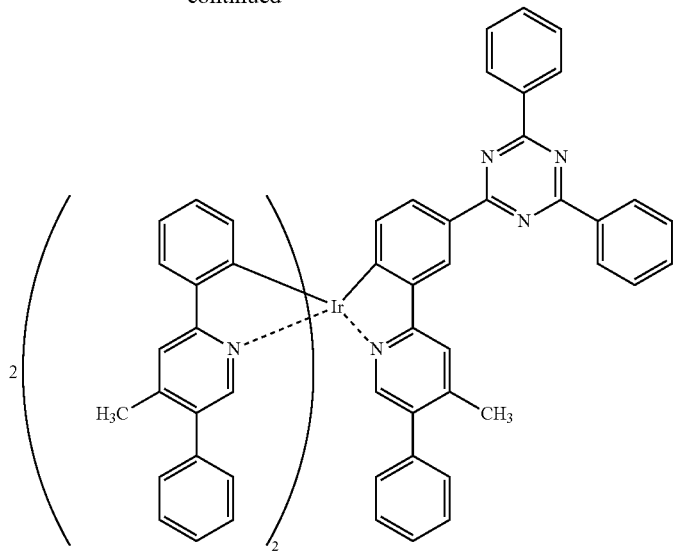

Figure 43:
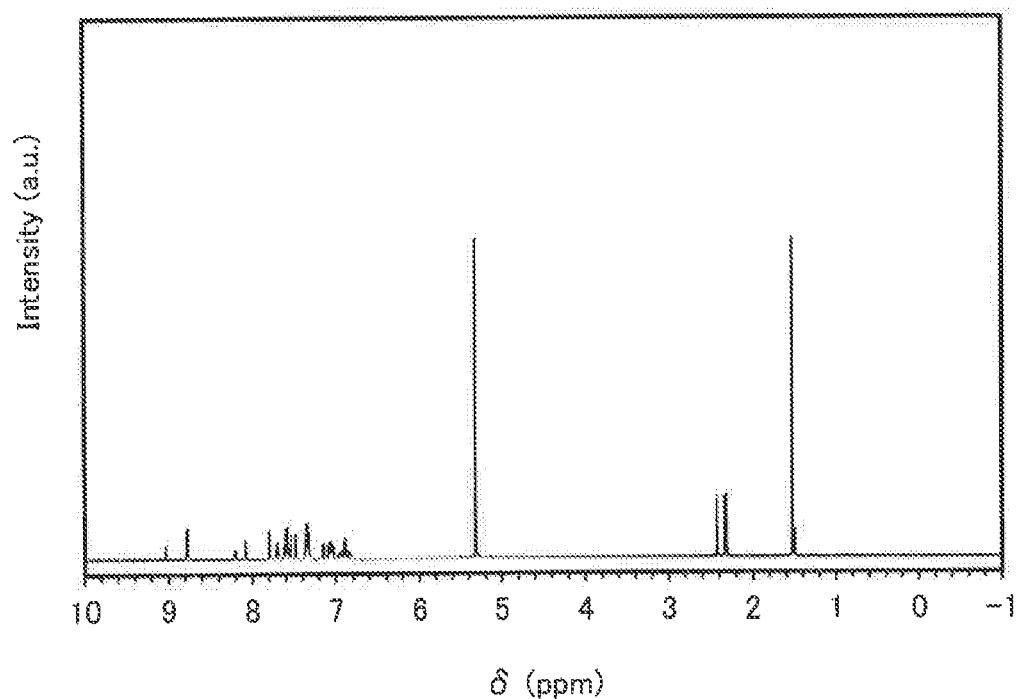
FIG. 43 A $^1$H-NMR spectrum of [Ir(mdppy)$_2$(5dptznmdppy)].

Analysis results by nuclear magnetic resonance (¹H-NMR) spectroscopy of the yellow solid obtained by Step 5 above are shown below. FIG. 43 shows an ¹H-NMR chart. These results revealed that [Ir(mdppy)₂(5dptznmdppy)] was obtained in this synthesis example.

¹H-NMR. δ (CD₂Cl₂): 2.31 (s, 3H), 2.34 (s, 3H), 2.43 (s, 3H), 6.83-6.98 (m, 6H), 7.03-7.09 (m, 6H), 7.15 (d, 1H), 7.30-7.39 (m, 9H), 7.49 (d, 2H), 7.54 (s, 1H), 7.57-7.63 (m, 6H), 7.70 (t, 2H), 7.80 (s, 2H), 8.08 (s, 1H), 8.21 (d, 1H), 8.78 (d, 4H), 9.03 (s, 1H).

Figure 44:
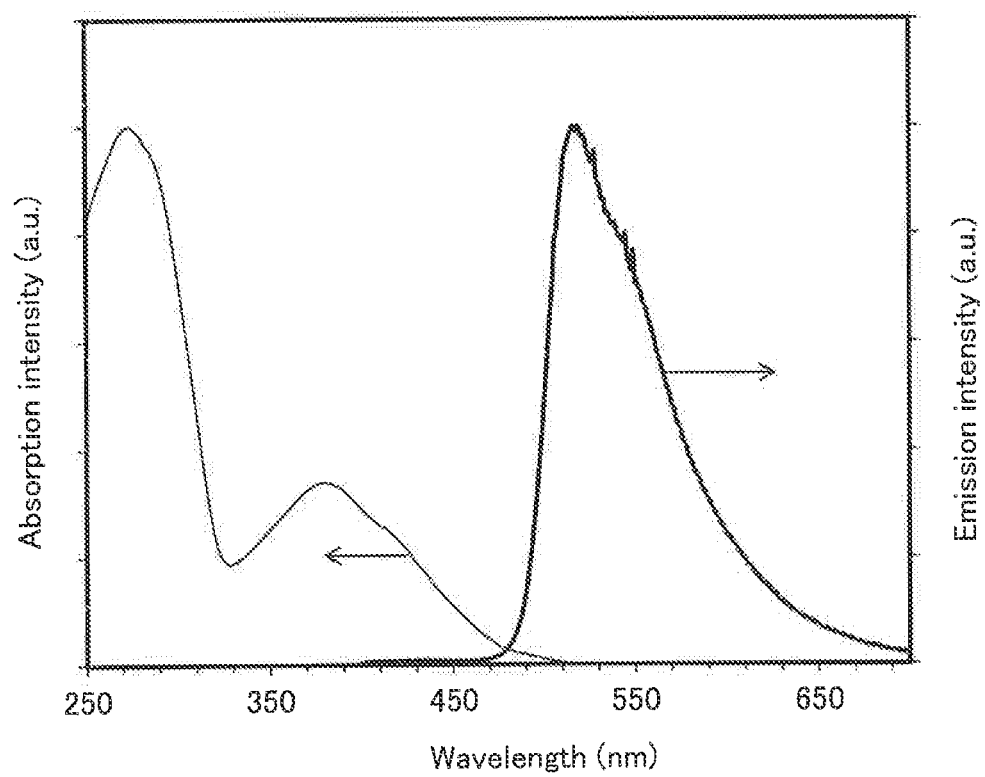
FIG. 44 An absorption spectrum and an emission spectrum of [Ir(mdppy)$_2$(5dptznmdppy)].

Next, an ultraviolet-visible absorption spectrum (hereinafter, simply referred to as an "absorption spectrum") and an emission spectrum of a dichloromethane solution of [Ir(mdppy)₂(5dptznmdppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 44 shows measurement results of the obtained absorption spectrum and emission spectrum. The horizontal axis represents wavelength and the vertical axes represent absorption intensity and emission intensity. In FIG. 44, two solid lines are shown; the thin solid line represents the absorption spectrum, and the thick solid line represents the emission spectrum. The absorption spectrum shown in FIG. 44 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 44, the organometallic complex [Ir(mdppy)₂(5dptznmdppy)], which is one embodiment of the present invention, has an emission peak at 519 nm, and yellow-green light emission was observed from the dichloromethane solution.

Example 11

<<Synthesis Example 9>>

In this synthesis example, a synthesis example of an organometallic complex bis[4-(4,6-diphenyl-1,3,5-triazin-2-yl)-2-(4-methyl-5-phenyl-2-pyridinyl-κN)phenyl-κC][2-(4-methyl-5-phenyl-2-pyridinyl-κN)phenyl-κC]iridium(III) (abbreviation: [Ir(5dptznmdppy)₂(mdppy)]), in which iridium is a central metal and which includes a ligand including a first skeleton having an electron-transport property and a second skeleton having a light-emitting property, is disclosed. A structural formula of [Ir(5dptznmdppy)₂(mdppy)] is shown below.

[Chemical 38]

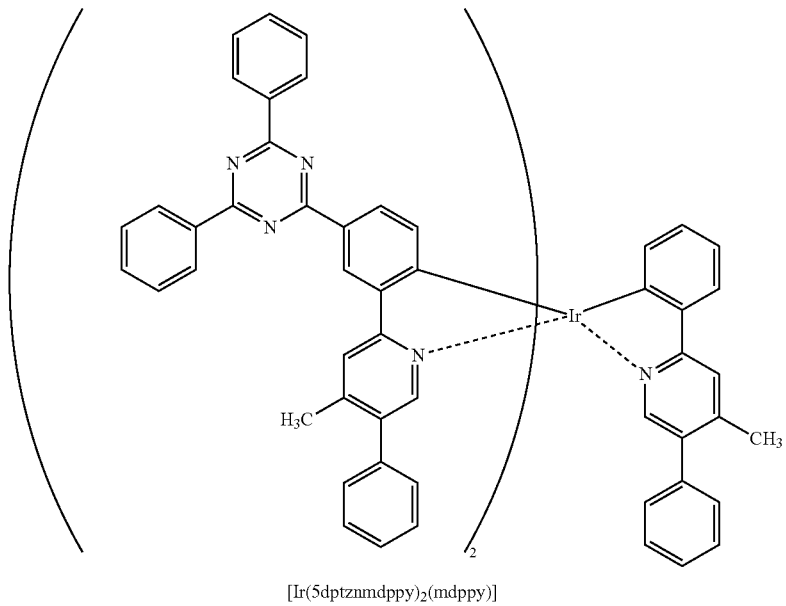

[Ir(5dptznmdppy)₂(mdppy)]

<Step 1: Synthesis of 3-(4,6-diphenyl-1,3,5-triazin-2-yl) phenylboronic acid pinacol ester>

The synthesis of 3-(4,6-diphenyl-1,3,5-triazin-2-yl)phenylboronic acid pinacol ester was conducted in a manner similar to Step 1 of Synthesis example 8 in Example 10.

<Step 2: Synthesis of 5-bromo-2-[3-(4,6-diphenyl-1,3,5-triazin-2-yl)phenyl]-4-methylpyridine>

The synthesis of 5-bromo-2-[3-(4,6-diphenyl-1,3,5-triazin-2-yl)phenyl]-4-methylpyridine was conducted in a manner similar to Step 2 of Synthesis example 8 in Example 10.

<Step 3: Synthesis of 2-[3-(4,6-diphenyl-1,3,5-triazin-2-yl)phenyl]-4-methyl-5-phenylpyridine (Abbreviation: H5dptznmdppy)>

The synthesis of H5dptznmdppy was conducted in a manner similar to Step 3 of Synthesis example 8 in Example 10.

<Step 4: Synthesis of di-µ-chloro-tetrakis [2-(4-methyl-5-phenyl-2-pyridinyl-κN]phenyl-κC]diiridium(III) (Abbreviation: [Ir(mdppy)₂Cl]₂)>

The synthesis of [Ir(mdppy)₂Cl]₂ was conducted in a manner similar to Step 4 of Synthesis example 8 in Example 10.

<Step 5: Synthesis of [Ir(5dptznmdppy)₂(mdppy)]>

Into a three-neck flask, 3.2 g of [Ir(mdppy)₂Cl]₂ synthesized in Step 4 and 230 mL of dichloromethane were put, and the atmosphere in the flask was replaced with nitrogen. A mixed solution of 1.5 g of silver triflate and 110 mL of methanol was dripped thereinto, followed by stirring at room temperature for 20 hours. After the obtained mixture was filtered through Celite, concentration was performed, whereby a solid was obtained. To this solid, 5.4 g of H5dptznmdppy synthesized in Step 3 and 75 mL of ethanol were added, and reflux was performed for 17 hours under a nitrogen atmosphere. The obtained reactant was filtered and the residue was purified by silica gel column chromatography using chloroform as a developing solvent. After that, further purification was performed by high performance liquid chromatography using chloroform as a mobile phase. The obtained solution was concentrated and recrystallization was performed from a mixed solvent of chloroform and hexane, so that a yellow solid was obtained (yield: 7.1%). The synthesis scheme of Step 5 is shown below.

[Chemical 39]

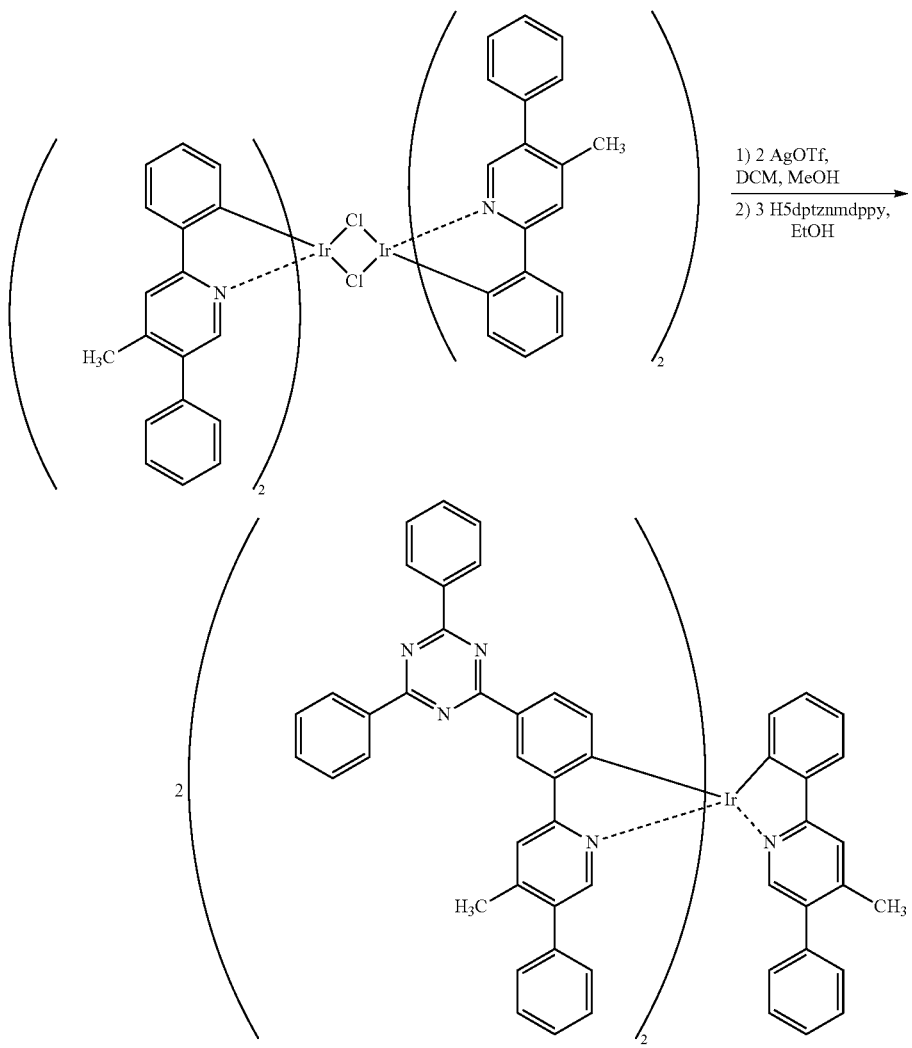

Figure 45:
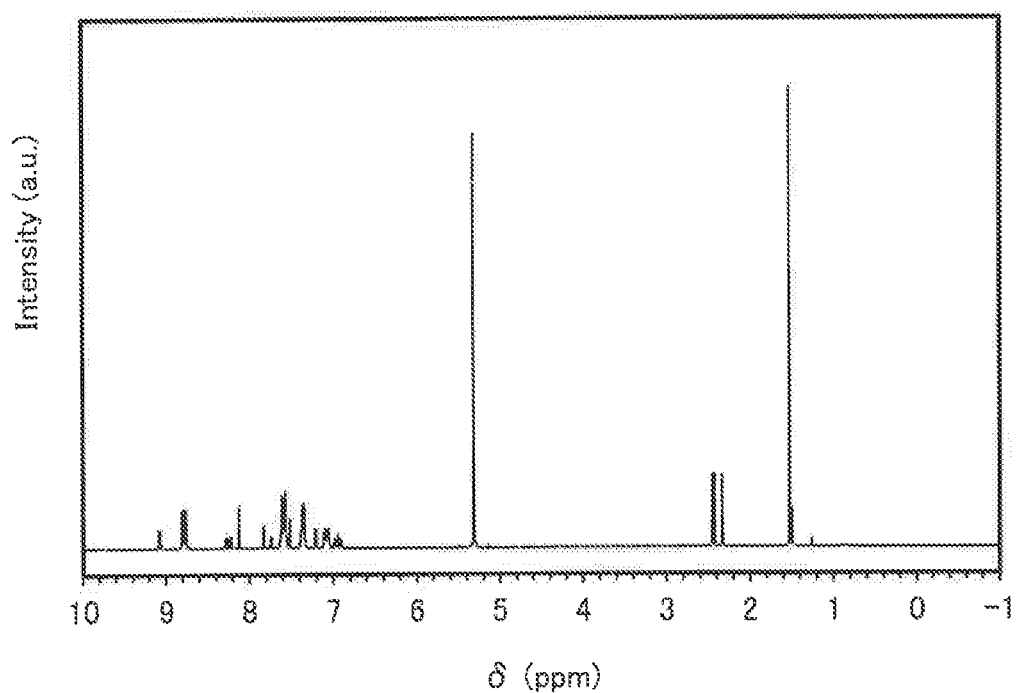
FIG. 45 A $^1$H-NMR spectrum of [Ir(5dptznmdppy)$_2$(mdppy)].

Analysis results by nuclear magnetic resonance ($^1$H-NMR) spectroscopy of the yellow solid obtained by Step 5 above are shown below. FIG. 45 shows an $^1$H-NMR chart. These results revealed that the organometallic complex [Ir(5dptznmdppy)$_2$(mdppy)], which is one embodiment of the present invention, was obtained in this synthesis example.

$^1$H-NMR δ (CD$_2$Cl$_2$): 2.34 (s, 3H), 2.43 (s, 3H), 2.45 (s, 3H), 6.89-7.00 (m, 3H), 7.05-7.12 (m, 6H), 7.20 (dd, 2H), 7.31-7.40 (m, 9H), 7.51 (s, 1H), 7.55-7.65 (m, 14H), 7.74 (d, 1H), 7.83 (s, 1H), 8.12 (s, 2H), 8.22 (d, 1H), 8.27 (d, 1H) 8.76 (d, 4H), 8.80 (d, 4H), 9.08 (d, 2H).

Figure 46:
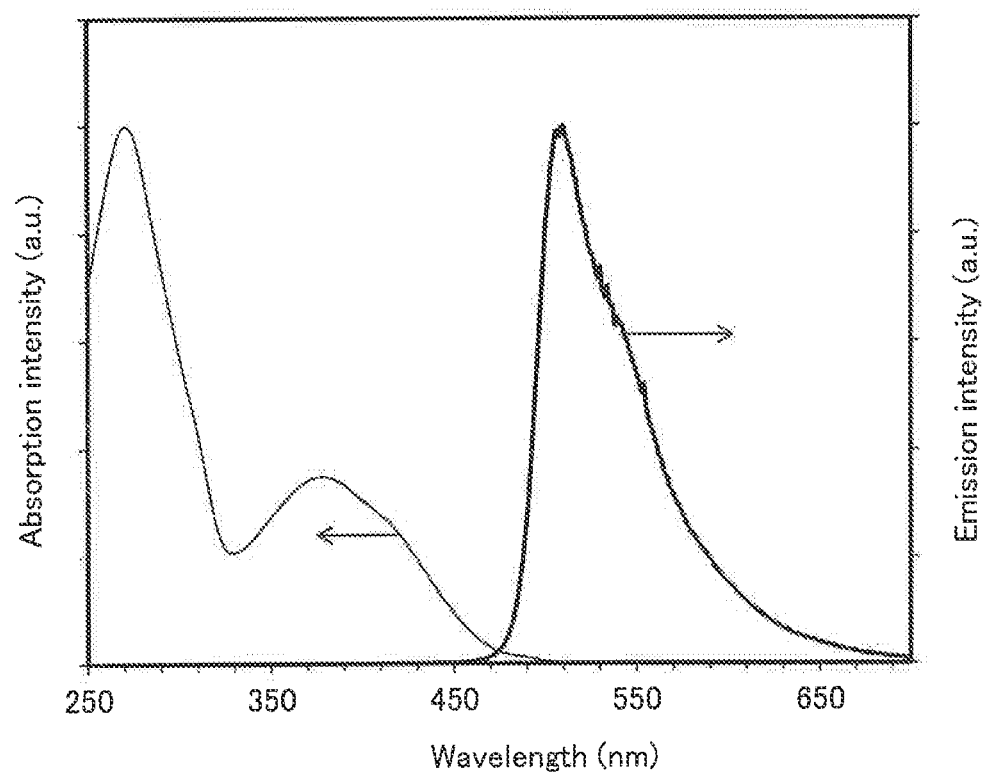
FIG. 46 An absorption spectrum and an emission spectrum of [Ir(5dptznmdppy)$_2$(mdppy)].
Figure 47:
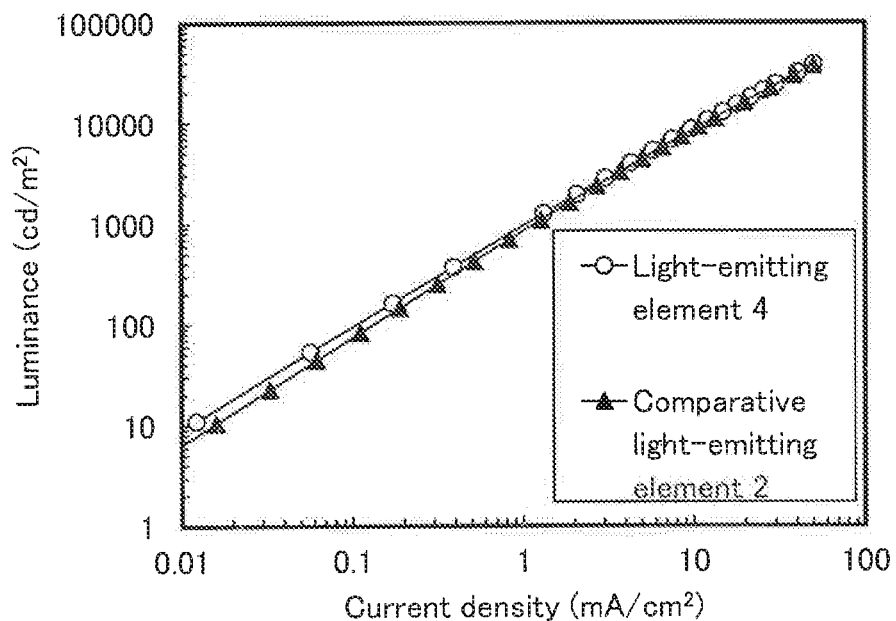
FIG. 47 Luminance-current density characteristics of a light-emitting element 4 and a comparative light-emitting element 2.
Figure 48:
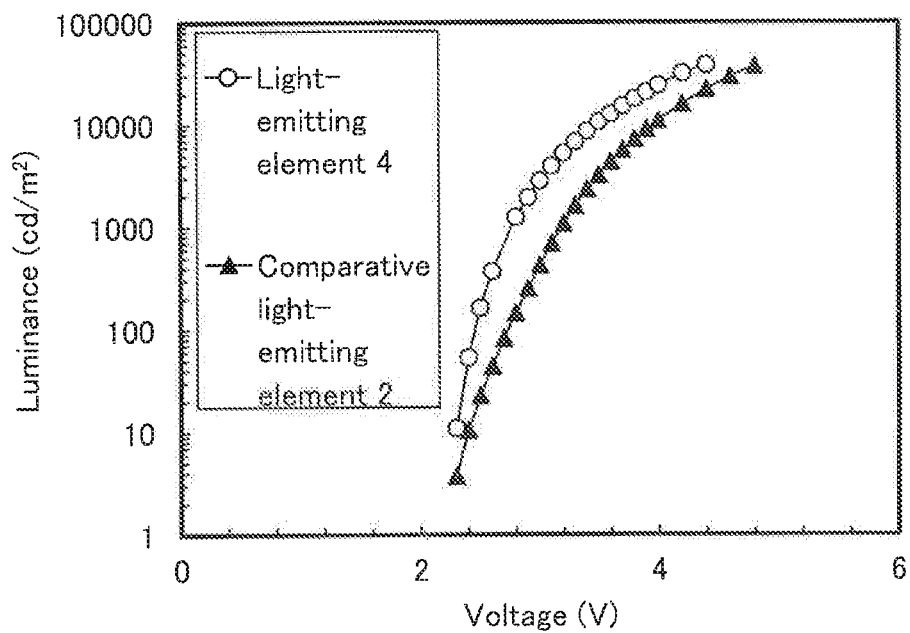
FIG. 48 Current efficiency-luminance characteristics of the light-emitting element 4 and the comparative light-emitting element 2.
Figure 49:
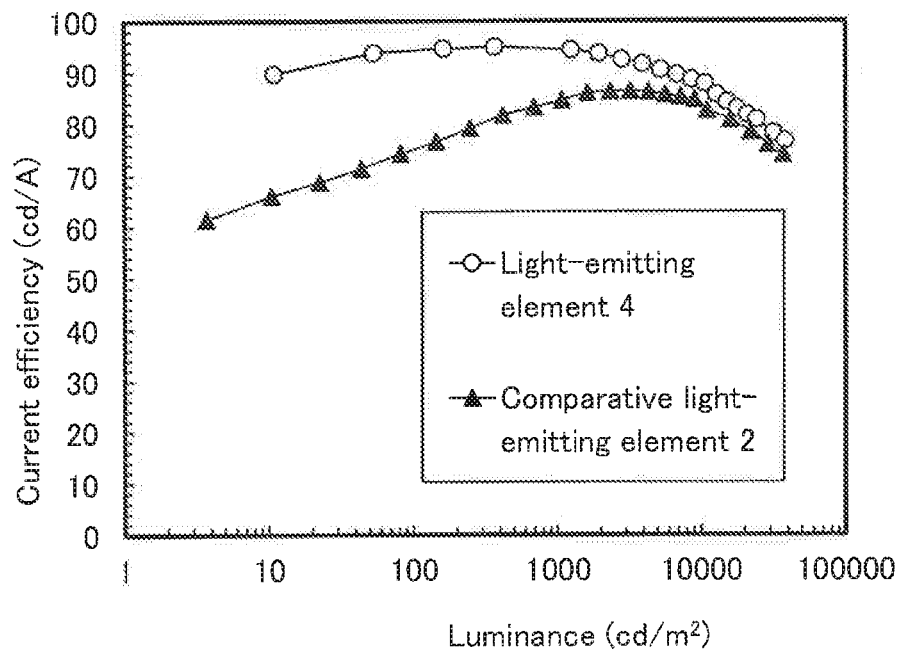
FIG. 49 Luminance-voltage characteristics of the light-emitting element 4 and the comparative light-emitting element 2.
Figure 50:
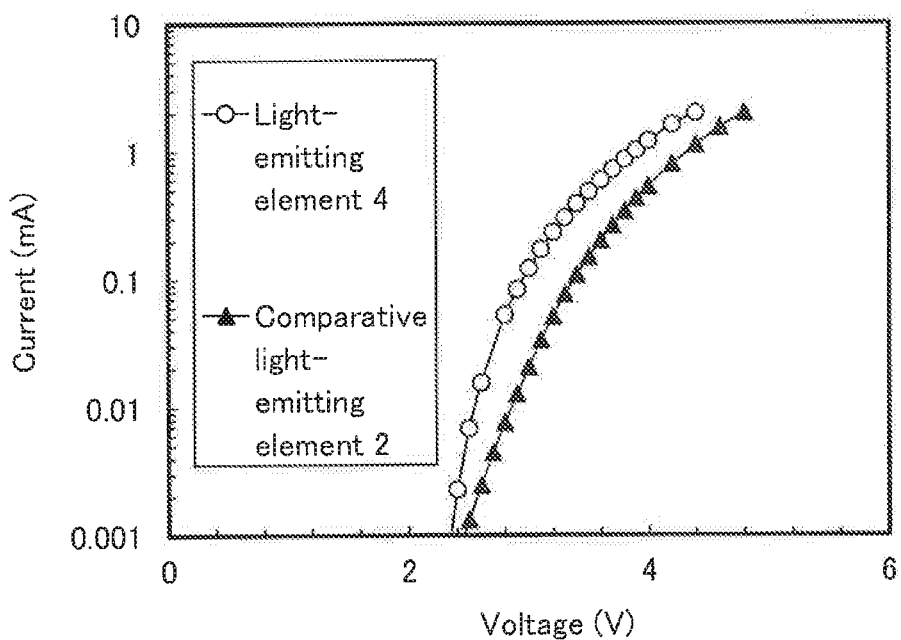
FIG. 50 Current-voltage characteristics of the light-emitting element 4 and the comparative light-emitting element 2.
Figure 51:
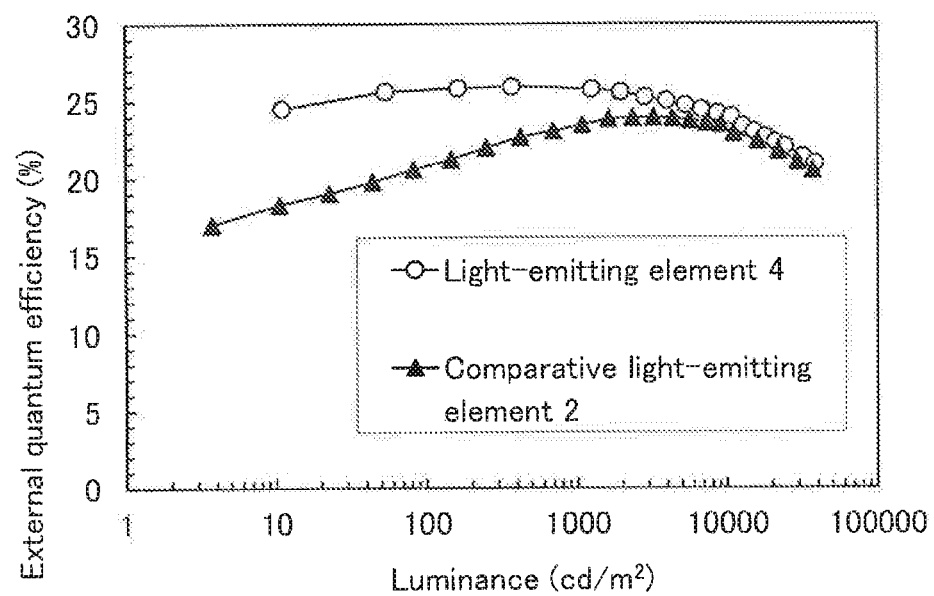
FIG. 51 External quantum efficiency-luminance characteristics of the light-emitting element 4 and the comparative light-emitting element 2.

Next, an ultraviolet-visible absorption spectrum (hereinafter, simply referred to as an "absorption spectrum") and an emission spectrum of a dichloromethane solution of [Ir(5dptznmdppy)$_2$(mdppy)] were measured. The measurement of the absorption spectrum was conducted at room temperature, for which an ultraviolet-visible spectrophotometer (V550 type manufactured by JASCO Corporation) was used and the dichloromethane solution (0.010 mmol/L) was put into a quartz cell. The measurement of the emission spectrum was conducted at room temperature, for which a fluorescence spectrophotometer (FS920 manufactured by Hamamatsu Photonics K.K.) was used and the degassed dichloromethane solution (0.010 mmol/L) was put into a quartz cell. FIG. 46 shows measurement results of the obtained absorption spectrum and emission spectrum. The horizontal axis represents wavelength and the vertical axes represent absorption intensity and emission intensity. In FIG. 46, two solid lines are shown; the thin solid line represents the absorption spectrum, and the thick solid line represents the emission spectrum. The absorption spectrum shown in FIG. 46 is the results obtained in such a way that the absorption spectrum measured by putting only dichloromethane in a quartz cell was subtracted from the absorption spectrum measured by putting the dichloromethane solution (0.010 mmol/L) in a quartz cell.

As shown in FIG. 46, the organometallic complex [Ir(5dptznmdppy)$_2$(mdppy)], which is one embodiment of the present invention, has an emission peak at 510 nm, and yellow-green light emission was observed from the dichloromethane solution.

Example 12

In this example, element structures, fabrication methods, and properties of a light-emitting element 4 in which [Ir(mdppy)$_2$(5dptznmdppy)] (Structural Formula (103)) described in Example 10 is used as a guest material of a light-emitting layer as a light-emitting element which is one embodiment of the present invention and a comparative light-emitting element 2 in which [Ir(ppy)$_3$] is used as a guest material of a light-emitting layer are described. Note that FIG. 21 illustrates an element structure of the light-emitting elements used in this example, and Table 5 shows specific structures. Chemical formulae of materials used in this example are shown below.

TABLE 5

| | Hole-injection layer | Hole-transport layer | Light-emitting layer | Electron-transport layer | | Electron-injection layer |
|---|---|---|---|---|---|---|
| | 40 nm | 20 nm | 40 nm | 20 nm | 10 nm | 1 nm |
| Light-emitting element 4 Comparative light-emitting element 2 | DBT3P-II:MoOx (2:1) | PCCP | mPCCzPTzn-02:PCCP: Ir(mdppy)$_2$(5dptznmdppy) mPCCzPTzn-02:PCCP:Ir(ppy)$_3$ | mPCCzPTzn-02 | NBPhen | LiF |

[Chemical 40]

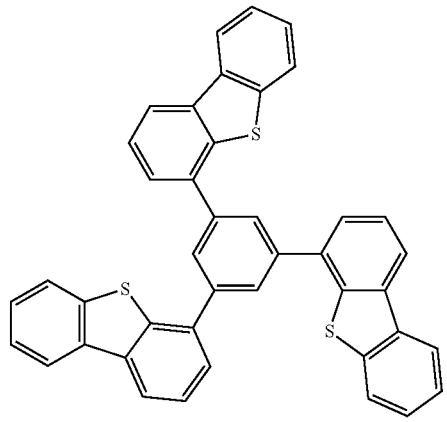

DBT3P-II

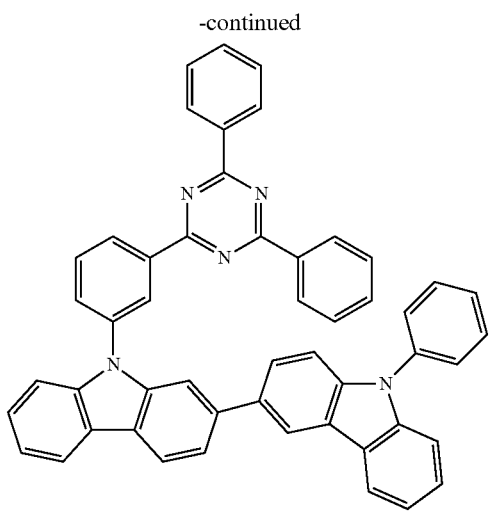

mPCCzPTzn-02

(103)

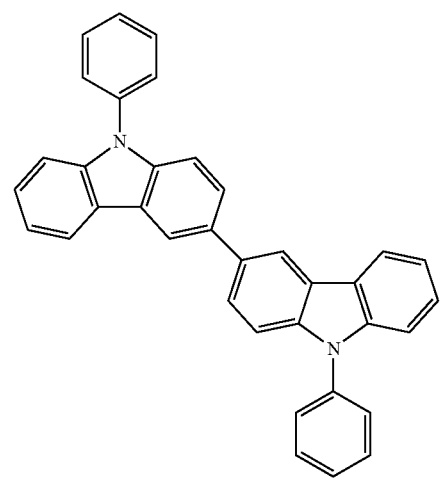

PCCP

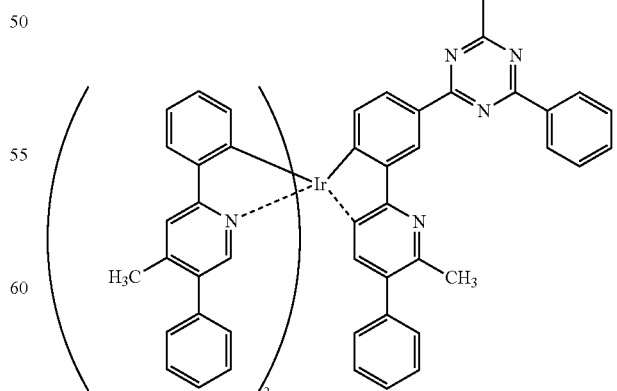

[Ir(mdppy)$_2$(5dptznmdppy)]

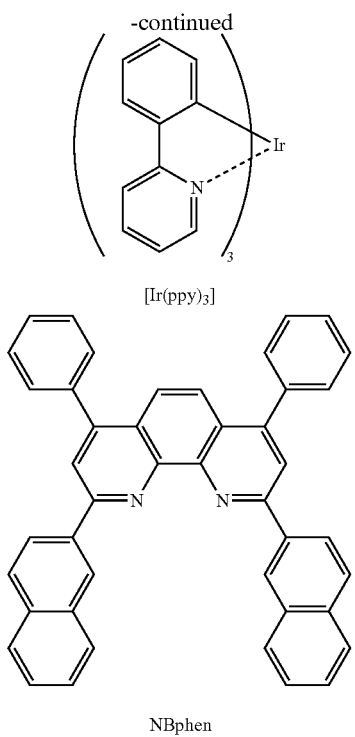

[Ir(ppy)₃]

NBphen

<<Fabrication of Light-Emitting Elements>>

In the light-emitting elements described in this example, as illustrated in FIG. 21, the hole-injection layer 1911, the hole-transport layer 1912, the light-emitting layer 1913, the electron-transport layer 1914, and the electron-injection layer 1915 are stacked in this order over the anode 901 formed over the substrate 1900, and the cathode 1903 is stacked over the electron-injection layer 1915.

First, the anode 1901 was formed over the substrate 1900. The electrode area was set to 4 mm² (2 mm×2 mm). A glass substrate was used as the substrate 1900. The anode 1901 was formed by depositing indium tin oxide (ITO) containing silicon to a thickness of 70 nm by a sputtering method.

As pretreatment, a surface of the substrate was washed with water, baking was performed at 200° C. for 1 hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 1911 was formed over the anode 1901. For the formation of the hole-injection layer 1911, the pressure in the vacuum evaporation apparatus was reduced to $10^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (weight ratio) and the thickness was 40 nm.

Then, the hole-transport layer 1912 was formed over the hole-injection layer 1911. The hole-transport layer 1912 was formed to a thickness of 20 nm by evaporation using 9-phenyl-9H-3-(9-phenyl-9H-carbazol-3-yl)carbazole (abbreviation: PCCP).

Next, the light-emitting layer 1913 was formed over the hole-transport layer 1912.

For the light-emitting layer 1913 in the light-emitting element 4, 9-[3-(4,6-diphenyl-1,3,5-triazin-2-yl)phenyl]-9'-phenyl-2,3'-bi-9H-carbazole (abbreviation: mPCCzPTzn-02) as a host material, PCCP as an assist material, and [4-(4,6-diphenyl-1,3,5-triazin-2-yl-2-(4-methyl-5-phenyl-2-pyridinyl-κN]phenyl-κC]bis[2-(4-methyl-5-phenyl-2-pyridinyl-κN]phenyl-κC]iridium(III) (abbreviation: [Ir(mdppy)₂(5dptznmdppy)]) as a guest material (phosphorescent material) were used and co-evaporated such that mPCCzPTzn-02:PCCP:[Ir(ppy)₂(Czppy)]=0.6: 0.4:0.10 (weight ratio). The thickness was set to 40 nm.

For the light-emitting layer 1913 in the comparative light-emitting element 2, mPCCzPTzn-02 as a host material, PCCP as an assist material, and [Ir(ppy)₃] as a guest material (phosphorescent material) were used and co-evaporated such that mPCCzPTzn-02:PCCP:[Ir(ppy)₃]=0.5:0.5:0.10 (weight ratio). The thickness was set to 20 nm. Co-evaporation was further performed such that mPCCzPTzn-02: PCCP:[Ir(ppy)₃] was 0.8:0.2:0.1 (weight ratio). The thickness was set to 20 nm. Accordingly, the light-emitting layer 1913 has a stacked-layer structure with a thickness of 40 nm.

Next, the electron-transport layer 1914 was formed over the light-emitting layer 1913. The electron-transport layer 1914 was formed by sequential evaporation such that the thickness of mPCCzPTzn-02 was 15 nm and the thickness of bathophenanthroline (abbreviation: Bphen) was 10 nm.

Then, the electron-injection layer 1915 was formed over the electron-transport layer 1914. The electron-injection layer 1915 was formed to a thickness of 1 nm by evaporation using lithium fluoride (LiF).

After that, the cathode 1903 was formed over the electron-injection layer 1915. The cathode 1903 was formed using aluminum to a thickness of 200 nm by an evaporation method.

Through the above steps, the light-emitting elements in which the EL layer was interposed between a pair of electrodes were formed over the substrate 1900. The hole-injection layer 1911, the hole-transport layer 1912, the light-emitting layer 1913, the electron-transport layer 1914, and the electron-injection layer 1915 described in the above steps were functional layers forming the EL layer in one embodiment of the present invention. In all the evaporation steps in the above fabrication method, evaporation was performed by a resistance-heating method.

The light-emitting elements fabricated as described above were each sealed using another substrate (not illustrated). The other substrate was fixed onto the substrate 1900 with a sealant in a glove box containing a nitrogen atmosphere, a sealing material was applied so as to surround the light-emitting element formed over the substrate 1900, and then irradiation with 365-nm ultraviolet light at 6 J/cm² and heat treatment were performed at 80° C. for 1 hour.

<<Operation Characteristics of Light-Emitting Elements>>

Operation characteristics of the fabricated light-emitting elements (the light-emitting element 4 and the comparative light-emitting element 2) were measured. Note that the measurements were performed at room temperature (in an atmosphere kept at 25° C.). The results are shown in FIG. 47 to FIG. 51.

These results reveal that the light-emitting elements (the light-emitting element 4 and the comparative light-emitting element 2) which are embodiments of the present invention have favorable current efficiency and high external quantum efficiency. Table 6 below shows initial values of main characteristics of the light-emitting elements at around 1000 cd/m².

TABLE 6

|  | Voltage (V) | Current (mA) | Current density (mA/cm$^2$) | Chromaticity (x, y) | Current efficiency (cd/A) | Power efficiency (lm/W) | External quantum efficiency (%) |
|---|---|---|---|---|---|---|---|
| Light-emitting element 4 | 2.8 | 0.053 | 1.3 | (0.33, 0.64) | 94 | 106 | 26 |
| Comparative light-emitting element 2 | 3.2 | 0.051 | 1.3 | (0.31, 0.64) | 85 | 83 | 23 |

Figure 52:
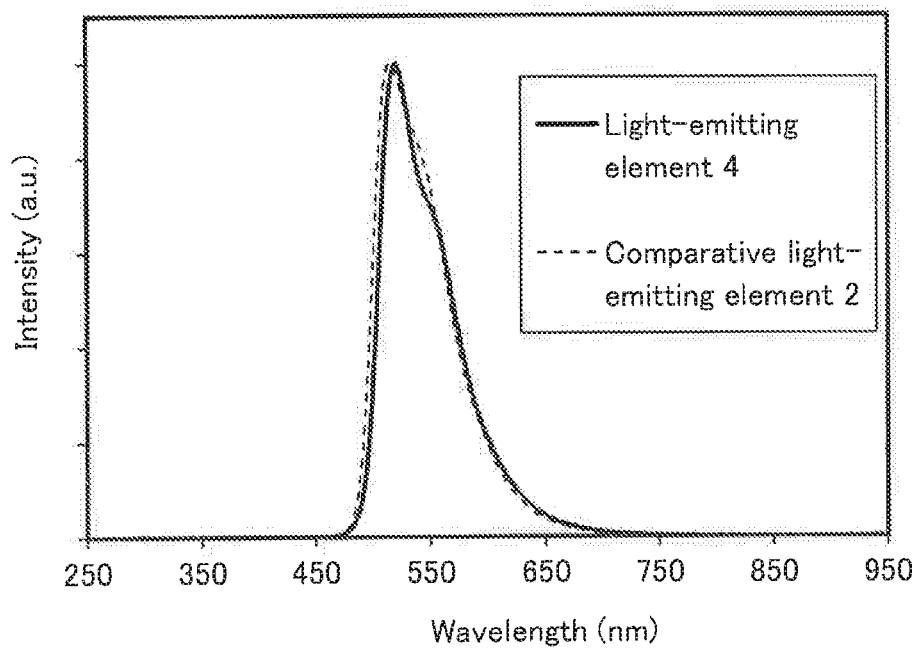
FIG. 52 Emission spectra of the light-emitting element 4 and the comparative light-emitting element 2.

FIG. 52 shows emission spectra when current at a current density of 2.5 mA/cm$^2$ was applied to the light-emitting element 4 and the comparative light-emitting element 2. As shown in FIG. 52, the emission spectrum of the light-emitting element 4 has a peak at around 520 nm which is probably derived from light emission of the organometallic complex [Ir(mdppy)$_2$(5dptznmdppy)] included in the light-emitting layer 1913. The emission spectrum of the comparative light-emitting element 2 has a peak at around 516 nm which is probably derived from light emission of the organometallic complex [Ir(ppy)$_3$] included in the light-emitting layer 1913.

The organometallic complex which is one embodiment of the present invention and used in the light-emitting element 4 has a ligand in which a diphenyltriazine skeleton is bonded to a diphenylpyridine skeleton, and thus carriers (electrons or holes) can be easily injected and transported. This can improve the emission efficiency of the element and can reduce driving voltage. The light-emitting element 4 was capable of having higher current efficiency and lower driving voltage than the comparative light-emitting element 2.

Figure 53:
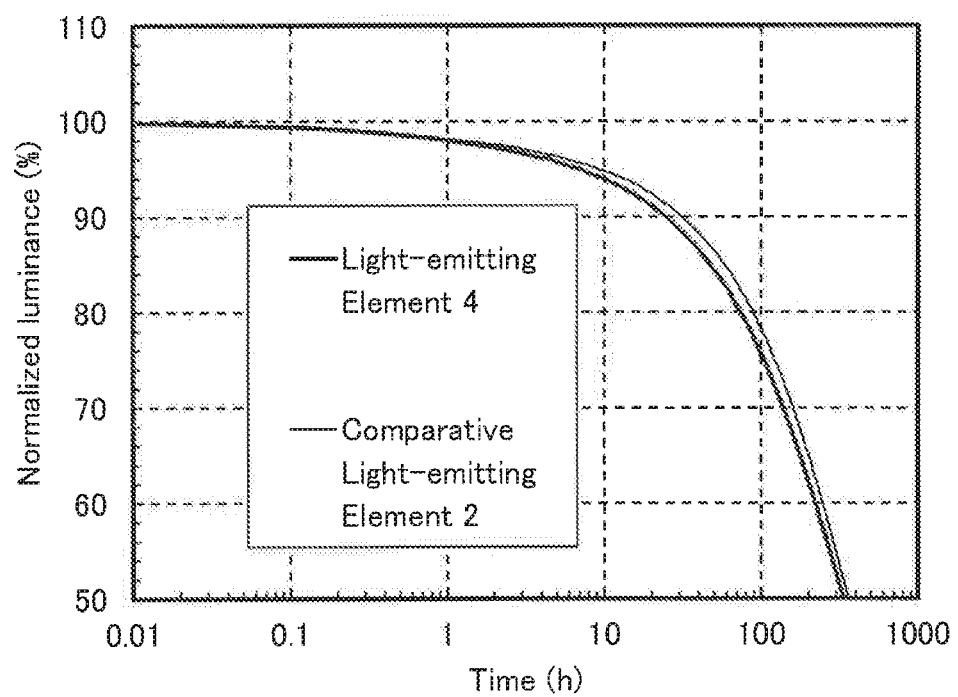
FIG. 53 Time dependence of normalized luminance characteristics of the light-emitting element 4 and the comparative light-emitting element 2.
Figure 54:
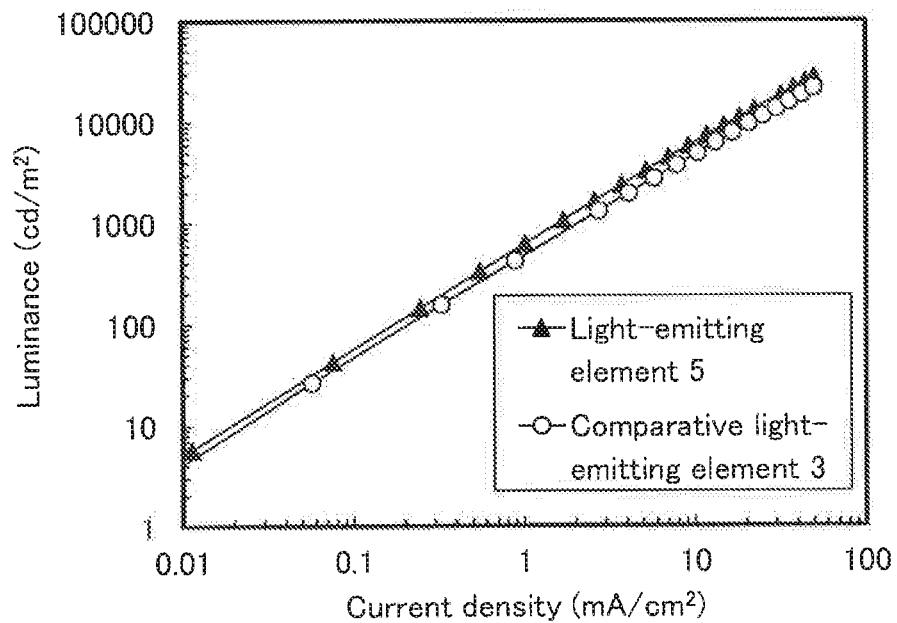
FIG. 54 Luminance-current density characteristics of a light-emitting element 5.
Figure 55:
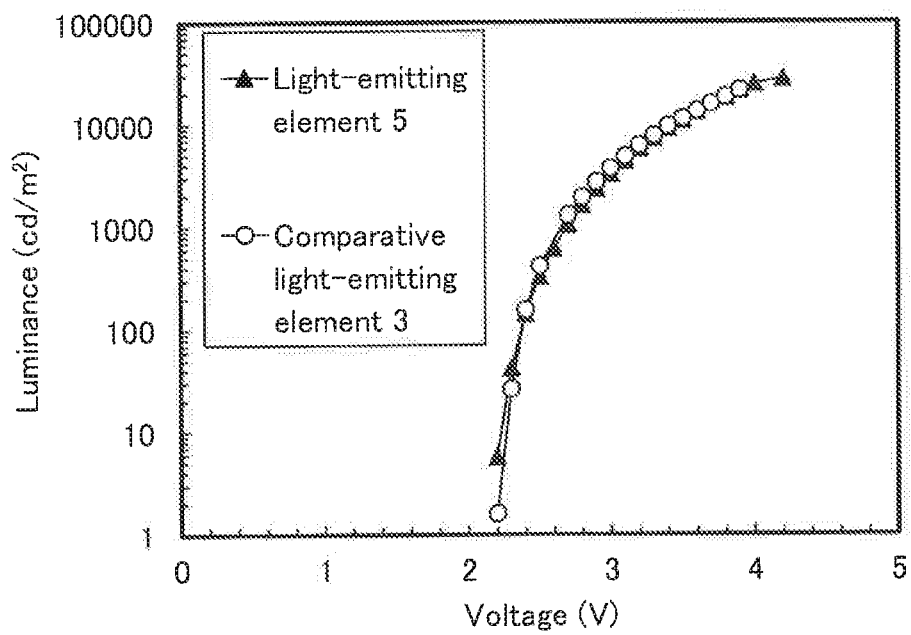
FIG. 55 Current efficiency-luminance characteristics of the light-emitting element 5.
Figure 56:
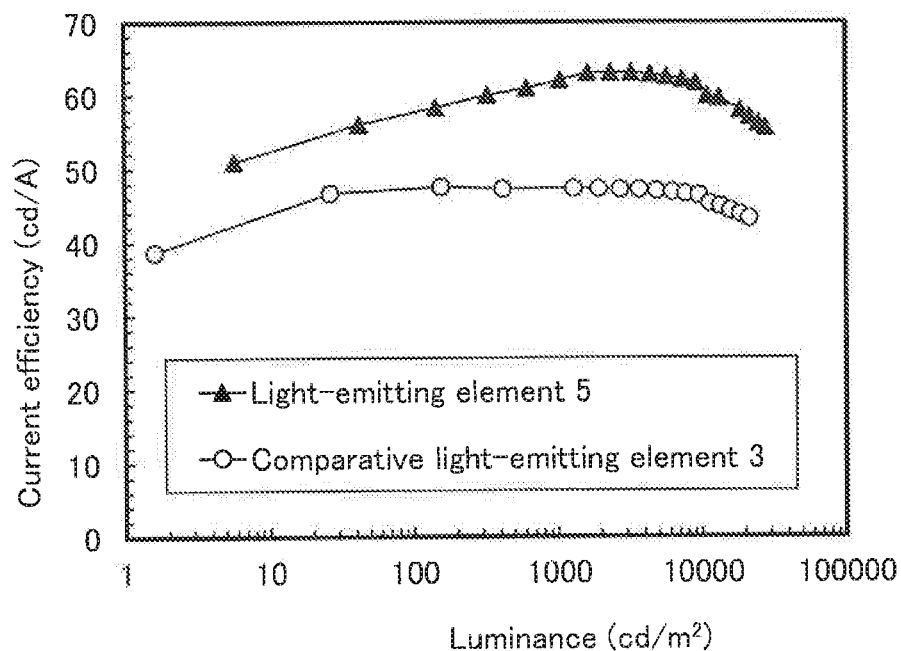
FIG. 56 Luminance-voltage characteristics of the light-emitting element 5.
Figure 57:
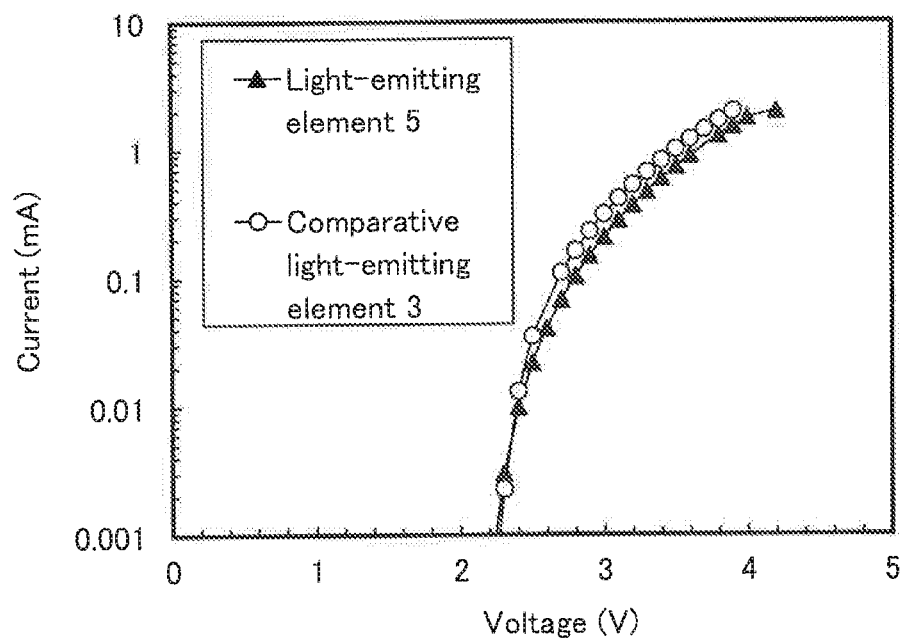
FIG. 57 Current-voltage characteristics of the light-emitting element 5.
Figure 58:
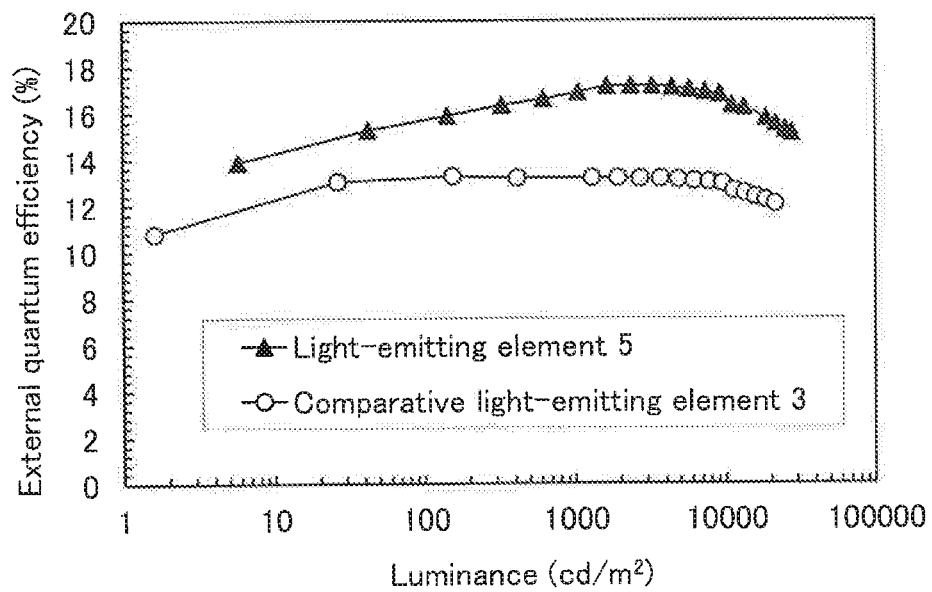
FIG. 58 External quantum efficiency-luminance characteristics of the light-emitting element 5.

Next, FIG. 53 shows a graph showing changes in luminance with respect to driving time under the conditions where the current value is 2 mA and the current density is constant. This result shows that the light-emitting element 4 which is one embodiment of the present invention is a light-emitting element having favorable reliability similar to that of the comparative light-emitting element 2.

Example 13

In this example, element structures, fabrication methods, and properties of a light-emitting element 5 in which [Ir(ppy)$_2$(dpappy)] (Structural Formula (104)) described in Example 8 is used as a guest material of a light-emitting layer as a light-emitting element which is one embodiment of the present invention and a comparative light-emitting element 3 which is a comparative light-emitting element and in which [Ir(ppy)$_3$] is used as a guest material of a light-emitting layer are described. Note that FIG. 21 illustrates an element structure of the light-emitting elements described in this example, and Table 7 shows specific structures. Chemical formulae of materials used in this example are shown below.

TABLE 7

|  | Hole-injection layer | Hole-transport layer | Light-emitting layer | Electron-transport layer | | Electron-injection layer |
|---|---|---|---|---|---|---|
|  | 40 nm | 20 nm | 40 nm | 20 nm | 10 nm | 1 nm |
| Light-emitting element 5 | DBT3P-II:MoOx (2:1) | PCCP | mPCCzPTzn-02:PCBBiF: Ir(ppy)2(dpappy) (0.6:0.4:0.1) | mPCCzPTzn-02 | NBPhen | LiF |
| Comparative light-emitting element 3 |  |  | mPCCzPTzn-02:PCBBiF:Ir(ppy)$_3$ (0.6:0.4:0.1) |  |  |  |

[Chemical 41]

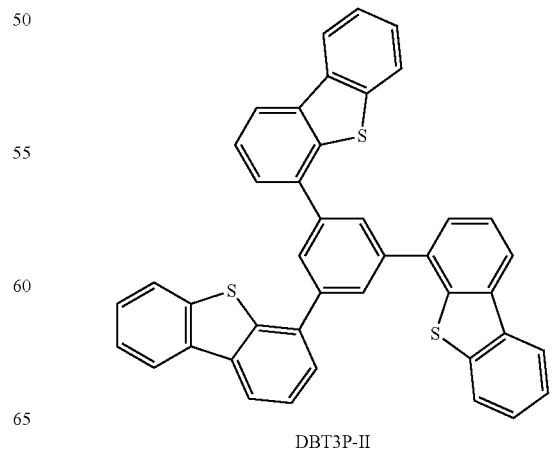

DBT3P-II

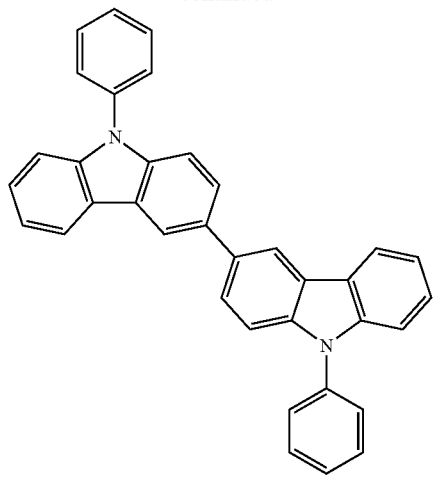

PCCP

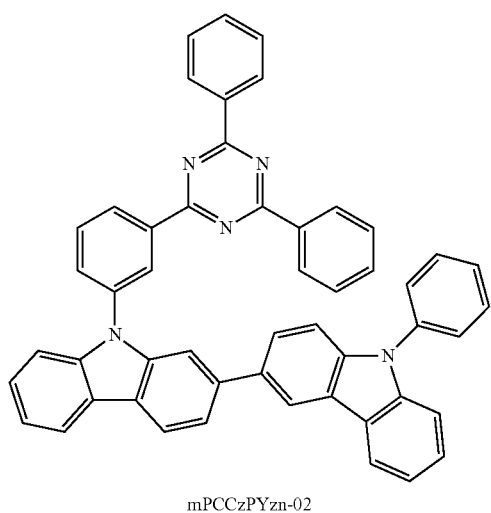

mPCCzPYzn-02

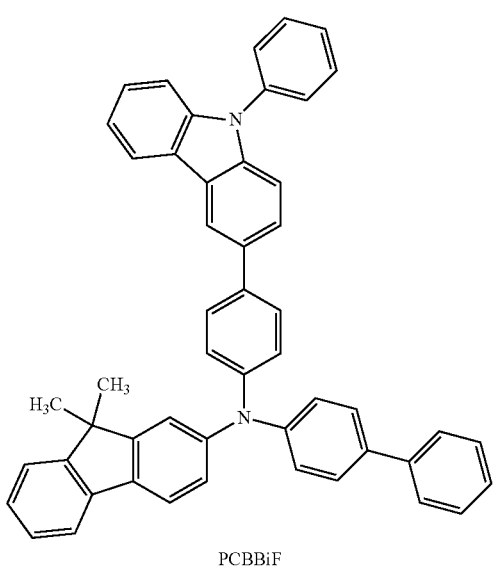

PCBBiF

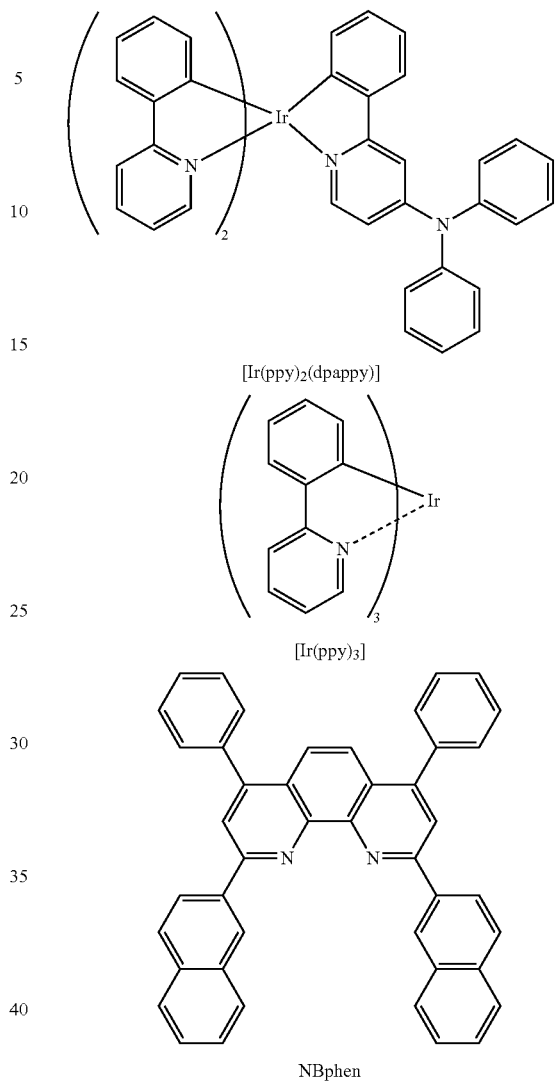

[Ir(ppy)₂(dpappy)]

[Ir(ppy)₃]

NBphen

<<Fabrication of Light-Emitting Elements>>

In the light-emitting elements described in this example, as illustrated in FIG. 21, a hole-injection layer 1911, a hole-transport layer 1912, a light-emitting layer 1913, an electron-transport layer 1914, and an electron-injection layer 1915 are stacked in this order over the anode 901 formed over a substrate 1900, and a cathode 1903 is stacked over the electron-injection layer 1915.

First, the anode 1901 was formed over the substrate 1900. The electrode area was set to 4 mm² (2 mm×2 mm). A glass substrate was used as the substrate 1900. The anode 1901 was formed by depositing indium tin oxide (ITO) containing silicon to a thickness of 70 nm by a sputtering method.

As pretreatment, a surface of the substrate was washed with water, baking was performed at 200° C. for 1 hour, and then UV ozone treatment was performed for 370 seconds. After that, the substrate was transferred into a vacuum evaporation apparatus where the pressure had been reduced to approximately $10^{-4}$ Pa, and was subjected to vacuum baking at 170° C. for 60 minutes in a heating chamber of the vacuum evaporation apparatus, and then the substrate was cooled down for approximately 30 minutes.

Next, the hole-injection layer 1911 was formed over the anode 1901. For the formation of the hole-injection layer 1911, the pressure in the vacuum evaporation apparatus was reduced to $10^{-4}$ Pa, and then 1,3,5-tri(dibenzothiophen-4-yl)benzene (abbreviation: DBT3P-II) and molybdenum oxide were co-evaporated such that DBT3P-II:molybdenum oxide=2:1 (weight ratio) and the thickness was 40 nm.

Then, the hole-transport layer 1912 was formed over the hole-injection layer 1911. The hole-transport layer 1912 was formed to a thickness of 20 nm by evaporation using 9-phenyl-9H-3-(9-phenyl-9H-carbazol-3-yl)carbazole (abbreviation: PCCP).

Next, the light-emitting layer 1913 was formed over the hole-transport layer 1912.

For the light-emitting layer 1913 in the light-emitting element 5, 9-[3-(4,6-diphenyl-1,3,5-triazin-2-yl)phenyl]-9'-phenyl-2,3'-bi-9H-carbazole (abbreviation: mPCCzPTzn-02) as a host material, N-(1,1'-biphenyl-4-yl)-9,9-dimethyl-N-[4-(9-phenyl-9H-carbazol-3-yl)phenyl]-9H-fluoren-2-amine (abbreviation: PCBBiF) as an assist material, and [2-(4-diphenylamino-2-pyridinyl-κN)phenyl-κC]bis[2-(2-pyridinyl-κN)phenyl-κC]iridium(III) (abbreviation: [Ir(ppy)₂(dpappy)]) as a guest material (phosphorescent material) were used and co-evaporated such that mPCCzPTzn-02:PCBBiF:[Ir(ppy)₂(Czppy)]=0.6:0.4:0.1 (weight ratio). The thickness was set to 40 nm.

For the light-emitting layer 1913 in the comparative light-emitting element 3, mPCCzPTzn-02 as a host material, PCBBiF as an assist material, and [Ir(ppy)₃] as a guest material (phosphorescent material) were used and co-evaporated such that mPCCzPTzn-02:PCBBiF:[Ir(ppy)₃]=0.6:0.4:0.1 (weight ratio). The thickness was set to 40 nm.

Next, the electron-transport layer 1914 was formed over the light-emitting layer 1913. The electron-transport layer 1914 was formed by sequential evaporation such that the thickness of mPCCzPTzn-02 was 20 nm and the thickness of 2,9-bis(naphthalen-2-yl)-4,7-diphenyl-1,10-phenanthroline (abbreviation: NBphen) was 10 nm.

Then, the electron-injection layer 1915 was formed over the electron-transport layer 1914. The electron-injection layer 1915 was formed to a thickness of 1 nm by evaporation using lithium fluoride (LiF).

After that, the cathode 1903 was formed over the electron-injection layer 1915. The cathode 1903 was formed using aluminum to a thickness of 200 nm by an evaporation method.

Through the above steps, the light-emitting elements in which the EL layer was interposed between a pair of electrodes were formed over the substrate 1900. The hole-injection layer 1911, the hole-transport layer 1912, the light-emitting layer 1913, the electron-transport layer 1914, and the electron-injection layer 1915 described in the above steps were functional layers forming the EL layer in one embodiment of the present invention. In all the evaporation steps in the above fabrication method, evaporation was performed by a resistance-heating method.

The light-emitting elements fabricated as described above were each sealed using another substrate (not illustrated). The other substrate was fixed onto the substrate 1900 with a sealant in a glove box containing a nitrogen atmosphere, a sealing material was applied so as to surround the light-emitting element formed over the substrate 1900, and then irradiation with 365-nm ultraviolet light at 6 J/cm² and heat treatment were performed at 80° C. for 1 hour.

<<Operation Characteristics of Light-Emitting Elements>>

Operation characteristics of the fabricated light-emitting elements (the light-emitting element 5 and the comparative light-emitting element 3) were measured. Note that the measurements were performed at room temperature (in an atmosphere kept at 25° C.). The results are shown in FIG. 54 to FIG. 58.

These results reveal that the light-emitting elements (the light-emitting element 5 and the comparative light-emitting element 3) which are embodiments of the present invention have favorable current efficiency and high external quantum efficiency. Table 8 below shows initial values of main characteristics of the light-emitting elements at around 1000 cd/m².

TABLE 8

|  | Voltage (V) | Current (mA) | Current density (mA/cm²) | Chromaticity (x, y) | Current efficiency (cd/A) | Power efficiency (lm/W) | External quantum efficiency (%) |
|---|---|---|---|---|---|---|---|
| Light-emitting element 5 | 2.7 | 0.068 | 1.7 | (0.33, 0.63) | 62 | 72 | 17 |
| Comparative light-emitting element 3 | 2.5 | 0.035 | 0.9 | (0.31, 0.64) | 47 | 59 | 13 |

Figure 59:
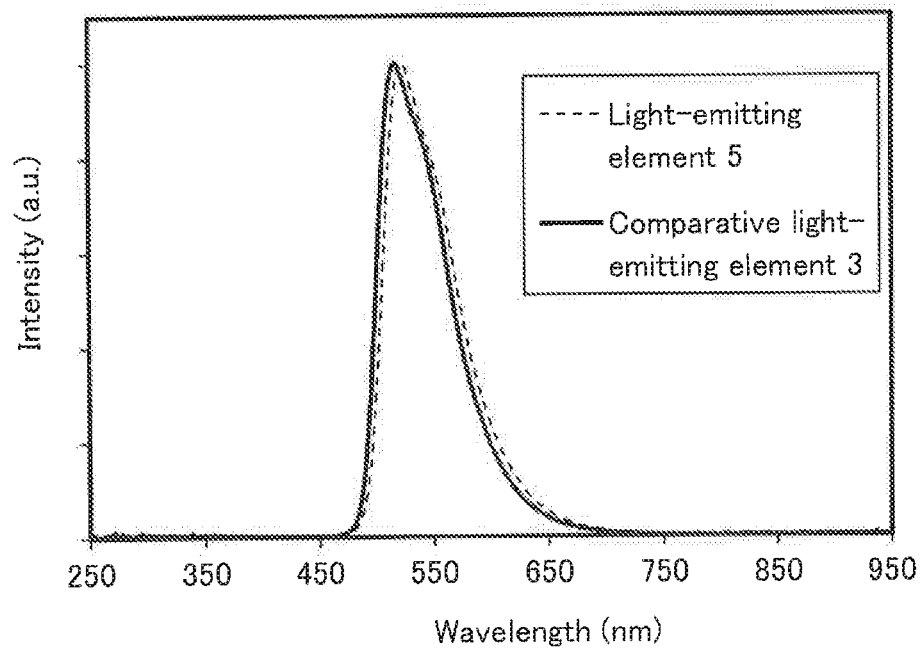
FIG. 59 Emission spectrum of the light-emitting element 5.

FIG. 59 shows emission spectra when current at a current density of 2.5 mA/cm² was applied to the light-emitting element 5 and the comparative light-emitting element 3. As shown in FIG. 59, the emission spectrum of the light-emitting element 5 has a peak at around 523 nm which is probably derived from light emission of the organometallic complex [Ir(ppy)₂(dpappy)] included in the light-emitting layer 1913. The emission spectrum of the comparative light-emitting element 3 has a peak at around 517 nm which is probably derived from light emission of the organometallic complex [Ir(ppy)₃] included in the light-emitting layer 1913.

The organometallic complex which is one embodiment of the present invention and used in the light-emitting element 5 has a ligand in which a diphenylamine skeleton is bonded to a diphenylpyridine skeleton, and thus the property of injecting and transporting carriers (electrons or holes) is favorable. Accordingly, the light-emitting element 5 can be a light-emitting element having favorable emission efficiency.

The light-emitting element 5 and the comparative light-emitting element 3 use PCBBiF as an assist material in the light-emitting layer; however, PCBBiF is an organic compound in which a diphenylamine skeleton is included as shown in the above structural formula. Thus, it is found that the skeleton included in PCBBiF which is the assist material and the carrier-transport skeleton included in the light-emitting material are preferably the same.

Example 14

This example shows calculation results of the distributions of the HOMO and LUMO of the organometallic complexes having structures of embodiments of the present invention represented by Structural Formulae (C1) to (C3). The structural formulae of the organometallic complexes represented by (C1) to (C3) are shown below.

[Chemical 01]

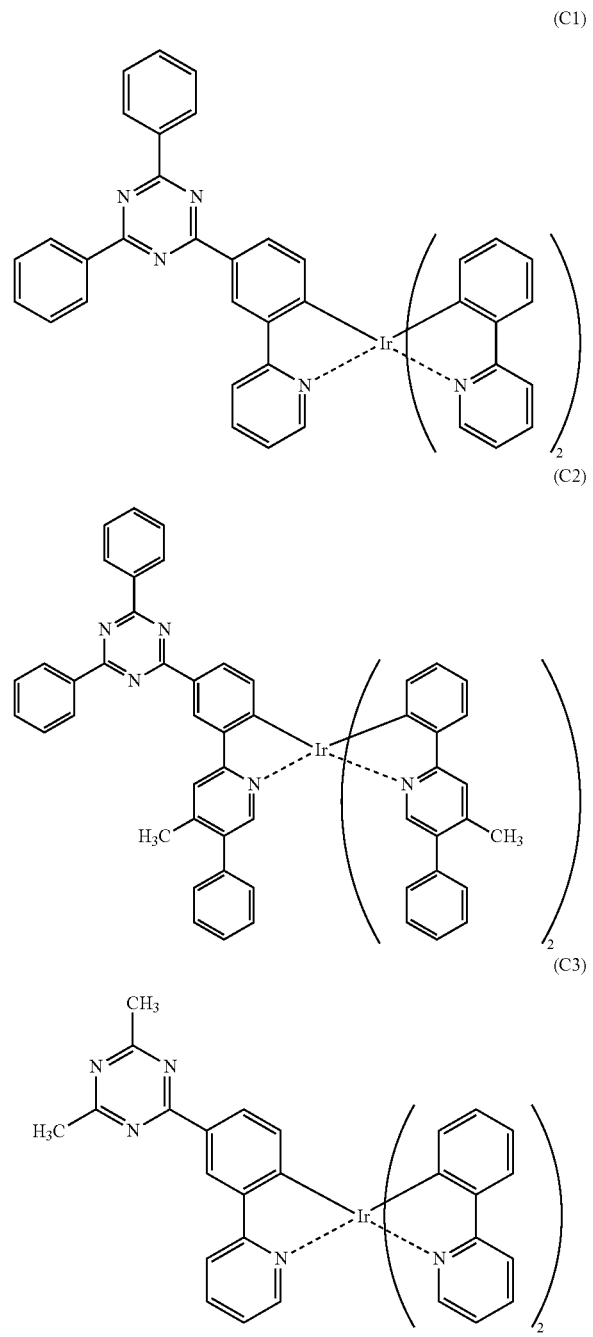

The Gaussian 09 program was used for molecular orbital calculations. As a basis function, 6-311G was used, and structural optimization was performed on the singlet ground state ($S_0$) of each molecule using B3PW91\6-311G.

Figure 60:
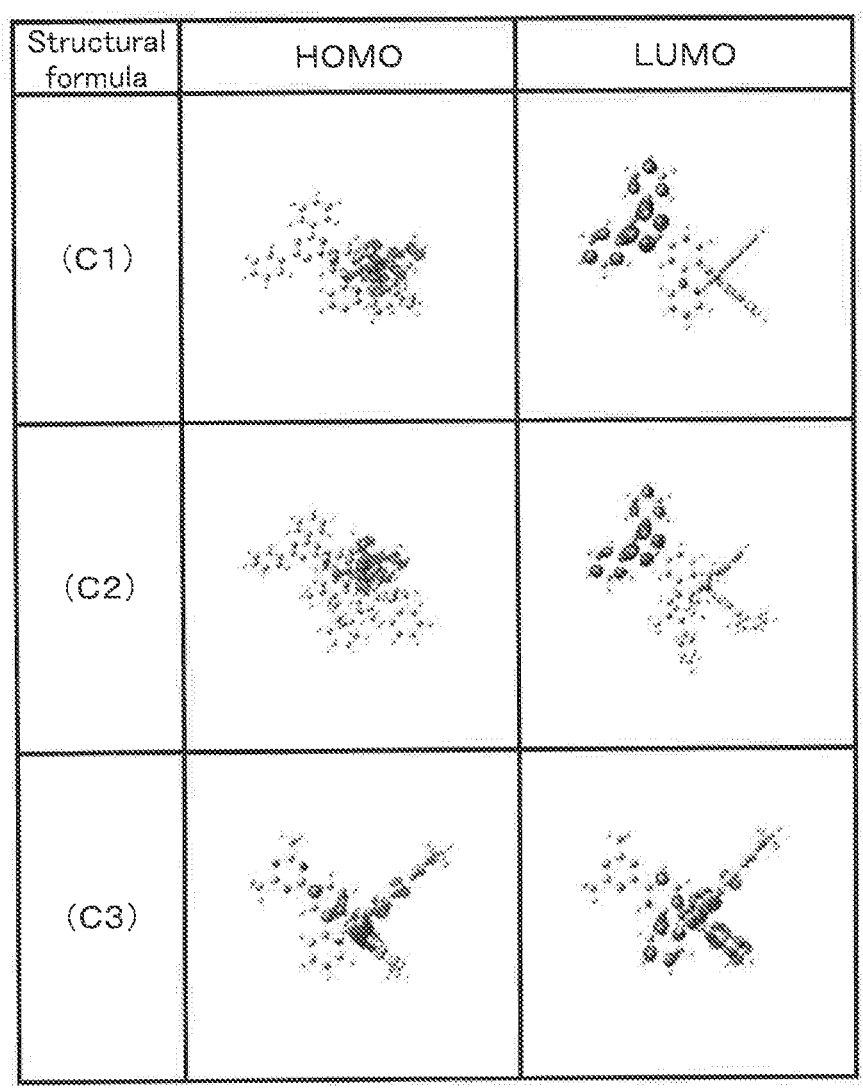
FIG. 60 Views showing calculation results.

FIG. 60 shows figures showing the electron density distributions of the HOMO and LUMO of the structures obtained by the calculations.

As shown in FIG. 60, the obtained results of the organometallic complex represented by Structural Formula (C1) reveal that the HOMO is mainly distributed over a phenylpyridine ligand and an iridium ion and the LUMO is mainly distributed over diphenyltriazine. The obtained results of the organometallic complex represented by Structural Formula (C2) also reveal that the HOMO is mainly distributed over a ligand of a phenylpyridine derivative and an iridium ion and the LUMO is mainly distributed over diphenyltriazine. The obtained results of the organometallic complex represented by Structural Formula (C3) reveal that the HOMO is mainly distributed over a phenylpyridine ligand and an iridium ion and the LUMO is mainly distributed over a ligand of a phenylpyrimidine derivative.

Thus, the LUMOs of the organometallic complex represented by Structural Formula (C1) and the organometallic complex represented by Structural Formula (C2) are distributed over diphenyltriazine which is a skeleton having a carrier-transport property, showing the involvement in carrier transport and electron injection. However, the LUMO of the organometallic complex represented by Structural Formula (C3) shows no distribution over triazine which is a skeleton having a carrier-transport property, showing little involvement in carrier transport and electron injection.

One embodiment of the present invention is a light-emitting element material including an organic compound which includes a first skeleton having a carrier-transport property and a second skeleton having a light-emitting property in one molecule and in which the molecular weight is less than or equal to 3000. With reference to the above calculation results, the LUMOs are distributed over the diphenyltriazine skeleton, the organometallic complexes represented by (C1) and (C2) can be regarded as organic compounds in which the skeleton corresponds to the first skeleton having a carrier-transport property and having a role in carrier transport and electron injection and the phenylpyridine skeleton corresponds to the second skeleton having a light-emitting property. However, in the organometallic complex represented by (C3), since LUMO distribution cannot be seen over the dimethyltriazine skeleton and the LUMO is distributed over the phenylpyridine skeleton, the skeleton having a light-emitting property probably has a role in light emission and carrier transport at the same time for carrier transport and electron injection.

REFERENCE NUMERALS 101 anode
102 cathode
103 EL layer
111 hole-injection layer
112 hole-transport layer
113 light-emitting layer
114 electron-transport layer
115 electron-injection layer
116 charge-generation layer
117 p-type layer
118 electron-relay layer
119 electron-injection buffer layer
400 substrate
401 anode
403 EL layer
404 cathode
405 sealing material
406 sealing material
407 sealing substrate
412 pad 420 IC chip
501 anode
502 cathode
511 first light-emitting unit
512 second light-emitting unit
513 charge-generation layer
601 driver circuit portion (source line driver circuit)
602 pixel portion
603 driver circuit portion (gate line driver circuit)
604 sealing substrate
605 sealing material
607 space
608 wiring
609 FPC (flexible printed circuit)
610 element substrate
611 switching FET
612 current controlling FET
613 anode
614 insulator
616 EL layer
617 cathode
618 light-emitting element
730 insulating film
770 planarization insulating film
772 conductive film
782 light-emitting element
783 droplet discharge apparatus
784 droplet
785 layer
786 EL layer
788 conductive film
901 housing
902 liquid crystal layer
903 backlight unit
904 housing
905 driver IC
906 terminal
951 substrate
952 electrode
953 insulating layer
954 partition layer
955 EL layer
956 electrode
1001 substrate
1002 base insulating film
1003 gate insulating film
1006 gate electrode
1007 gate electrode
1008 gate electrode
1020 first interlayer insulating film
1021 second interlayer insulating film
1022 electrode
1024W anode
1024R anode
1024G anode
1024B anode
1025 partition
1028 EL layer
1029 cathode
1031 sealing substrate
1032 sealing material
1033 transparent base material
1034R red coloring layer
1034G green coloring layer
1034B blue coloring layer
1035 black matrix
1037 third interlayer insulating film
1040 pixel portion
1041 driver circuit portion
1042 peripheral portion
1400 droplet discharge apparatus
1402 substrate
1403 droplet discharge means
1404 imaging means
1405 head
1406 dotted line
1407 control means
1408 storage medium
1409 image processing means
1410 computer
1411 marker
1412 head
1413 material supply source
1414 material supply source
1415 material supply source
1416 head
1900 substrate
1901 anode
1903 cathode
1911 hole-injection layer
1912 hole-transport layer
1913 light-emitting layer
1914 electron-transport layer
1915 electron-injection layer
2001 housing
2002 light source
3001 lighting device
5000 display region
5001 display region
5002 display region
5003 display region
5004 display region
5005 display region
7101 housing
7103 display portion
7105 stand
7107 display portion
7109 operation key
7110 remote controller
7201 main body
7202 housing
7203 display portion
7204 keyboard
7205 external connection port
7206 pointing device
7210 second display portion
7401 housing
7402 display portion
7403 operation button
7404 external connection port
7405 speaker
7406 microphone
9033 fastener
9034 switch
9035 power switch
9036 switch
9038 operation switch
9310 portable information terminal
9311 display panel
9312 display region
9313 hinge
9315 housing
9630 housing
9631 display portion 9631a display portion
9631b display portion
9632a touch panel region
9632b touch panel region
9633 solar cell
9634 charge and discharge control circuit
9635 battery
9636 DCDC converter
9637 operation key
9638 converter
9639 button

The invention claimed is:

1. A light-emitting element material comprising an organic compound comprising, in one molecule:
a first skeleton having a carrier-transport property; and
a second skeleton having a light-emitting property,
wherein a molecular weight is less than or equal to 1300,
wherein the organic compound is an organometallic complex further comprising a central metal,
wherein the organometallic complex comprises at least two different ligands,
wherein one of the two different ligands comprises a skeleton having a light-emitting property, and
wherein the other of the two different ligands comprises a skeleton having an electron-transport property.

2. The light-emitting element material according to claim 1,
wherein the first skeleton is a skeleton having a hole-transport property.

3. The light-emitting element material according to claim 2,
wherein the first skeleton is a skeleton having a HOMO in the organic compound.

4. The light-emitting element material according to claim 1,
wherein the first skeleton is a skeleton having an electron-transport property.

5. The light-emitting element material according to claim 4,
wherein the first skeleton is a skeleton having a LUMO in the organic compound.

6. The light-emitting element material according to claim 1,
wherein the first skeleton is directly bonded to the second skeleton.

7. The light-emitting element material according to claim 1,
wherein the first skeleton and the second skeleton are bonded through a metaphenylene group or a biphenyl-3,3'-diyl group.

8. The light-emitting element material according to claim 1,
wherein the central metal is iridium.

9. The light-emitting element material according to claim 8,
wherein the first skeleton having a carrier-transport property in the organometallic complex is a diphenyltriazine skeleton.

10. The light-emitting element material according to claim 1,
wherein at least one of the two different ligands comprises a skeleton having a hole-transport property.

11. The light-emitting element material according to claim 1,
wherein the one of the two different ligands comprises a skeleton having a hole-transport property.

12. A light-emitting element comprising a film of the light-emitting element material according to claim 1,
wherein the film is formed by an evaporation method.

13. A light-emitting element comprising a film of the light-emitting element material according to claim 1,
wherein the film is formed by a wet method.

14. A light-emitting element comprising a light-emitting layer comprising:
a first organic compound; and
the light-emitting element material according to claim 1,
wherein the organic compound included in the light-emitting element material is an iridium complex, and
wherein at least part of a skeleton included in the first organic compound comprises a structure that is the same as the first skeleton having a carrier-transport property in the iridium complex.

15. The light-emitting element according to claim 14,
wherein the light-emitting layer further comprises a second organic compound.

16. The light-emitting element according to claim 14,
wherein the first skeleton is an amine skeleton.

17. The light-emitting element according to claim 14,
wherein the first skeleton is a diphenylamine skeleton.

18. A light-emitting element material comprising an organic compound comprising, in one molecule:
a first skeleton having a hole-transport property;
a second skeleton having an electron-transport property; and
a third skeleton having a light-emitting property,
wherein a molecular weight is less than or equal to 1300.

19. The light-emitting element material according to claim 18,
wherein the first skeleton has a HOMO.

20. The light-emitting element material according to claim 18,
wherein the second skeleton has a LUMO.

21. The light-emitting element material according to claim 18,
wherein the first skeleton and/or the second skeleton is directly bonded to the third skeleton.

22. The light-emitting element material according to claim 18,
wherein the first skeleton and/or the second skeleton is bonded to the third skeleton through a metaphenylene group or a biphenyl-3,3'-diyl group.

23. The light-emitting element material according to claim 18,
wherein the organic compound emits fluorescence.

24. The light-emitting element material according to claim 18,
wherein the organic compound emits delayed fluorescence.

25. The light-emitting element material according to claim 1,
wherein the organic compound emits phosphorescence.

26. An organometallic complex represented by the following structural formula:

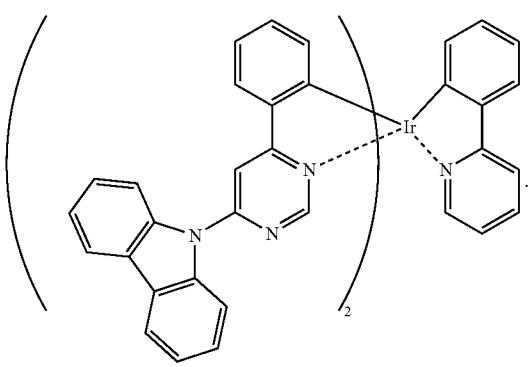

27. An organometallic complex represented by the following structural formula:

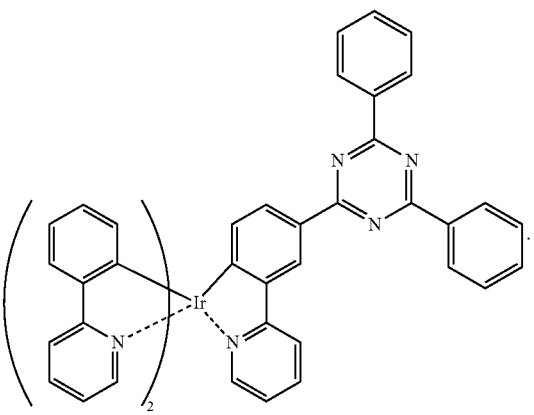

[Ir(ppy)₂(5dptznppy)]

28. An organometallic complex represented by the following structural formula:

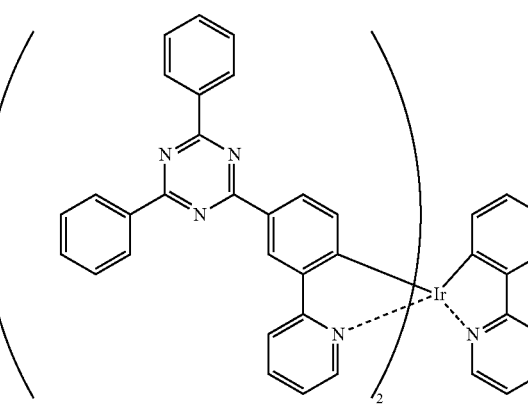

[Ir(5dptznppy)₂(ppy)]

29. An organometallic complex represented by the following structural formula:

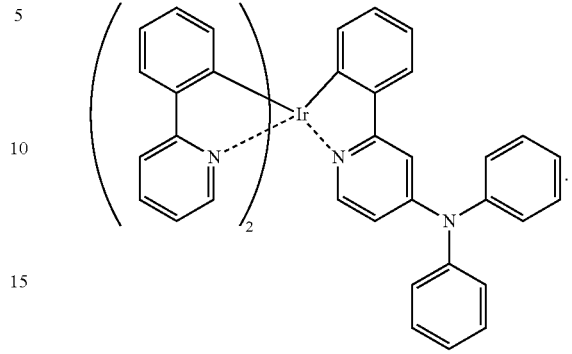

[Ir(ppy)₂(dpappy)]

30. An organometallic complex represented by the following structural formula:

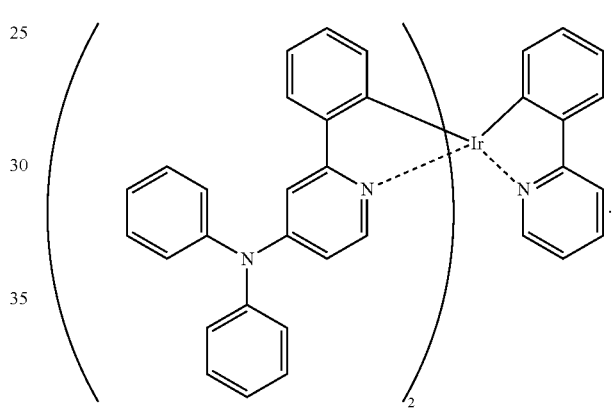

[Ir(dpappy)₂(ppy)]

31. An organometallic complex represented by the following structural formula:

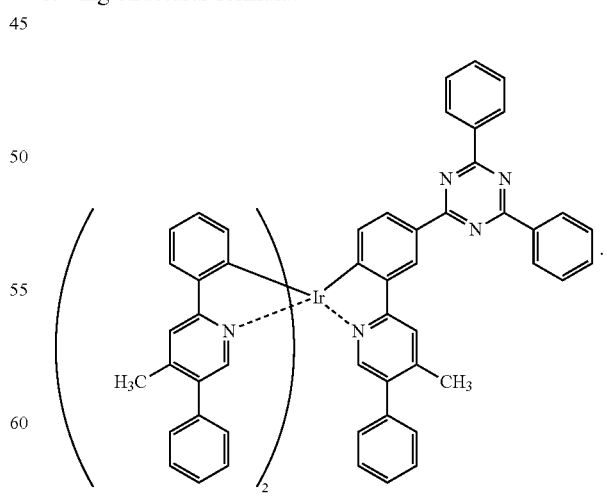

[Ir(mdppy)₂(5dptznmdppy)]

32. An organometallic complex represented by the following structural formula:
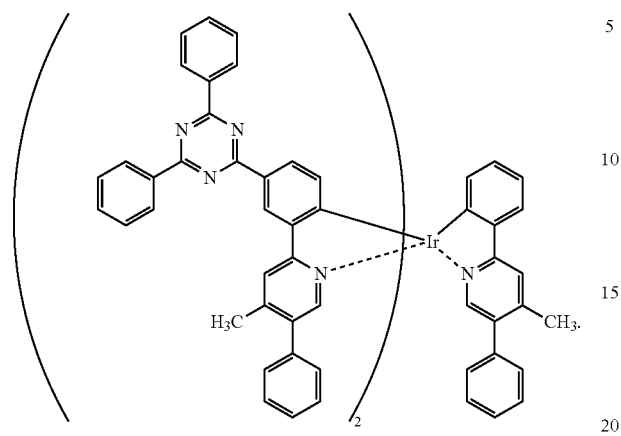
[Ir(5dptznmdppy)₂(mdppy)]
* * * * *